US012751132B2

(12) United States Patent
Li et al.

(10) Patent No.: US 12,751,132 B2
(45) **Date of Patent: *Sep. 29, 2026**

(54) ORGANIC ELECTROLUMINESCENT DEVICE

(71) Applicant: BEIJING SUMMER SPROUT TECHNOLOGY CO., LTD., Beijing (CN)

(72) Inventors: Hongbo Li, Beijing (CN); Feng Li, Beijing (CN); Zheng Wang, Beijing (CN); Zhen Wang, Beijing (CN); Ming Sang, Beijing (CN); Wei Cai, Beijing (CN); Yang Wang, Jianfei (CN); Jianfei Yao, Beijing (CN); Gang Yang, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 966 days.

This patent is subject to a terminal disclaimer.

(21) Appl. No.: 17/989,164

(22) Filed: Nov. 17, 2022

(65) Prior Publication Data

US 2023/0165021 A1 May 25, 2023

(30) Foreign Application Priority Data

Nov. 20, 2021 (CN) ......................... 202111381256.8

(51) Int. Cl.

| | |
|---|---|
| ***H10K 50/11*** | (2023.01) |
| ***H10K 85/30*** | (2023.01) |
| ***H10K 85/60*** | (2023.01) |
| *H10K 101/40* | (2023.01) |

(52) U.S. Cl.

CPC ........... *H10K 50/11* (2023.02); *H10K 85/342* (2023.02); *H10K 85/615* (2023.02); *H10K 85/622* (2023.02); *H10K 85/652* (2023.02); *H10K 85/654* (2023.02); *H10K 85/6572* (2023.02); *H10K 85/6574* (2023.02); *H10K 85/6576* (2023.02); *H10K 2101/40* (2023.02)

(58) Field of Classification Search

None

See application file for complete search history.

(56) References Cited

U.S. PATENT DOCUMENTS

| | | | | |
|---|---|---|---|---|
| 5,703,436 | A | 12/1997 | Forrest et al. | |
| 5,707,745 | A | 1/1998 | Forrest et al. | |
| 5,844,363 | A | 12/1998 | Gu et al. | |
| 6,097,147 | A | 8/2000 | Baldo et al. | |
| 6,303,238 | B1 | 10/2001 | Thompson et al. | |
| 7,279,704 | B2 | 10/2007 | Walters et al. | |
| 7,968,146 | B2 | 6/2011 | Wagner et al. | |
| 2003/0230980 | A1 | 12/2003 | Forrest et al. | |
| 2004/0174116 | A1 | 9/2004 | Lu et al. | |
| 2015/0349273 | A1 | 12/2015 | Hung et al. | |
| 2016/0359122 | A1 | 12/2016 | Boudreault et al. | |
| 2018/0212155 | A1 | 7/2018 | Hung et al. | |
| 2019/0123286 | A1 | 4/2019 | Xia | |
| 2020/0087311 | A1 | 3/2020 | Cui et al. | |
| 2020/0091442 | A1 | 3/2020 | Cai et al. | |
| 2020/0203631 | A1* | 6/2020 | Gao | H10K 85/6574 |
| 2020/0251666 | A1* | 8/2020 | Cai | C07F 15/0033 |
| 2020/0277283 | A1* | 9/2020 | Li | H10K 85/654 |
| 2021/0280802 | A1 | 9/2021 | Wang et al. | |
| 2021/0403496 | A1 | 12/2021 | Cai et al. | |
| 2022/0162244 | A1 | 5/2022 | Sang et al. | |
| 2022/0165968 | A1 | 5/2022 | Sang et al. | |
| 2022/0181560 | A1 | 6/2022 | Wang et al. | |
| 2022/0289681 | A1 | 9/2022 | Wang et al. | |
| 2022/0372055 | A1 | 11/2022 | Wang et al. | |
| 2022/0384741 | A1 | 12/2022 | Cai et al. | |
| 2022/0393115 | A1 | 12/2022 | Li et al. | |

(Continued)

FOREIGN PATENT DOCUMENTS

| | | | |
|---|---|---|---|
| CN | 103650194 | A | 3/2014 |
| CN | 107619412 | A | 1/2018 |

(Continued)

OTHER PUBLICATIONS

Decision to Grant received for Japanese Patent Application No. 2022-183331, mailed on May 21, 2024, 6 pages (2 pages of English Translation and 4 pages of Original Document).

Notice of Allowance received for Korean Patent Application No. 10-2022-0156753, mailed on Feb. 24, 2026, 6 pages (3 pages of English Translation and 3 pages of Original Document).

Office Action received for Chinese Patent Application No. 202111381256.8, mailed on Mar. 28, 2026, 18 pages (9 pages of English Translation and 9 pages of Original Document).

(Continued)

*Primary Examiner* — Robert S Loewe

(74) *Attorney, Agent, or Firm* — KDW FIRM PLLC

(57) ABSTRACT

Provided is an organic electroluminescent device. The organic electroluminescent device comprises an anode, a cathode and an organic layer disposed between the anode and the cathode, wherein the organic layer comprises a first organic layer, the first organic layer comprises a first compound and a second compound, the first compound has specific HOMO and/or LUMO energy levels and a structure represented by Formula 1-1, and the second compound has a specific LUMO energy level and a structure represented by Formula 2-1. Compared with the related art, the combination of the first compound and the second compound can significantly improve the performance of the organic electroluminescent device, such as the efficiency of the device. Further provided is an electronic device comprising the organic electroluminescent device.

30 Claims, 1 Drawing Sheet

(56) References Cited

U.S. PATENT DOCUMENTS

| | | | | |
|---|---|---|---|---|
| 2022/0402877 | A1 | 12/2022 | Wang et al. | |
| 2023/0055630 | A1 | 2/2023 | Kwong et al. | |
| 2023/0058719 | A1 | 2/2023 | Cai et al. | |
| 2023/0063868 | A1 | 3/2023 | Sang et al. | |
| 2023/0165021 | A1 | 5/2023 | Li et al. | |
| 2023/0167097 | A1* | 6/2023 | Li | C07D 409/14 257/40 |
| 2023/0301183 | A1* | 9/2023 | Lee | H10K 85/6574 257/40 |
| 2023/0309394 | A1 | 9/2023 | Kwong et al. | |
| 2025/0127043 | A1 | 4/2025 | Kim et al. | |

FOREIGN PATENT DOCUMENTS

| | | | | | |
|---|---|---|---|---|---|
| CN | 108250189 | A | | 7/2018 | |
| CN | 109836419 | A | | 6/2019 | |
| CN | 110540527 | A | | 12/2019 | |
| CN | 111004219 | A | | 4/2020 | |
| CN | 211289623 | U | | 8/2020 | |
| CN | 111635436 | A | | 9/2020 | |
| CN | 211879407 | U | | 11/2020 | |
| CN | 112300216 | A | | 2/2021 | |
| CN | 112390826 | A | | 2/2021 | |
| CN | 112409416 | A | | 2/2021 | |
| CN | 112759578 | A | | 5/2021 | |
| CN | 112851645 | A | | 5/2021 | |
| CN | 113130771 | A | | 7/2021 | |
| CN | 113121603 | B | * | 2/2023 | C07F 15/0033 |
| KR | 10-2019-0060585 | A | | 6/2019 | |
| KR | 10-2020-0024879 | A | | 3/2020 | |
| KR | 10-2021-0015699 | A | | 2/2021 | |
| KR | 10-2021-0021278 | A | | 2/2021 | |
| KR | 10-2021-0024433 | A | | 3/2021 | |
| KR | 10-2021-0048856 | A | | 5/2021 | |
| KR | 10-2021-0124796 | A | | 10/2021 | |
| KR | 10-2021-0131897 | A | | 11/2021 | |
| KR | 10-2023-0074408 | A | | 5/2023 | |
| KR | 10-2023-0139383 | A | | 10/2023 | |
| WO | 2019/132545 | A1 | | 7/2019 | |
| WO | 2020/122460 | A1 | | 6/2020 | |
| WO | WO-2021052921 | A1 | * | 3/2021 | C09K 11/02 |

OTHER PUBLICATIONS

Office Action received for Korean Patent Application No. 10-2022-0156753, mailed on Sep. 3, 2024, 22 pages (12 pages of English Translation and 10 pages of Original Document).

Office Action received for Japanese Patent Application No. 2022-183331, mailed on Dec. 26, 2023, 11 pages (5 pages of English Translation and 6 pages of Original Document).

Office Action received for Korean Patent Application No. 10-2022-0156753, mailed on Apr. 9, 2025, 12 pages (7 pages of English Translation and 5 pages of Original Document).

Tang et al., “Organic electroluminescent diodes”, Applied Physics Letters, vol. 51, No. 12, 1987, 4 pages.

Uoyama et al., “Highly efficient organic light-emitting diodes from delayed fluorescence”, Nature, vol. 492, 2012, pp. 234-238.

* cited by examiner

ORGANIC ELECTROLUMINESCENT DEVICE

CROSS-REFERENCE TO RELATED APPLICATION(S)

This application claims priority to Chinese Patent Application No. 202111381256.8 filed on Nov. 20, 2021, the disclosure of which is incorporated herein by reference in its entirety.

TECHNICAL FIELD

The present disclosure relates to organic electroluminescent devices. More particularly, the present disclosure relates to an organic electroluminescent device having a first organic layer comprising a first compound and a second compound, wherein the first compound and the second compound each have a specific structure and energy level, and also relates to an electronic device comprising the organic electroluminescent device.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which includes an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may include multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may include one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

For the research and development of OLED devices, the improvement of efficiency is a constant pursuit. The matching between energy levels of materials in the emissive layer is of great significance for electric charges and energy transfer. The efficiency of organic electroluminescent devices can be greatly improved through a good combination of compounds in the emissive layer.

SUMMARY

An object of the present disclosure is to provide a series of organic electroluminescent devices having a first organic layer comprising a first compound and a second compound to solve at least part of the preceding problems, wherein the first compound and the second compound each have a specific structure and energy level, and the efficiency of the device can be greatly improved through the use of both the first compound and the second compound in the first organic layer.

According to an embodiment of the present disclosure, an organic electroluminescent device is disclosed, which comprises:

an anode, a cathode, and an organic layer disposed between the anode and the cathode, wherein the organic layer comprises a first organic layer, and the first organic layer comprises a first compound and a second compound;

wherein, the highest occupied molecular orbital energy level ($E_{HOMO-A}$) of the first compound is less than or equal to −5.19 eV and/or the lowest unoccupied molecular orbital energy level ($E_{LUMO-A}$) of the first compound is less than or equal to −2.31 eV; and the first compound has a general structure of $Ir(L_a)_m(L_b)_{3-m}$ represented by Formula 1-1;

Formula 1-1

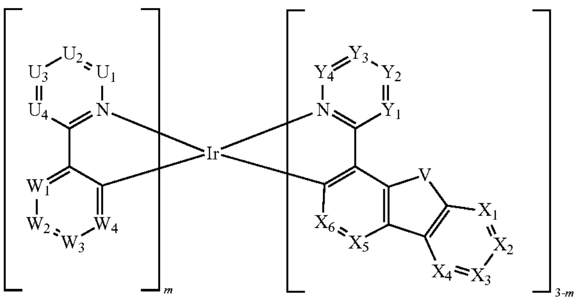

wherein m is selected from 0, 1 or 2; when m is selected from 0 or 1, a plurality of $L_b$ are the same or different; when m is selected from 2, two $L_b$ are the same or different;

V is selected from the group consisting of O, S, Se, NR, CRR, and SiRR; when two R are present, the two R are the same or different;

$X_1$ to $X_6$ are, at each occurrence identically or differently, selected from $CR_x$ or N;

$Y_1$ to $Y_4$ are, at each occurrence identically or differently, selected from $CR_y$ or N;

$U_1$ to $U_4$ are, at each occurrence identically or differently, selected from $CR_u$ or N;

$W_1$ to $W_4$ are, at each occurrence identically or differently, selected from $CR_w$ or N;

R, $R_x$, and $R_y$ are, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, sulfanyl group, a sulfinyl group, a sulfonyl group, a phosphino group, and combinations thereof;

$R_u$ and $R_w$ are, at each occurrence identically or differently, selected from the group consisting of hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a hydroxyl group, a sulfanyl group, and combinations thereof;

adjacent substituents R, $R_u$, $R_w$, $R_x$, $R_y$ can be optionally joined to form a ring;

the lowest unoccupied molecular orbital energy level ($E_{LUMO-B}$) of the second compound is less than or equal to −2.83 eV; and the second compound has a structure represented by Formula 2-1:

Formual 2-1

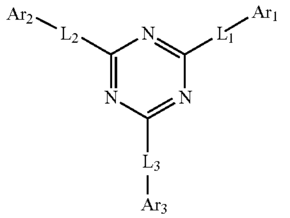

wherein, $L_1$ to $L_3$ are, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms, or combinations thereof;

$Ar_1$ to $Ar_3$ are, at each occurrence identically or differently, selected from substituted or unsubstituted aryl having 6 to 30 carbon atoms, substituted or unsubstituted heteroaryl having 3 to 30 carbon atoms, or combinations thereof.

According to an embodiment of the present disclosure, an electronic device is disclosed, which comprises the organic electroluminescent device described in the preceding embodiment.

The present disclosure discloses an organic electroluminescent device. The device comprises a first organic layer, and the first organic layer comprises a first compound having a structure represented by Formula 1-1 which has a specific energy level and a second compound having a structure represented by Formula 2-1 which has a specific energy level. Through the combination of the first compound and the second compound, compared with the related art, the performance of the organic electroluminescent device, such as the efficiency of the device, can be significantly improved.

DETAILED DESCRIPTION

Figure 1:
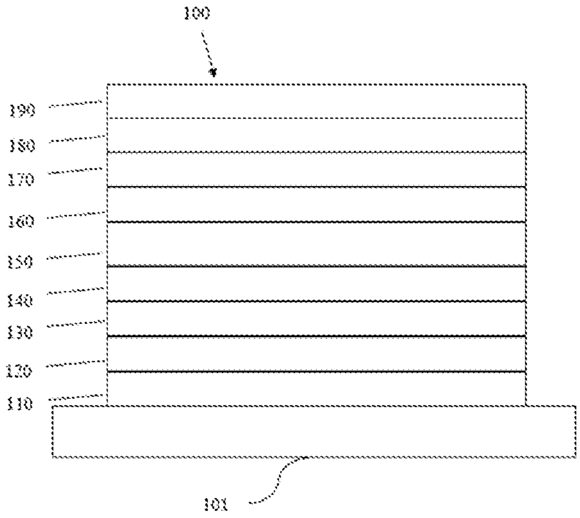
FIG. 1 is a schematic diagram of an organic light-emitting device 100 disclosed herein.

OLEDs can be fabricated on various types of substrates such as glass, plastic, and metal foil. FIG. 1 schematically shows an organic light-emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may include a single layer or multiple layers.

Figure 2:
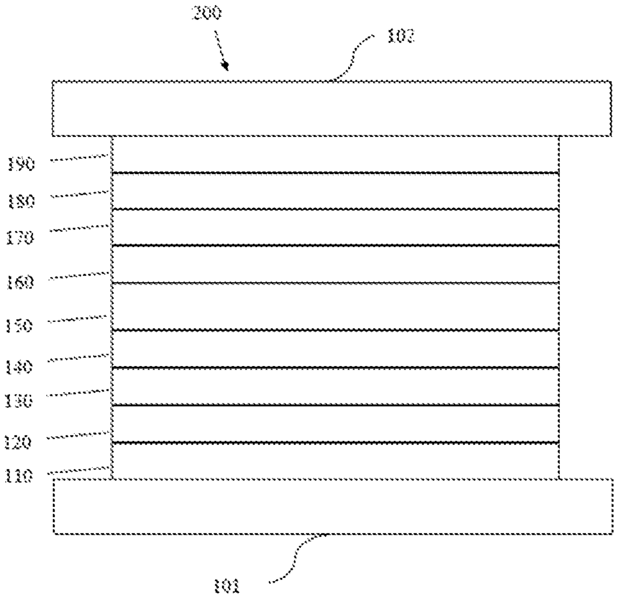
FIG. 2 is a schematic diagram of another organic light-emitting device 200 disclosed herein.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small AES-T. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbomyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylgermanylmethyl, trimethylgermanylethyl, trimethylgermanylisopropyl, dimethylethylgermanylmethyl, dimethylisopropylgermanylmethyl, tert-butylmethylgermanylmethyl, triethylgermanylmethyl, triethylgermanylethyl, triisopropylgermanylmethyl, triisopropylgermanylethyl, trimethylsilylmethyl, trimethylsilylethyl, and trimethylsilylisopropyl, triisopropylsilylmethyl, triisopropylsilylethyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups include saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 heteroatoms, where at least one hetero-atom is selected from the group consisting of a nitrogen atom, an oxygen atom, a sulfur atom, a selenium atom, a silicon atom, a phosphorus atom, a germanium atom, and a boron atom. A heteroaromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates germanyl substituted with an alkyl group. The alkylgermanyl may be those having 3 to 20 carbon atoms, preferably those having 3 to 10 carbon atoms. Examples of alkylgermanyl include trimethylgermanyl, triethylgermanyl, methyldiethylgermanyl, ethyldimethylgermanyl, tripropylgermanyl, tributylgermanyl, triisopropylgermanyl, methyldiisopropylgermanyl, dimethylisopropylgermanyl, tri-t-butylgermanyl, triisobutylgermanyl, dimethyl-t-butylgermanyl, and methyldi-t-butylgermanyl. Additionally, the alkylgermanyl may be optionally substituted.

Arylgermanyl—as used herein contemplates a germanyl substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylylgermanyl, diphenylbiphenylgermanyl, phenyldiethylgermanyl, diphenylethylgermanyl, phenyldimethylgermanyl, diphenylmethylgermanyl, phenyldiisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted alkylgermanyl, substituted arylgermanyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, alkylgermanyl, arylgermanyl, amino, acyl, carbonyl, a carboxylic acid group, an ester group, sulfinyl, sulfonyl, and phosphino may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl having 6 to 20 carbon atoms, unsubstituted alkylgermanyl having 3 to 20 carbon atoms, unsubstituted arylgermanyl group having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen can also be replaced by their other stable isotopes. The replacement by other stable isotopes in the compounds may be preferred due to its enhancements of device efficiency and stability.

In the compounds mentioned in the present disclosure, multiple substitution refers to a range that includes a di-substitution, up to the maximum available substitution. When substitution in the compounds mentioned in the present disclosure represents multiple substitution (including di-, tri-, and tetra-substitutions, etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic (including spirocyclic, endocyclic, fusedcyclic, and etc.), as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

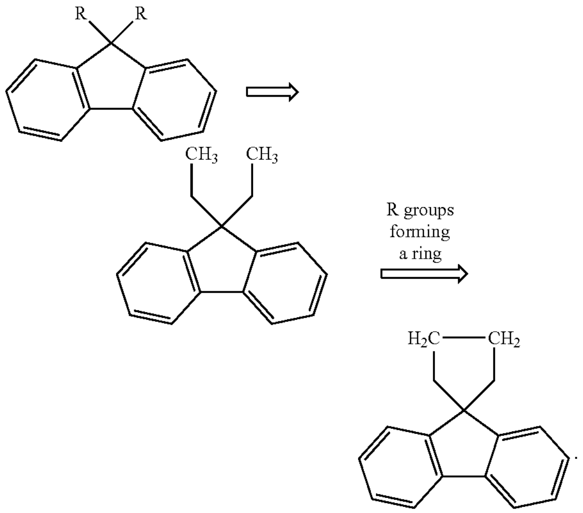

The expression that adjacent substituents can be optionally joined to form a ring is also intended to mean that two substituents bonded to carbon atoms which are directly bonded to each other are joined to each other via a chemical bond to form a ring, which can be exemplified by the following formula:

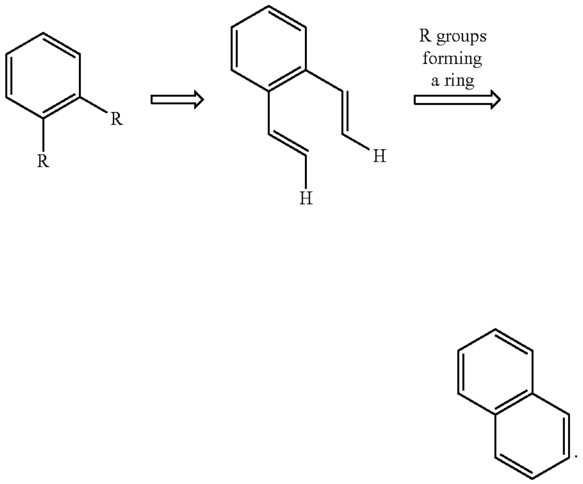

The expression that adjacent substituents can be optionally joined to form a ring is also intended to mean that two substituents bonded to a further distant carbon atom are joined to each other via a chemical bond to form a ring, which can be exemplified by the following formula:

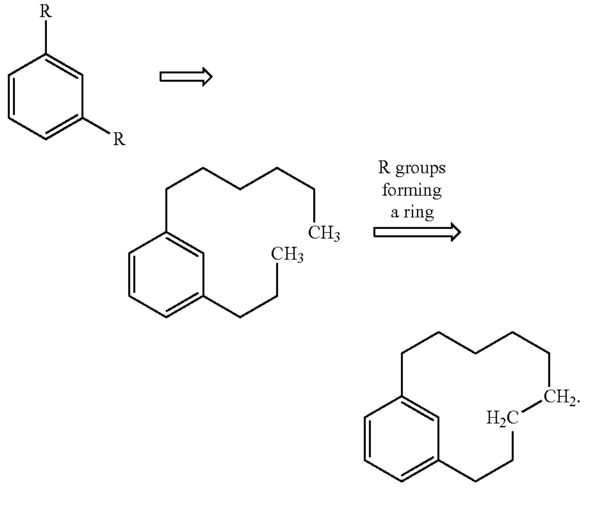

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

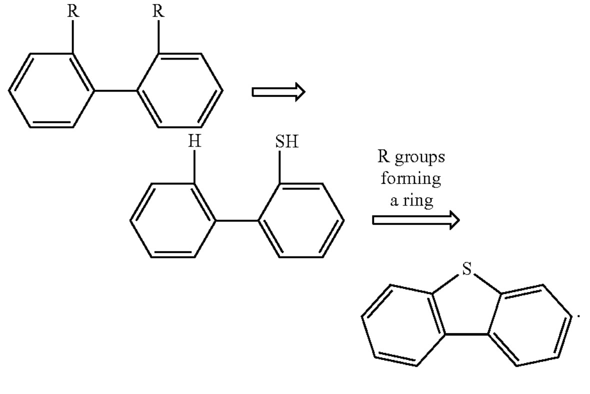

According to an embodiment of the present disclosure, an organic electroluminescent device is disclosed, which comprises:

an anode, a cathode, and an organic layer disposed between the anode and the cathode, wherein the organic layer comprises a first organic layer, and the first organic layer comprises a first compound and a second compound;

wherein, the highest occupied molecular orbital energy level ($E_{HOMO-A}$) of the first compound is less than or equal to −5.19 eV and/or the lowest unoccupied molecular orbital energy level ($E_{LUMO-A}$) of the first compound is less than or equal to −2.31 eV; and the first compound has a general structure of $Ir(L_a)_m(L_b)_{3-m}$ represented by Formula 1-1;

Formula 1-1

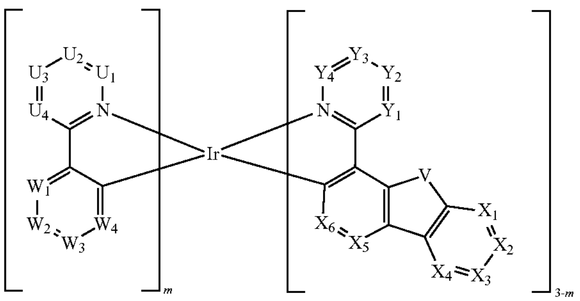

wherein m is selected from 0, 1 or 2; when m is selected from 0 or 1, a plurality of $L_b$ are the same or different; when m is selected from 2, two $L_b$ are the same or different;

V is selected from the group consisting of O, S, Se, NR, CRR, and SiRR; when two R are present, the two R are the same or different;

$X_1$ to $X_6$ are, at each occurrence identically or differently, selected from $CR_x$ or N;

$Y_1$ to $Y_4$ are, at each occurrence identically or differently, selected from $CR_y$ or N;

$U_1$ to $U_4$ are, at each occurrence identically or differently, selected from $CR_u$ or N;

$W_1$ to $W_4$ are, at each occurrence identically or differently, selected from $CR_w$ or N;

R, $R_x$, and $R_y$ are, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, sulfanyl group, a sulfinyl group, a sulfonyl group, a phosphino group, and combinations thereof;

$R_u$ and $R_w$ are, at each occurrence identically or differently, selected from the group consisting of hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a hydroxyl group, a sulfanyl group, and combinations thereof;

adjacent substituents R, $R_u$, $R_w$, $R_x$, $R_y$ can be optionally joined to form a ring;

the lowest unoccupied molecular orbital energy level ($E_{LUMO-B}$) of the second compound is less than or equal to −2.83 eV; and the second compound has a structure represented by Formula 2-1:

Formual 2-1

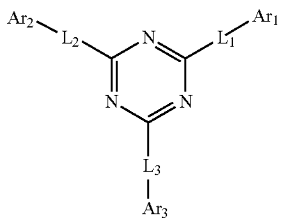

wherein, $L_1$ to $L_3$ are, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms, or combinations thereof;

$Ar_1$ to $Ar_3$ are, at each occurrence identically or differently, selected from substituted or unsubstituted aryl having 6 to 30 carbon atoms, substituted or unsubstituted heteroaryl having 3 to 30 carbon atoms, or combinations thereof.

In this embodiment, the expression that adjacent substituents R, $R_u$, $R_w$, $R_x$, $R_y$ can be optionally joined to form a ring is intended to mean that any one or more of groups of adjacent substituents, such as two substituents R, two substituents $R_u$, two substituents $R_w$, two substituents $R_x$, two substituents $R_y$, substituents R and $R_x$, and substituents $R_u$ and $R_w$, can be joined to form a ring. Obviously, it is possible that none of these adjacent substituents are joined to form a ring.

According to an embodiment of the present disclosure, $E_{HOMO-A}$ is less than or equal to −5.21 eV, and $E_{LUMO-B}$ is less than or equal to −2.85 eV.

According to an embodiment of the present disclosure, $E_{LUMO-A}$ is less than or equal to −2.40 eV, and $E_{LUMO-B}$ is less than or equal to −2.85 eV.

According to an embodiment of the present disclosure, $E_{LUMO-B}-E_{HOMO-A}$ is greater than or equal to 2.25 eV.

According to an embodiment of the present disclosure, $E_{LUMO-B}-E_{HOMO-A}$ is greater than or equal to 2.30 eV.

According to an embodiment of the present disclosure, $E_{LUMO-A}-E_{LUMO-B}$ is less than or equal to 0.55 eV.

According to an embodiment of the present disclosure, $E_{LUMO-A}-E_{LUMO-B}$ is less than or equal to 0.53 eV.

According to an embodiment of the present disclosure, $E_{LUMO-A}$ is less than or equal to −2.40 eV, $E_{HOMO-A}$ is less than or equal to −5.21 eV, and $E_{LUMO-B}$ is less than or equal to −2.85 eV.

According to an embodiment of the present disclosure, the first organic layer is an emissive layer, the emissive layer further comprises a third compound, and the third compound comprises at least one chemical group selected from the group consisting of benzene, pyridine, arylamine, carbazole, azacarbazole, indolocarbazole, dibenzothiophene, azadibenzothiophene, dibenzofuran, azadibenzofuran, dibenzoselenophene, triphenylene, fluorene, silafluorene, naphthalene, phenanthrene, and combinations thereof.

According to an embodiment of the present disclosure, the first organic layer is an emissive layer, the emissive layer further comprises a third compound, and the third compound comprises at least one chemical group selected from the group consisting of: benzene, arylamine, carbazole, indolocarbazole, fluorene, dibenzothiophene, dibenzofuran, and combinations thereof.

According to an embodiment of the present disclosure, the second compound does not include the following compound:

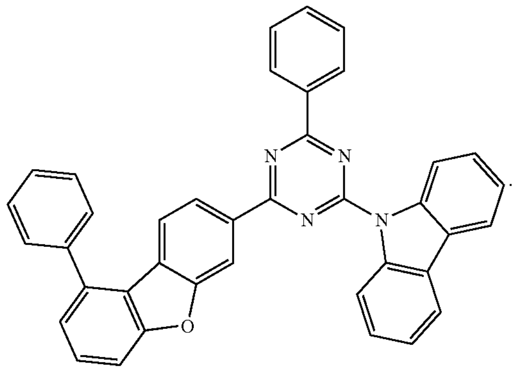 [SMILES: c1ccc(-c2nc(-c3ccc4c(c3)oc3cccc(-c5ccccc5)c34)nc(-n3c4ccccc4c4ccccc43)n2)cc1]

According to an embodiment of the present disclosure, the highest occupied molecular orbital energy level ($E_{HOMO-C}$) of the third compound is greater than or equal to −5.48 eV.

According to an embodiment of the present disclosure, $X_1$ to $X_6$ are, at each occurrence identically or differently, selected from $CR_x$.

According to an embodiment of the present disclosure, $Y_1$ to $Y_4$ are, at each occurrence identically or differently, selected from $CR_y$.

According to an embodiment of the present disclosure, $U_1$ to $U_4$ are, at each occurrence identically or differently, selected from $CR_u$.

According to an embodiment of the present disclosure, $W_1$ to $W_4$ are, at each occurrence identically or differently, selected from $CR_w$.

According to an embodiment of the present disclosure, at least one of $X_1$ to $X_6$ is N. For example, one or two of $X_1$ to $X_6$ is(are) N.

According to an embodiment of the present disclosure, at least one of $Y_1$ to $Y_4$ is N. For example, one or two of $Y_1$ to $Y_4$ is(are) N.

According to an embodiment of the present disclosure, at least one of $U_1$ to $U_4$ is N. For example, one or two of $U_1$ to $U_4$ is(are) N.

According to an embodiment of the present disclosure, at least one of $W_1$ to $W_4$ is N. For example, one or two of $W_1$ to $W_4$ is(are) N.

According to an embodiment of the present disclosure, R, $R_x$, and $R_y$ are, at occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, a cyano group, an isocyano group, a hydroxyl group, sulfanyl group, and combinations thereof.

According to an embodiment of the present disclosure, R, $R_x$, and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryloxy having 6 to 30 carbon atoms, substituted or unsubstituted aryl having 6 to 30 carbon atoms, substituted or unsubstituted heteroaryl having 3 to 30 carbon atoms, a cyano group, an isocyano group, and combinations thereof.

According to an embodiment of the present disclosure, $R_u$ and $R_w$ are, at occurrence identically or differently, selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, and combinations thereof.

According to an embodiment of the present disclosure, $R_u$ and $R_w$ are, at each occurrence identically or differently, selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted aryloxy having 6 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, and combinations thereof.

According to an embodiment of the present disclosure, at least one of $R_w$ and/or at least one of $R_u$ are selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted alkylsilyl having 3 to 20 carbon atoms, and combinations thereof.

According to an embodiment of the present disclosure, at least one of $R_w$ and/or at least one of $R_u$ are selected from the group consisting of: substituted or unsubstituted alkyl having 4 to 20 carbon atoms, substituted or unsubstituted cycloalkyl having 4 to 20 ring carbon atoms, substituted or unsubstituted aryl having 6 to 18 carbon atoms, and combinations thereof.

According to an embodiment of the present disclosure, at least one of $R_w$ and/or at least one of $R_u$ are selected from the group consisting of: substituted or unsubstituted alkyl having 4 to 6 carbon atoms, substituted or unsubstituted cycloalkyl having 3 to 6 ring carbon atoms, substituted or unsubstituted aryl having 6 to 12 carbon atoms, and combinations thereof.

According to an embodiment of the present disclosure, V is selected from O and S.

According to an embodiment of the present disclosure, V is O.

According to an embodiment of the present disclosure, at least one of $X_1$ to $X_6$ is $CR_x$, and $R_x$ is selected from the group consisting of: fluorine, cyano, fluorine-substituted or cyano-substituted aryl having 6 to 30 carbon atoms, and fluorine-substituted or cyano-substituted heteroaryl having 3 to 30 carbon atoms.

According to an embodiment of the present disclosure, at least one of $X_1$ to $X_6$ is $CR_x$, and $R_x$ has a structure represented by Formula 1-2:

Formula 1-2

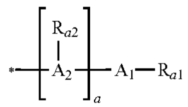

wherein a is selected from 0, 1 or 2;

$A_1$ and $A_2$ are, at each occurrence identically or differently, selected from alkylene having 1 to 20 carbon atoms, heteroalkylene having 1 to 20 carbon atoms, cycloalkylene having 3 to 20 carbon atoms, heterocyclylene having 3 to 20 ring atoms, arylene having 6 to 30 carbon atoms, heteroarylene having 3 to 30 carbon atoms, or combinations thereof;

$R_{a1}$ and $R_{a2}$ represent, at each occurrence identically or differently, mono-substitution, multiple substitutions, or non-substitution;

$R_{a1}$ and $R_{a2}$ are, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, sulfanyl group, a sulfinyl group, a sulfonyl group, a phosphino group, and combinations thereof;

"*" represents a position of attachment of Formula 1-2;

adjacent substituents $R_{a1}$, $R_{a2}$ can be optionally joined to form a ring.

In this embodiment, the expression that adjacent substituents $R_{a1}$, $R_{a2}$ can be optionally joined to form a ring is intended to mean that any one or more of groups of adjacent substituents, such as two substituents $R_{a1}$, two substituents $R_{a2}$, and substituents $R_{a1}$ and $R_{a2}$, can be joined to form a ring. Obviously, it is possible that none of these adjacent substituents are joined to form a ring.

According to an embodiment of the present disclosure, $A_1$ and $A_2$ are, at each occurrence identically or differently, selected from arylene having 6 to 18 carbon atoms, heteroarylene having 3 to 18 carbon atoms, or combinations thereof.

According to an embodiment of the present disclosure, $A_1$ and $A_2$ are, at each occurrence identically or differently, selected from the group consisting of: phenylene, pyridylene, pyrimidinylene, triazinylene, naphthylene, phenanthrylene, anthrylene, fluorenylene, silafluorenylene, quinolylene, isoquinolylene, thienothienylene, furofurylene, benzofurylene, benzothienylene, dibenzofurylene, dibenzothienylene, triphenylenylene, carbazolylene, azacarbazolylene, azafluorenylidene, azasilafluorenylene, azadibenzofurylene, azadibenzothienylene, and combinations thereof.

According to an embodiment of the present disclosure, $R_{a1}$ and $R_{a2}$ are, at each occurrence identically or differently, selected from the group consisting of: hydrogen, deuterium, halogen, cyano, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, and combinations thereof.

According to an embodiment of the present disclosure, $R_{a1}$ and $R_{a2}$ are, at each occurrence identically or differently, selected from the group consisting of: hydrogen, deuterium, halogen, cyano, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, and combinations thereof.

According to an embodiment of the present disclosure, at least one of $X_1$ to $X_6$ is $CR_x$, and $R_x$ is, at each occurrence identically or differently, selected from the group consisting of:

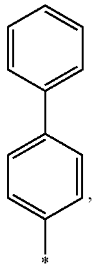
,
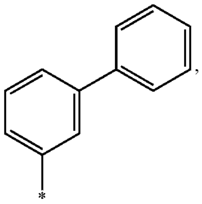
,
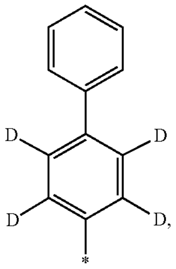
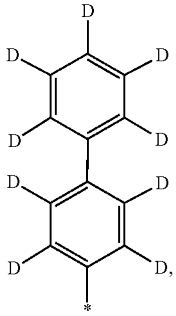
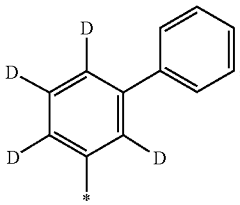
,
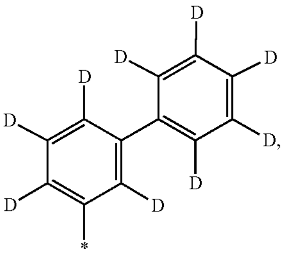
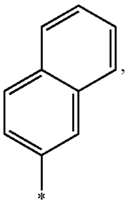
,
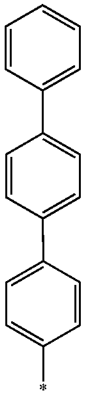
,
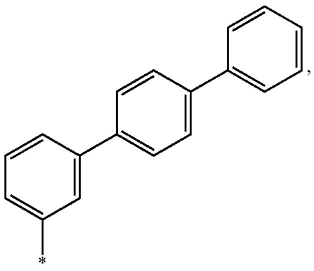
,
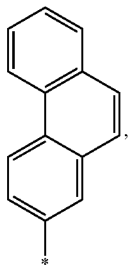
, -continued
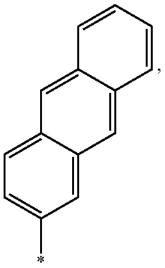
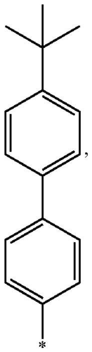
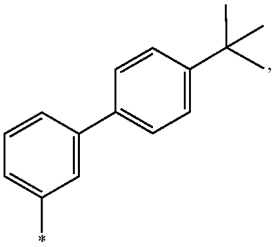
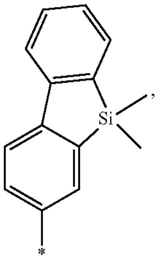
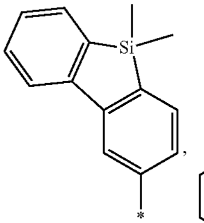
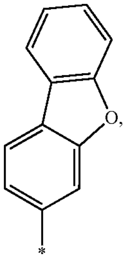
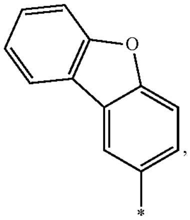
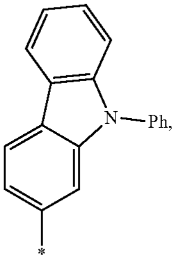
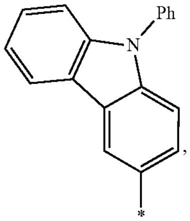
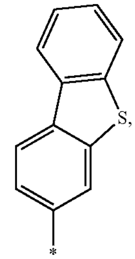
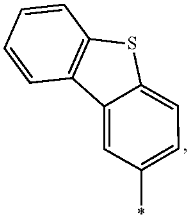
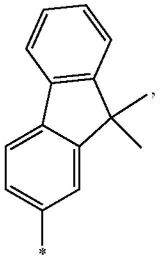
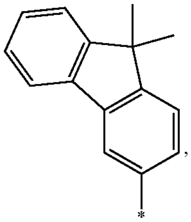
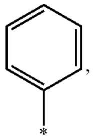
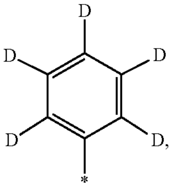
-continued
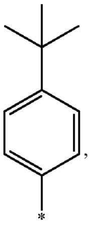
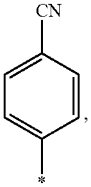
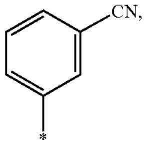
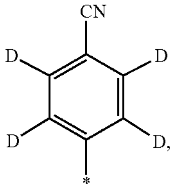
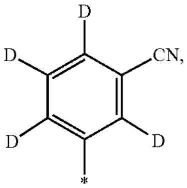
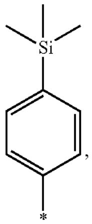
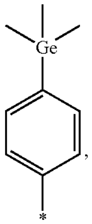
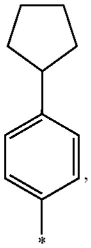
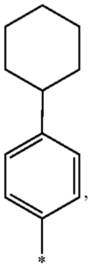
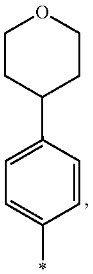
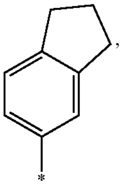
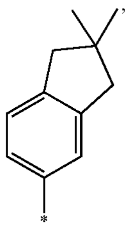
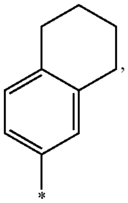
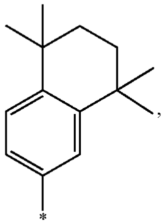
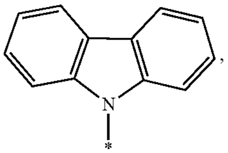
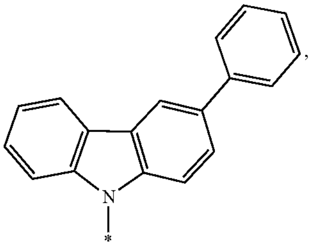

-continued

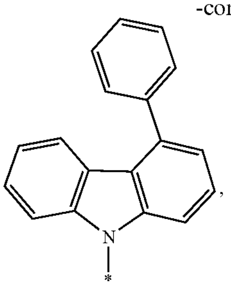
,
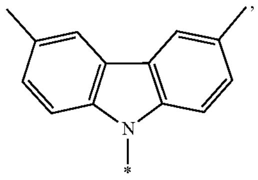
,
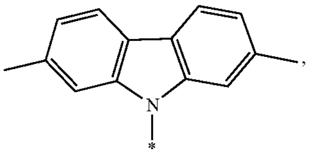
,
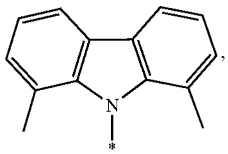
,
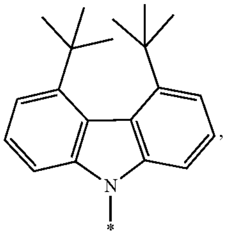
,
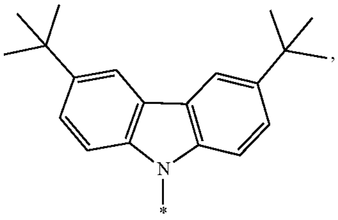
,
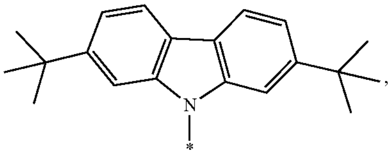
,
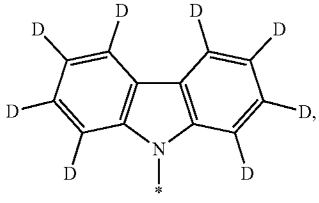
,
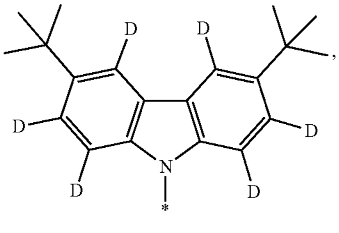
, and combinations thereof; optionally, hydrogens in the above groups can be partially or fully replaced with deuterium; wherein "*" represents a position of attachment.

According to an embodiment of the present disclosure, at least two of $X_1$ to $X_4$ are selected from $CR_x$, one of $R_x$ is selected from cyano or fluorine, and at least another $R_x$ has a structure represented by Formula 1-2.

According to an embodiment of the present disclosure, $X_1$ is selected from $CR_x$, wherein $R_x$ is cyano or fluorine, and $X_2$ is selected from $CR_x$, wherein $R_x$ has a structure represented by Formula 1-2.

According to an embodiment of the present disclosure, $X_2$ is selected from $CR_x$, wherein $R_x$ is cyano or fluorine, and $X_1$ is selected from $CR_x$, wherein $R_x$ has a structure represented by Formula 1-2.

According to an embodiment of the present disclosure, the second compound has a structure represented by Formula 2-2:

Formula 2-2

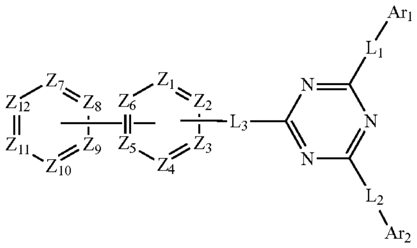

wherein, $Z_1$ to $Z_{12}$ are, at each occurrence identically or differently, selected from C, $CR_z$ or N;

$L_1$ to $L_3$ are, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms, or combinations thereof;

$Ar_1$ and $Ar_2$ are, at each occurrence identically or differently, selected from substituted or unsubstituted aryl having 6 to 30 carbon atoms, substituted or unsubstituted heteroaryl having 3 to 30 carbon atoms, or combinations thereof;

$R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, sulfanyl group, a sulfinyl group, a sulfonyl group, a phosphino group, and combinations thereof;

adjacent substituents $R_z$ can be optionally joined to form a ring.

In the present disclosure, the expression that adjacent substituents $R_z$ can be optionally joined to form a ring is intended to mean that any one or more of groups of any two adjacent substituents $R_z$ can be joined to form a ring. Obviously, it is possible that none of these adjacent substituents are joined to form a ring.

According to an embodiment of the present disclosure, the second compound has a structure represented by Formula 2-3:

Formula 2-3

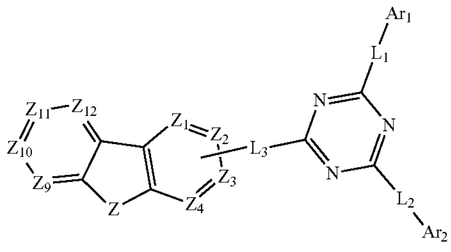

wherein,

Z is, at each occurrence identically or differently, selected from O, S, or Se;

$Z_1$ to $Z_4$ and $Z_9$ to $Z_{12}$ are, at each occurrence identically or differently, selected from C, $CR_z$ or N, and at least one of $Z_1$ to $Z_4$ is C and is joined to $L_3$;

$L_1$ to $L_3$ are, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms, or combinations thereof;

$Ar_1$ and $Ar_2$ are, at each occurrence identically or differently, selected from substituted or unsubstituted aryl having 6 to 30 carbon atoms, substituted or unsubstituted heteroaryl having 3 to 30 carbon atoms, or combinations thereof;

$R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, sulfanyl group, a sulfinyl group, a sulfonyl group, a phosphino group, and combinations thereof;

adjacent substituents $R_z$ can be optionally joined to form a ring.

According to an embodiment of the present disclosure, at least one of $Z_1$ to $Z_4$ and $Z_9$ to $Z_{12}$ is $CR_z$, and $R_z$ is substituted or unsubstituted aryl having 6 to 30 carbon atoms.

According to an embodiment of the present disclosure, the second compound comprises at least one of the group consisting of: fluorine, cyano, an aza-aromatic ring group, any of the following groups substituted by one or more of fluorine, cyano or an aza-aromatic ring group: aryl having 6 to 30 carbon atoms and heteroaryl having 3 to 30 carbon atoms, and combinations thereof.

According to an embodiment of the present disclosure, $Ar_1$ and $Ar_2$ are, at each occurrence identically or differently, selected from substituted or unsubstituted aryl having 6 to 20 carbon atoms, substituted or unsubstituted heteroaryl having 3 to 20 carbon atoms, or combinations thereof.

According to an embodiment of the present disclosure, $Ar_1$ and $Ar_2$ are, at each occurrence identically or differently, selected from substituted or unsubstituted phenyl, substituted or unsubstituted biphenyl, substituted or unsubstituted terphenyl, substituted or unsubstituted naphthyl, substituted or unsubstituted phenanthryl, substituted or unsubstituted triphenylenyl, substituted or unsubstituted fluorenyl, substituted or unsubstituted dibenzofuryl, substituted or unsubstituted dibenzothienyl, substituted or unsubstituted pyridyl, substituted or unsubstituted pyrimidinyl, substituted or unsubstituted quinolyl, or combinations thereof.

According to an embodiment of the present disclosure, the third compound has a structure represented by Formula 3-1:

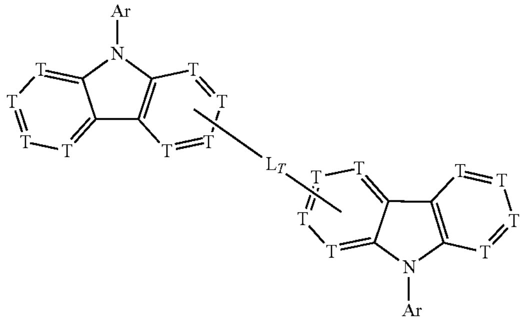

wherein, $L_T$ is, at each occurrence identically or differently, selected from substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms, or combinations thereof;

Ar is, at each occurrence identically or differently, selected from substituted or unsubstituted aryl having 6 to 30 carbon atoms, substituted or unsubstituted heteroaryl having 3 to 30 carbon atoms, or combinations thereof;

T is, at each occurrence identically or differently, selected from C, $CR_t$ or N;

$R_t$ is, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, sulfanyl group, a sulfinyl group, a sulfonyl group, a phosphino group, and combinations thereof;

adjacent substituents $R_t$ can be optionally joined to form a ring.

In the present disclosure, the expression that adjacent substituents $R_t$ can be optionally joined to form a ring is intended to mean that any one or more of groups of any two adjacent substituents $R_t$ can be joined to form a ring. Obviously, it is possible that none of these adjacent substituents are joined to form a ring.

According to an embodiment of the present disclosure, the third compound has a structure represented by Formula 3-2:

Formula 3-2

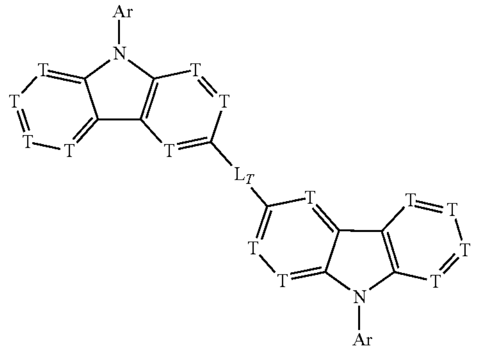

wherein, $L_T$ is, at each occurrence identically or differently, selected from substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms, or combinations thereof;

Ar is, at each occurrence identically or differently, selected from substituted or unsubstituted aryl having 6 to 30 carbon atoms, substituted or unsubstituted heteroaryl having 3 to 30 carbon atoms, or combinations thereof;

T is, at each occurrence identically or differently, selected from $CR_t$ or N;

$R_t$ is, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, sulfanyl group, a hydroxyl group, a sulfinyl group, a sulfonyl group, a phosphino group, and combinations thereof;

adjacent substituents $R_t$ can be optionally joined to form a ring.

According to an embodiment of the present disclosure, the first compound is, at each occurrence identically or differently, selected from the group consisting of GD-1 to GD-16, wherein the specific structures of GD-1 to GD-16 listed below:

GD-1

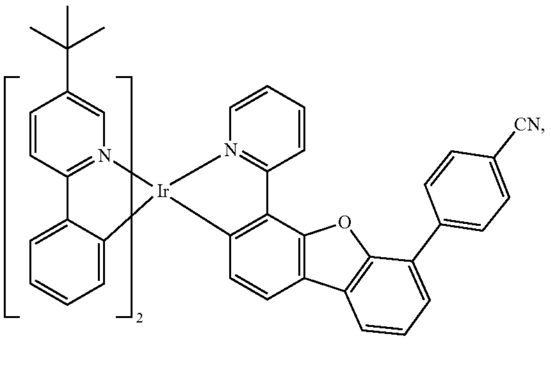

-continued
GD-2
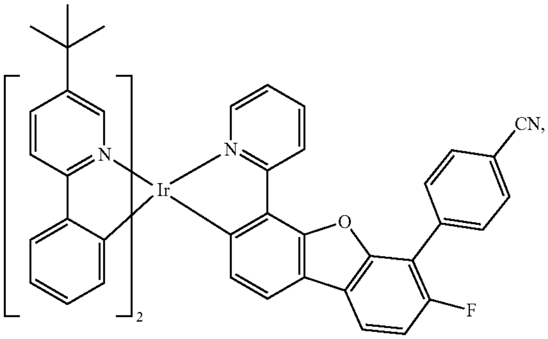
GD-3
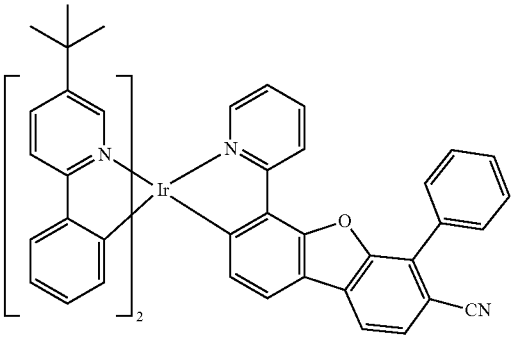
,
GD-4
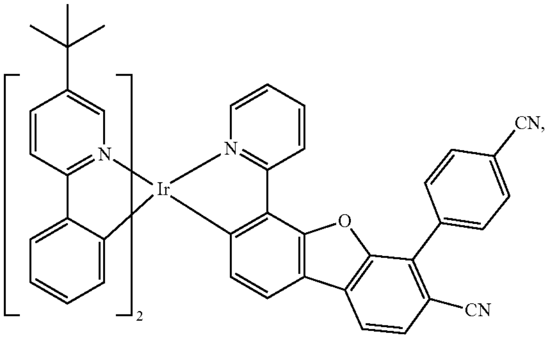
GD-5
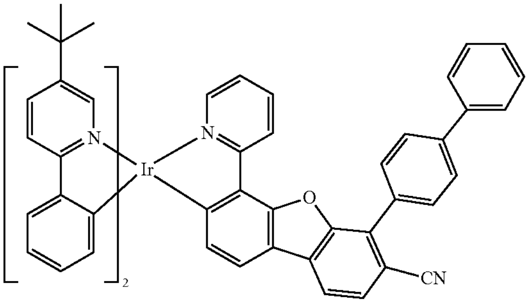
,
-continued
GD-6
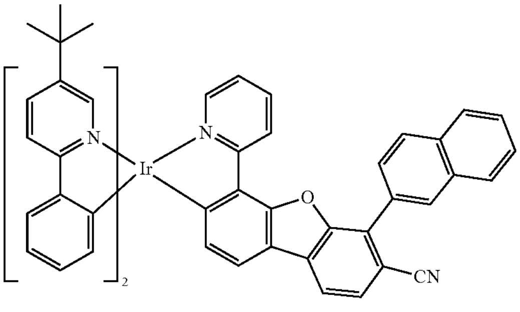
,
GD-7
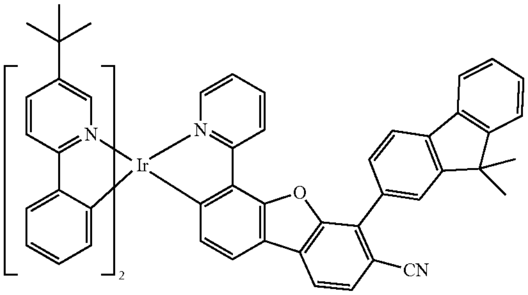
,
GD-8
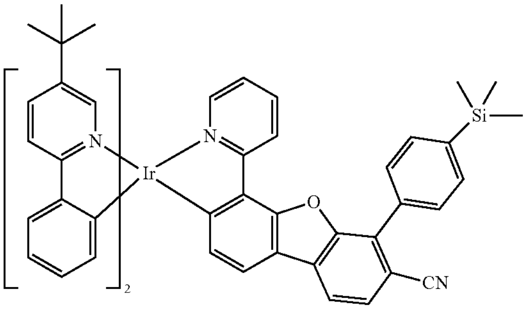
,
GD-9
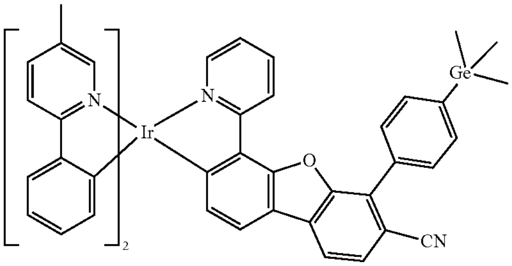
,
GD-10
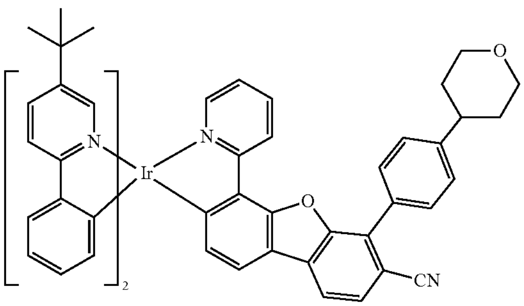
, -continued
GD-11
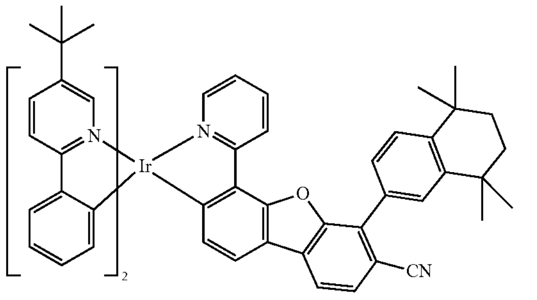
,
GD-12
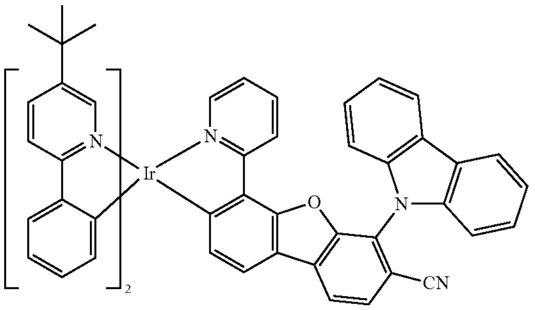
,
GD-13
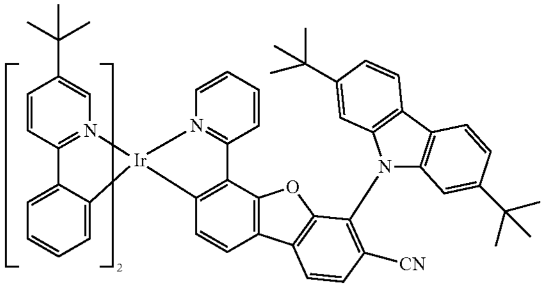
,
GD-14
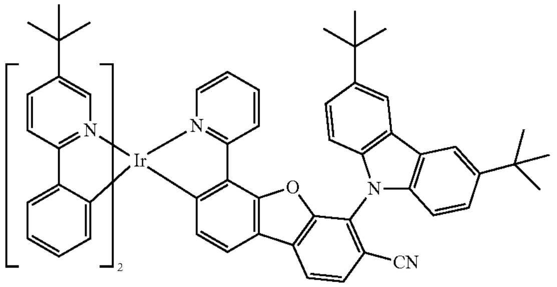
,
GD-15
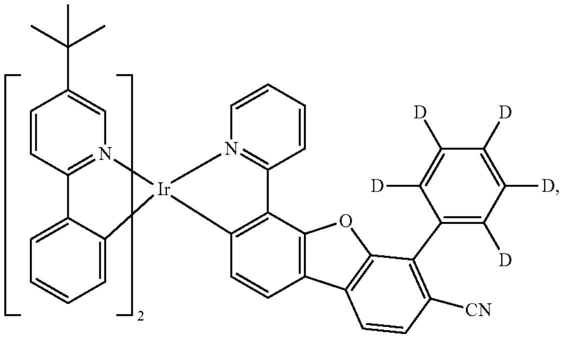
-continued
and
GD-16
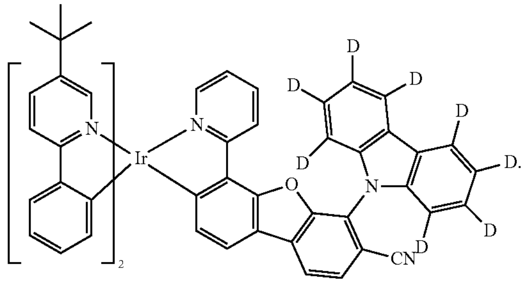
According to an embodiment of the present disclosure, the second compound is, at each occurrence identically or differently, selected from the group consisting of A-1 to A-56, wherein the specific structures of A-1 to A-56 is listed below:
A-1
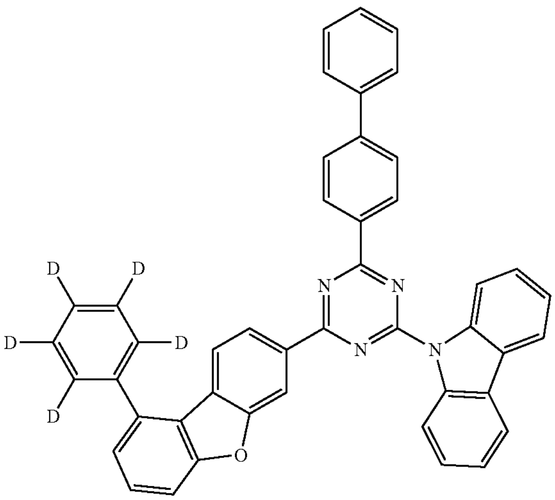
,
A-2
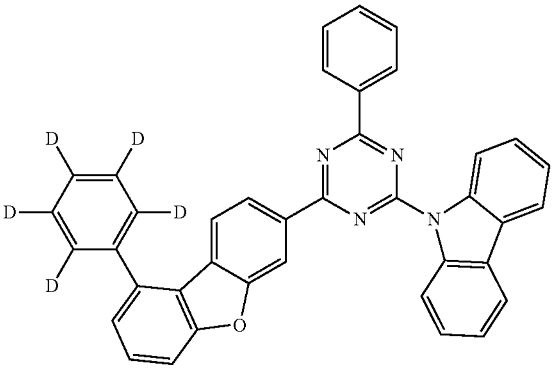
, -continued
A-3
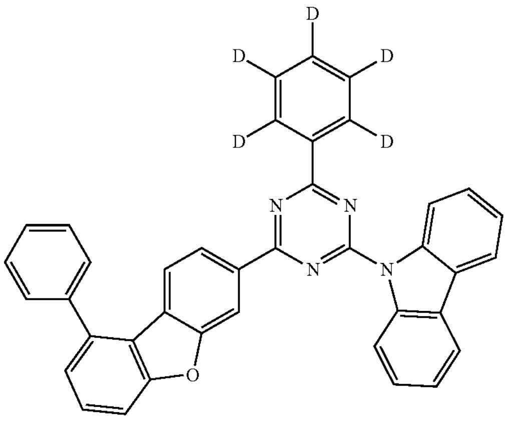
,
A-4
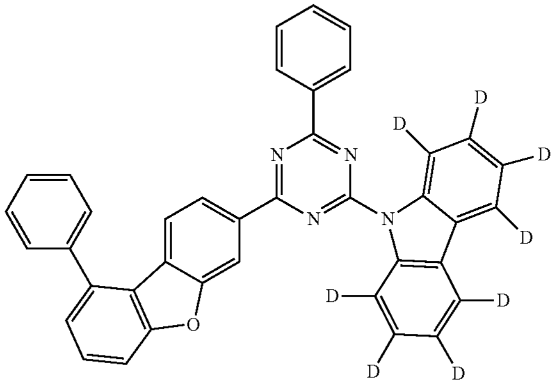
A-5
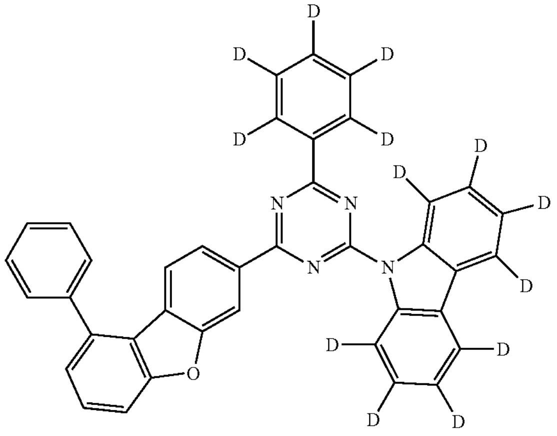
-continued
A-6
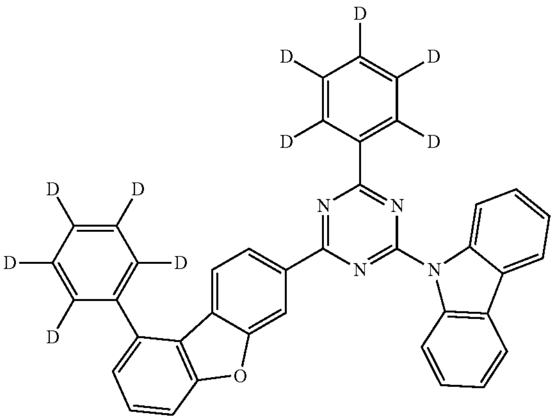
,
A-7
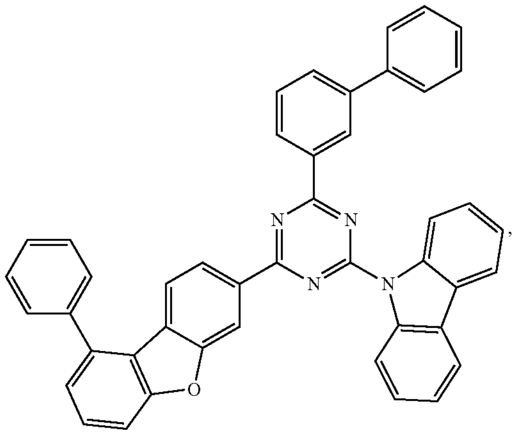
,
A-8
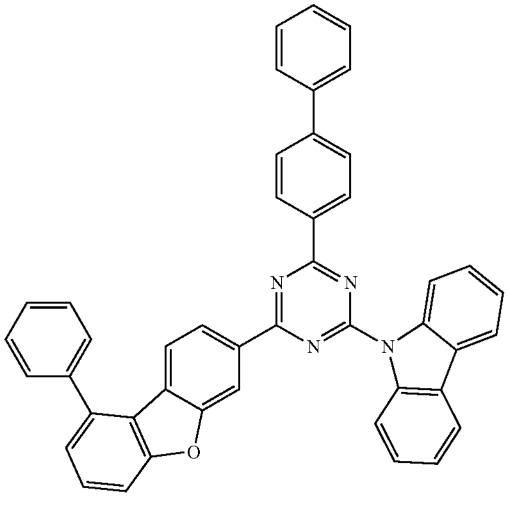
, -continued
A-9
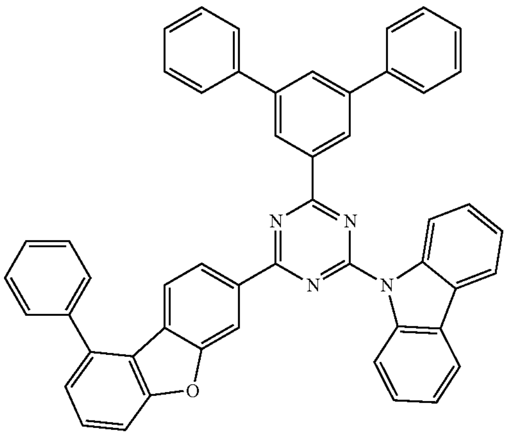
,
A-10
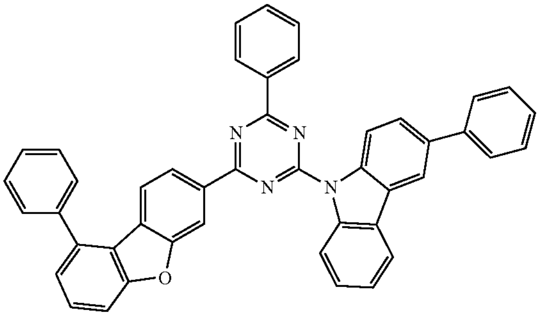
,
A-11
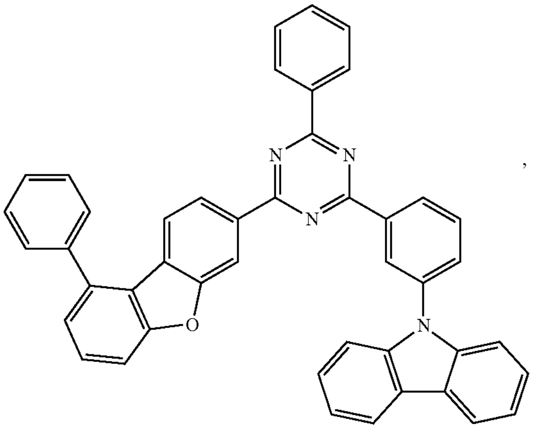
,
A-12
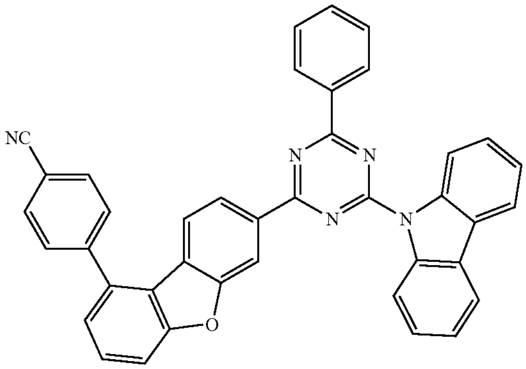
,
-continued
A-13
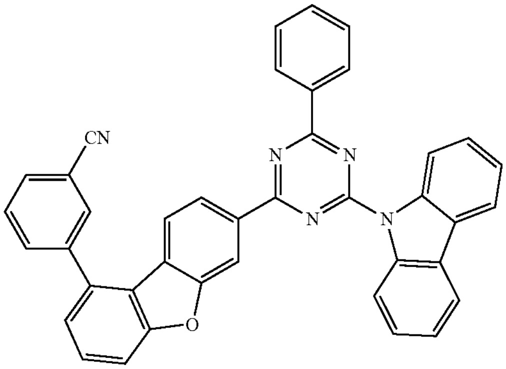
,
A-14
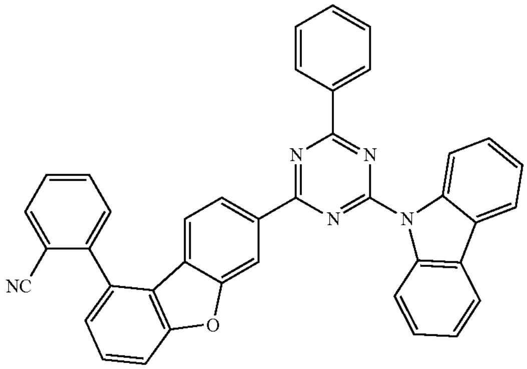
,
A-15
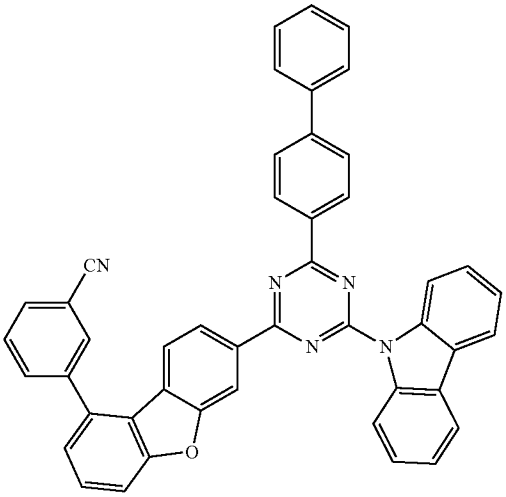
, -continued
A-16
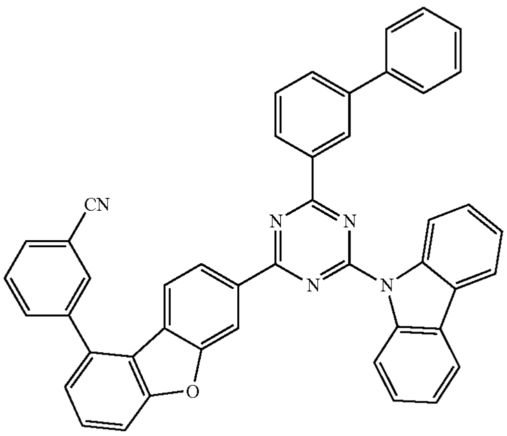
,
A-17
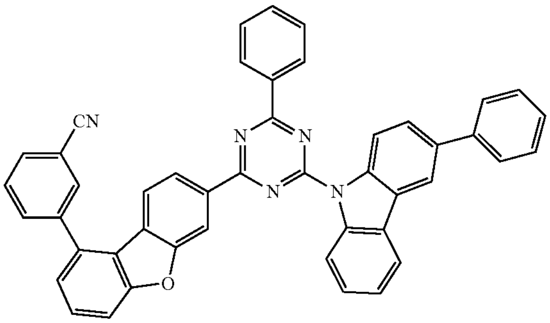
,
A-18
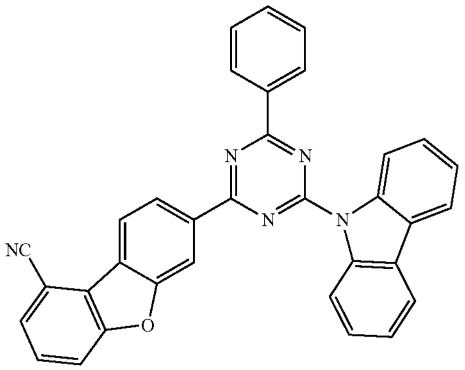
,
A-19
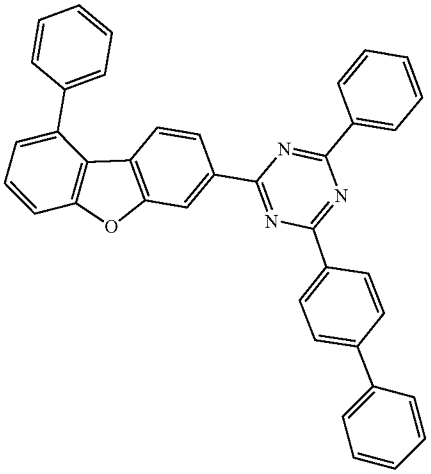
,
-continued
A-20
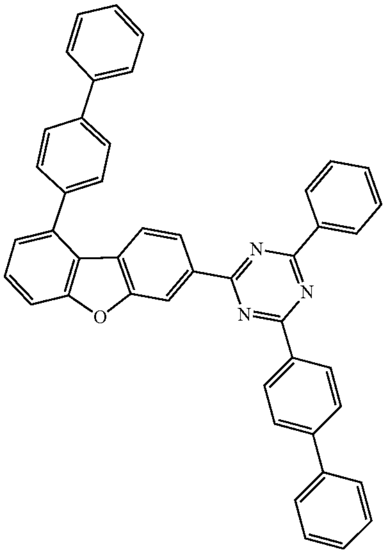
,
A-21
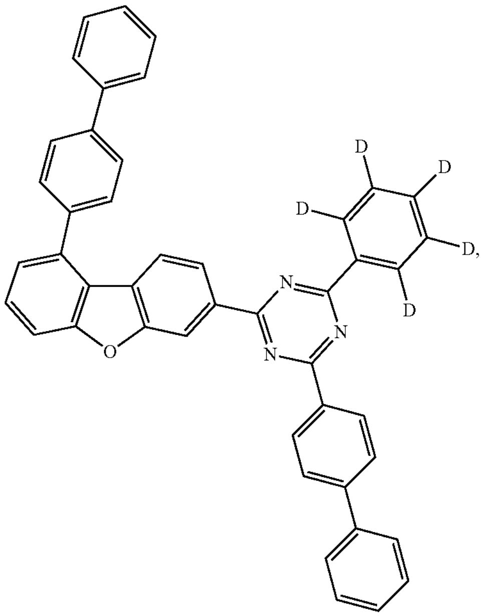
, -continued
A-22
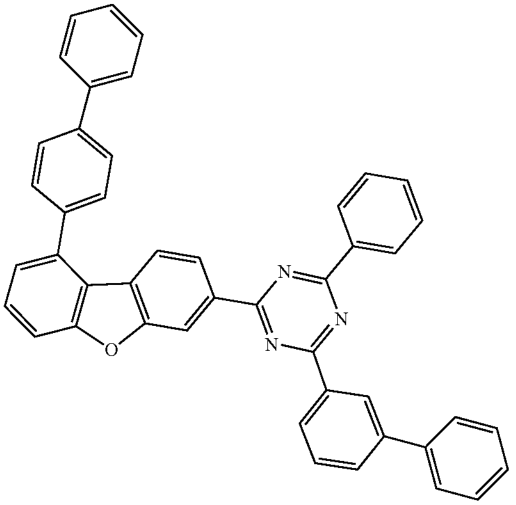,
A-23
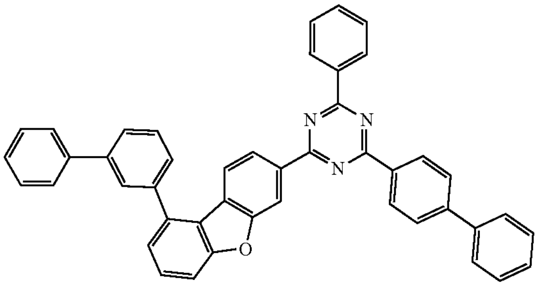,
A-24
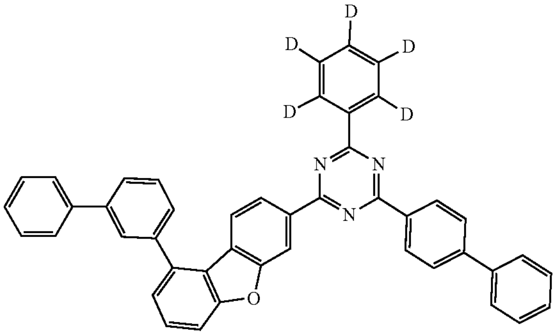,
A-25
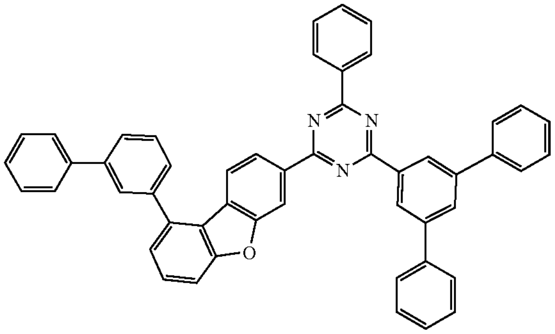,
-continued
A-26
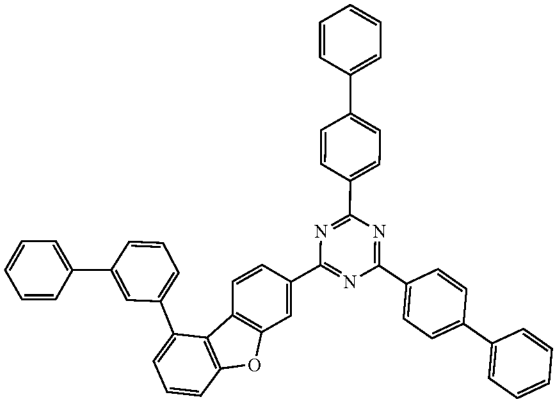,
A-27
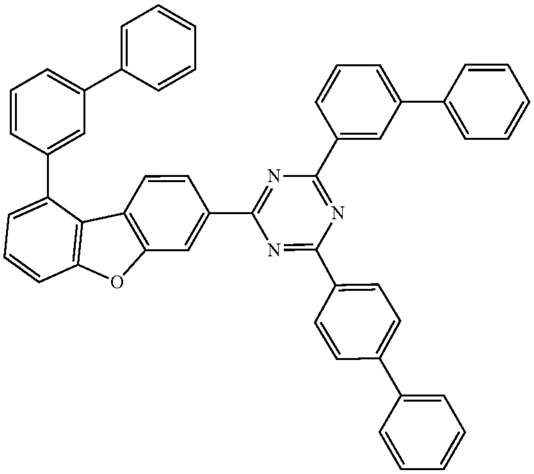,
A-28
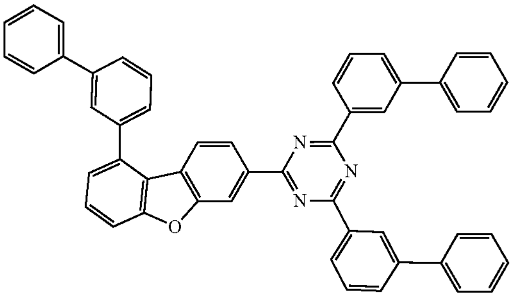,
A-29
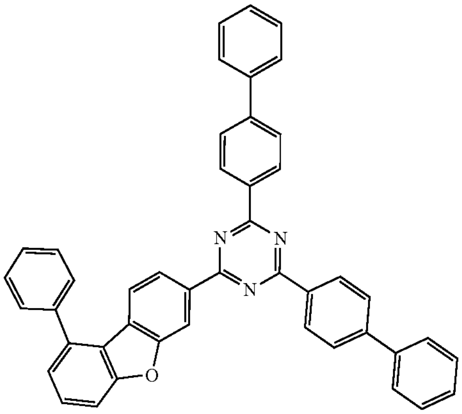, -continued
A-30
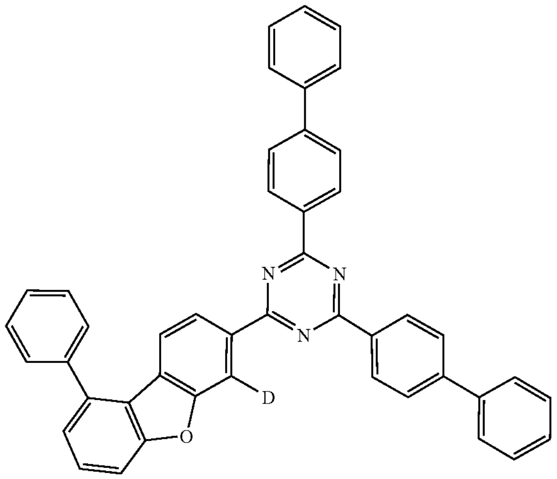
,
A-31
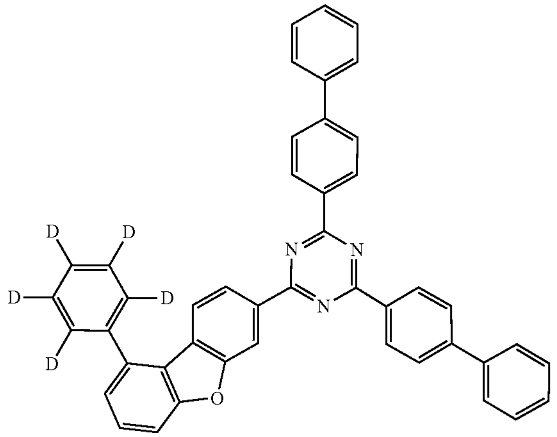
,
A-32
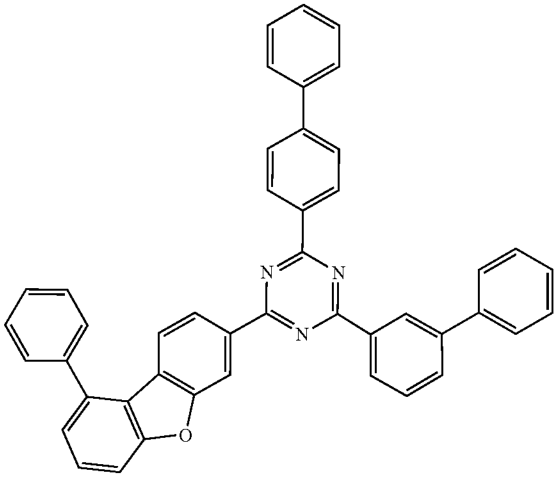
,
-continued
A-33
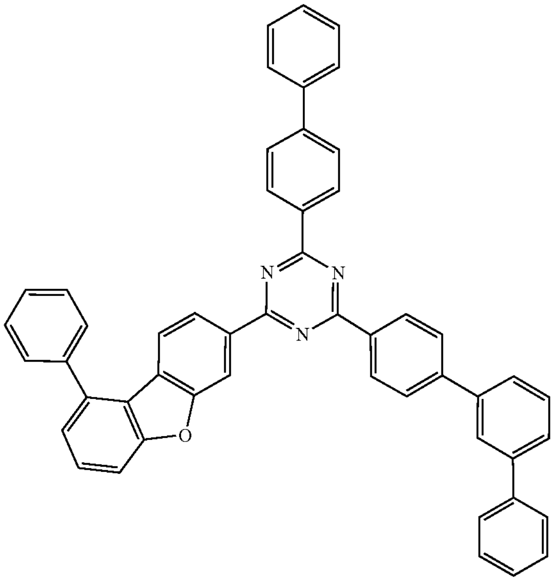
,
A-34
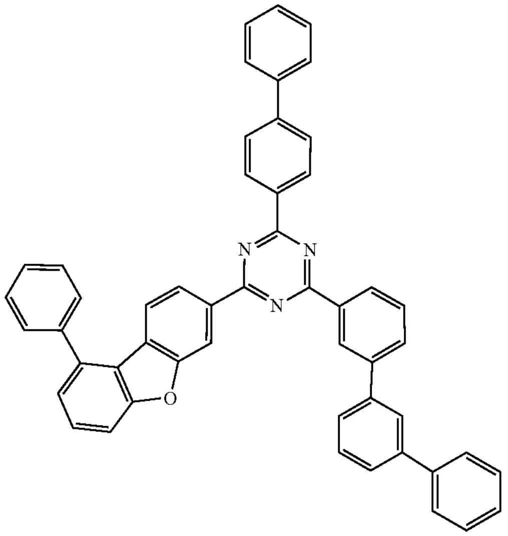
,
A-35
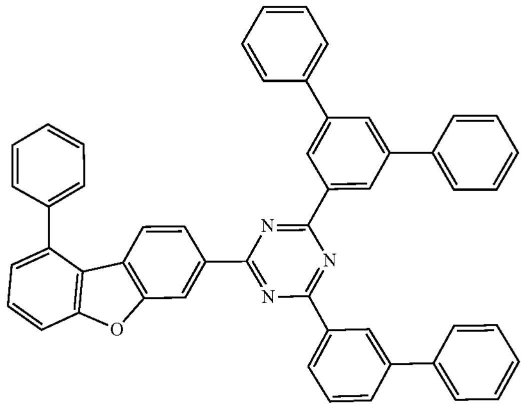
, -continued
A-36
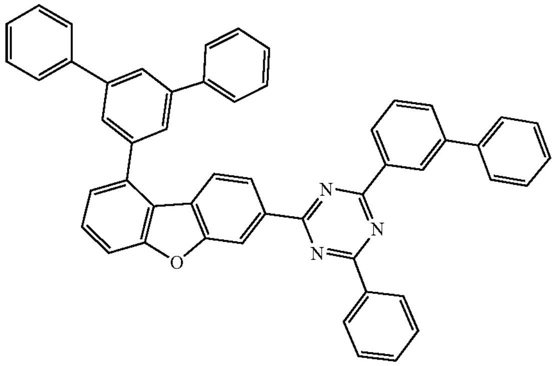
,
A-37
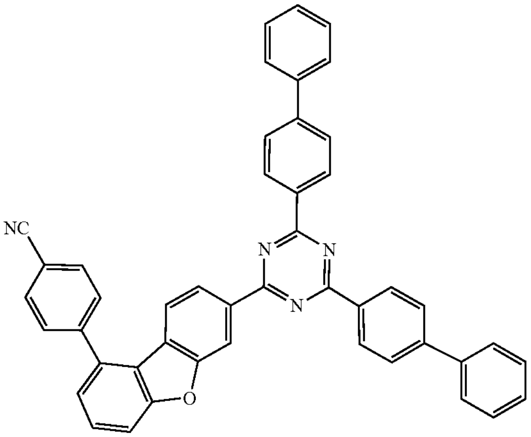
,
A-38
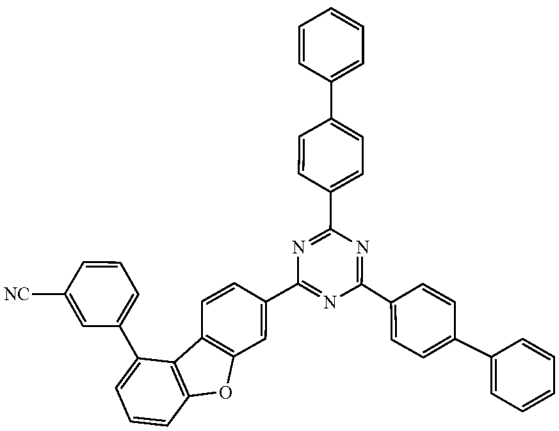
,
-continued
A-39
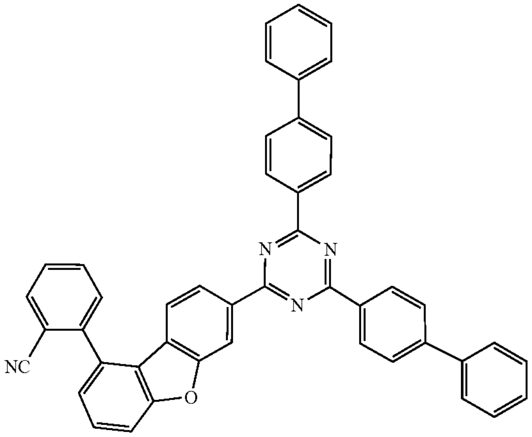
,
A-40
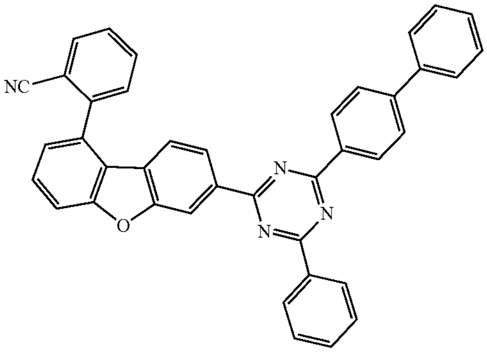
,
A-41
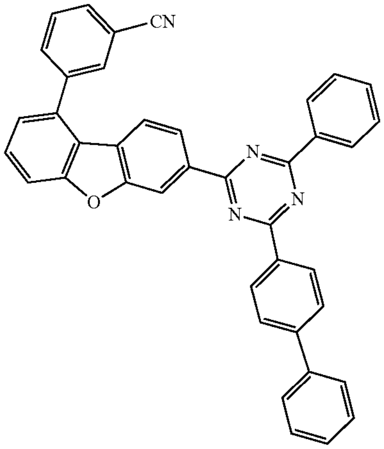
, -continued
A-42
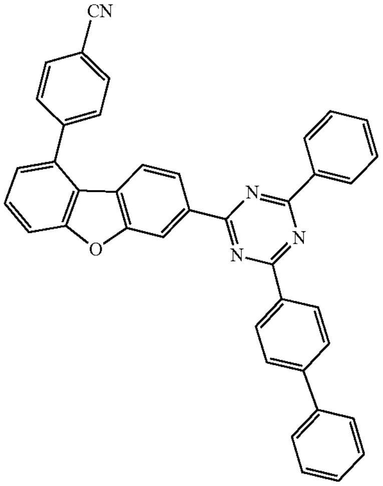
,
A-43
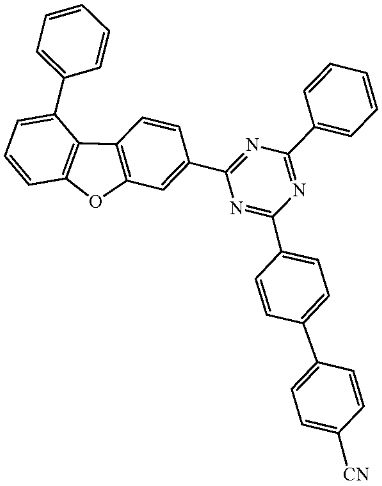
,
A-44
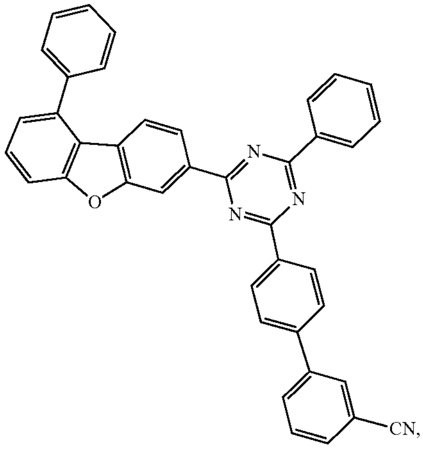
CN,
-continued
A-45
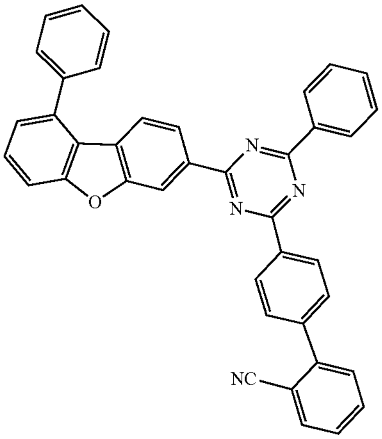
,
A-46
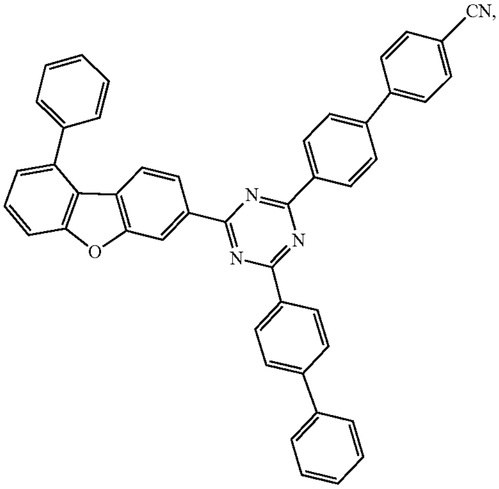
CN,
A-47
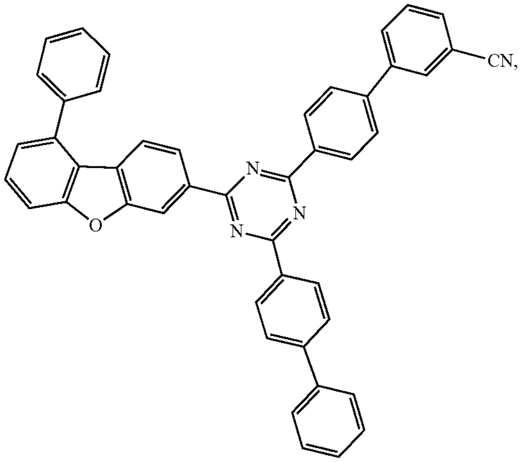
CN, -continued
A-48
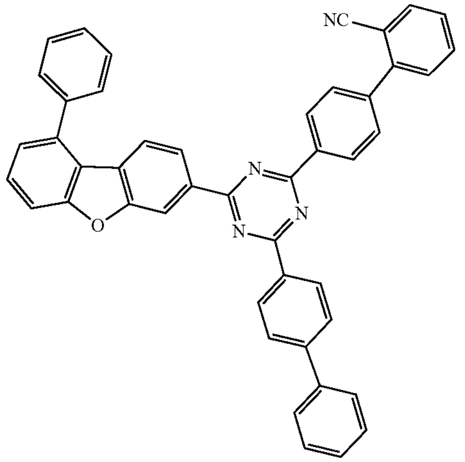
,
A-49
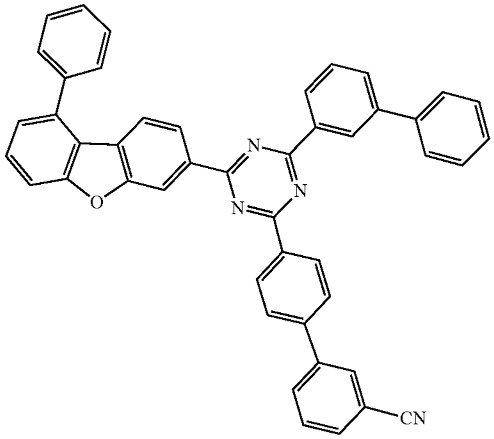
,
A-50
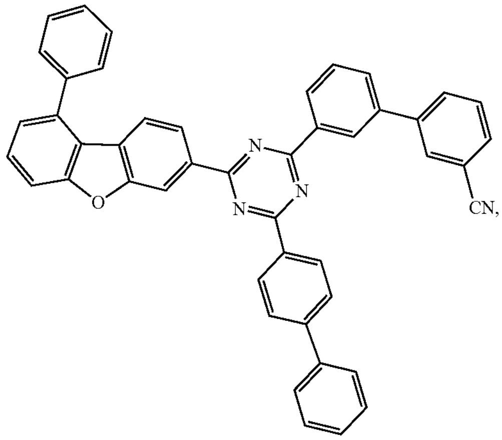
CN,
-continued
A-51
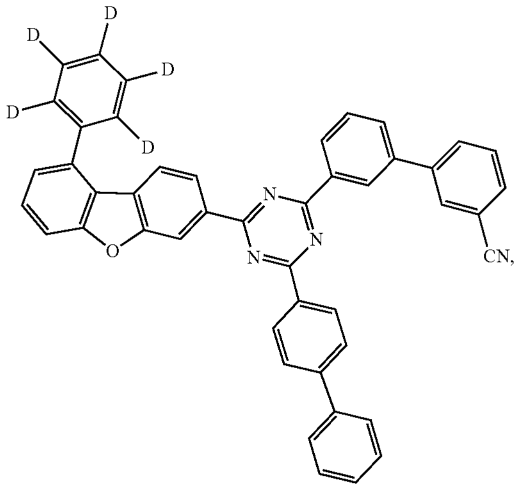
CN,
A-52
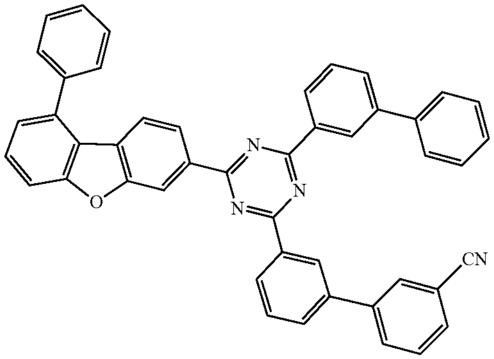
,
A-53
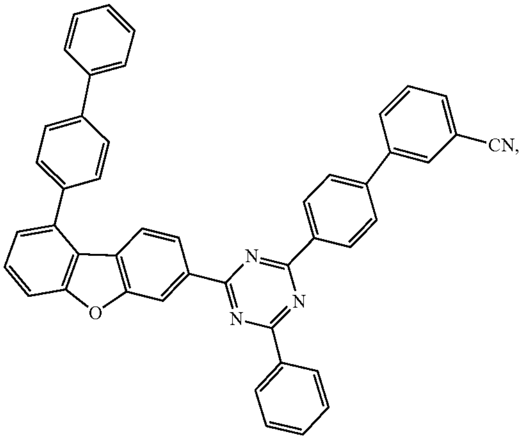
CN, -continued
A-54
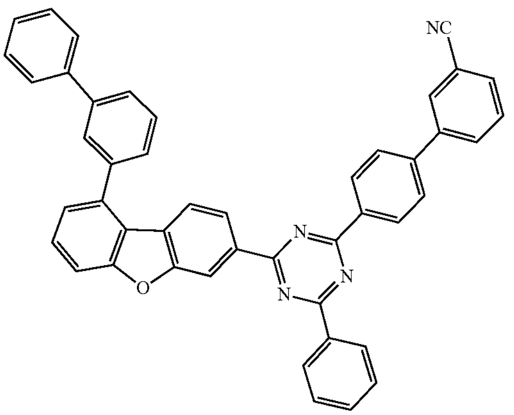
,
A-55
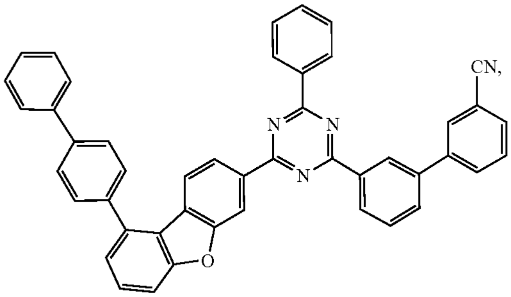
CN, and
A-56
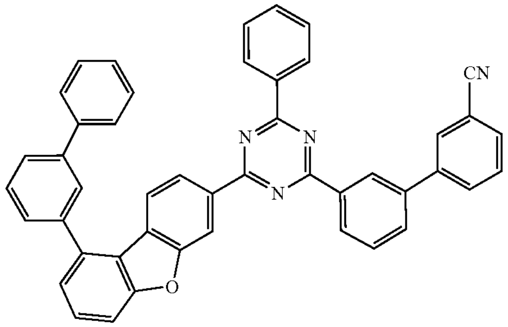
.
According to an embodiment of the present disclosure, the third compound is, at each occurrence identically or differently, selected from the group consisting of B-1 to B-40, wherein the specific structures of B-1 to B-40 is listed below:
B-1
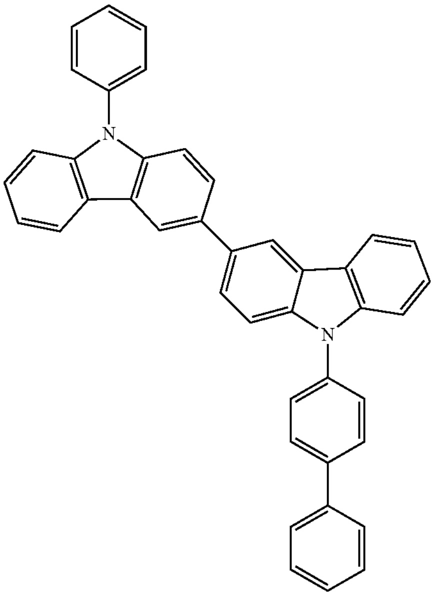
,
B-2
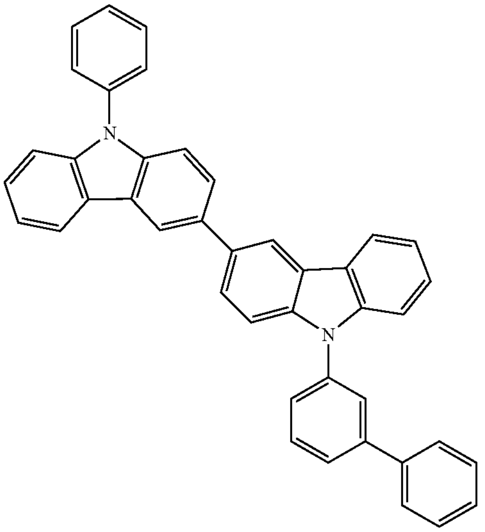
, -continued
B-3
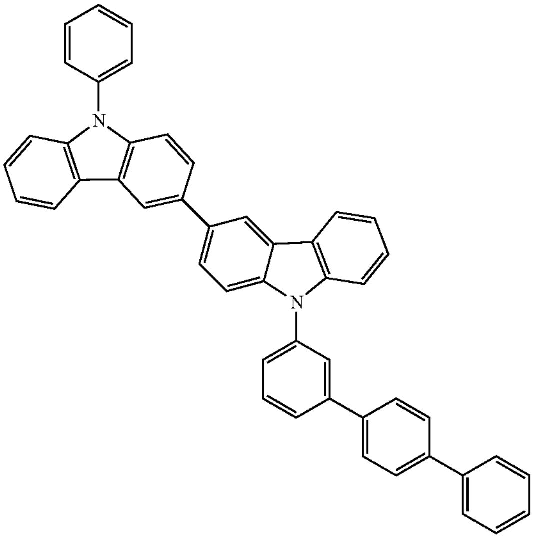
,
B-4
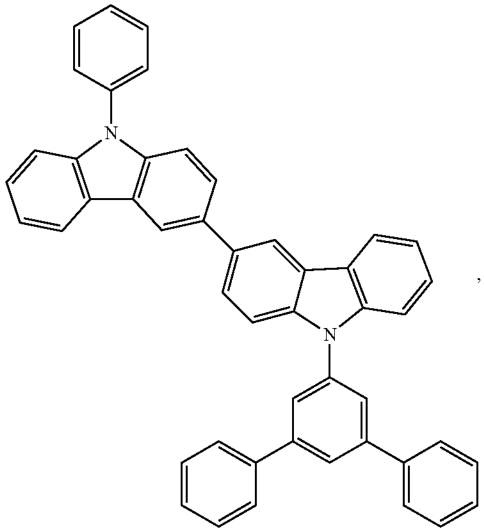
,
B-5
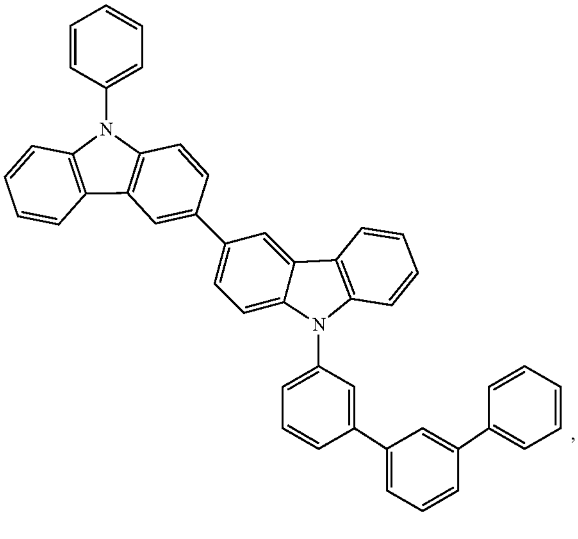
,
-continued
B-6
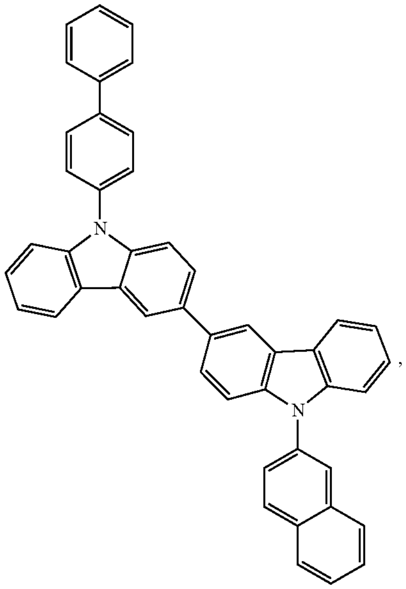
,
B-7
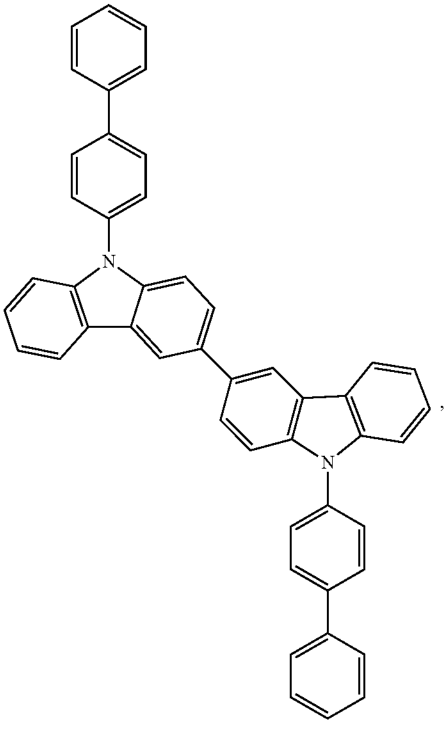
, -continued
B-8
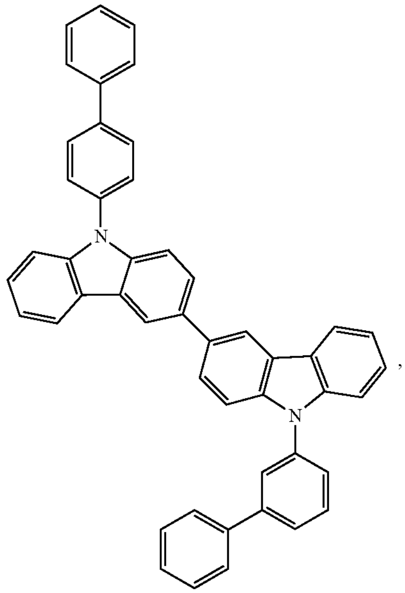
,
B-9
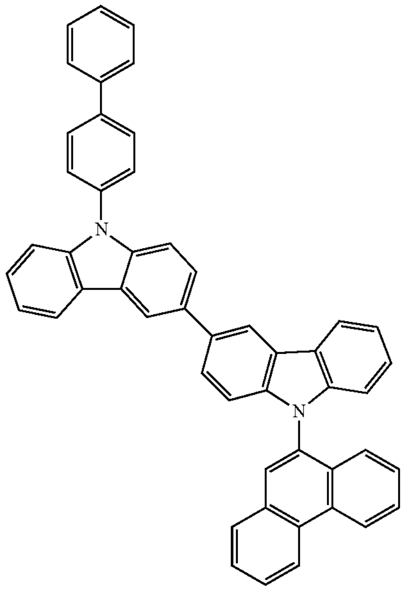
,
-continued
B-10
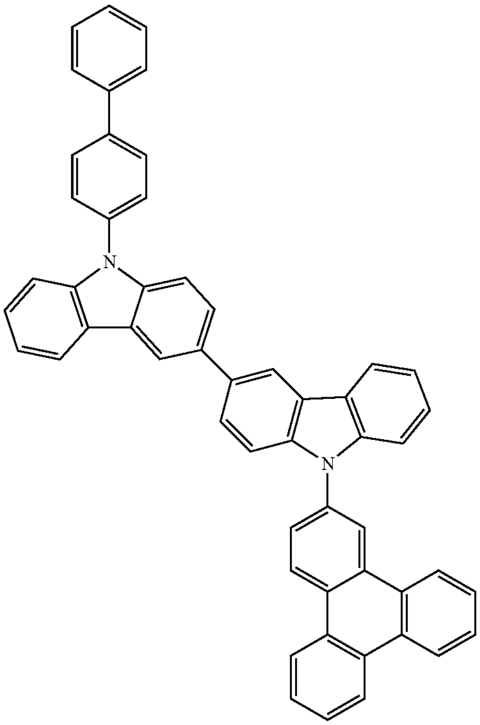
,
B-11
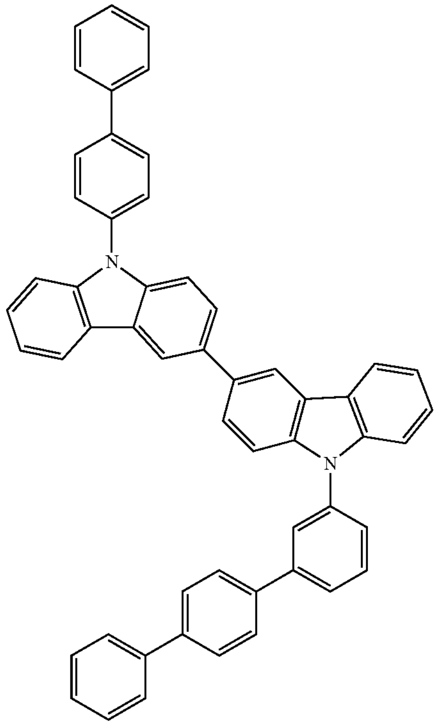
, -continued
B-12
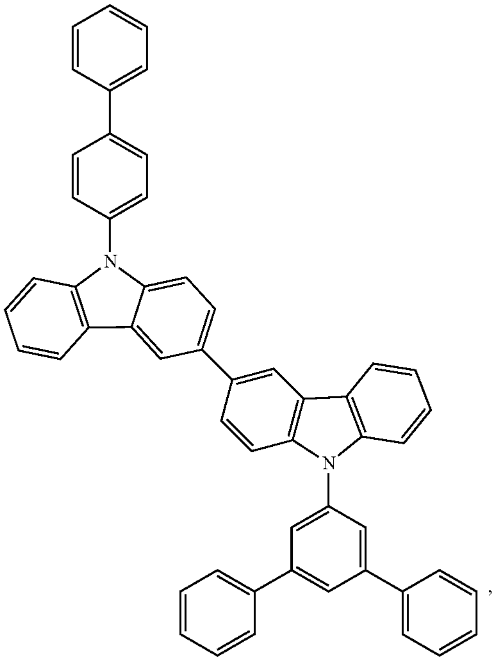
,
B-13
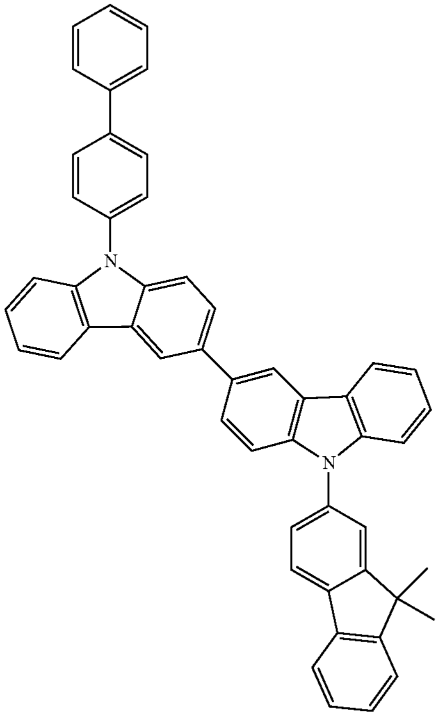
,
-continued
B-14
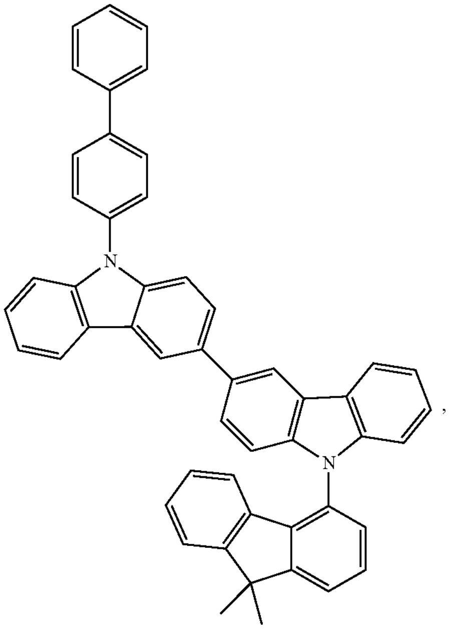
,
B-15
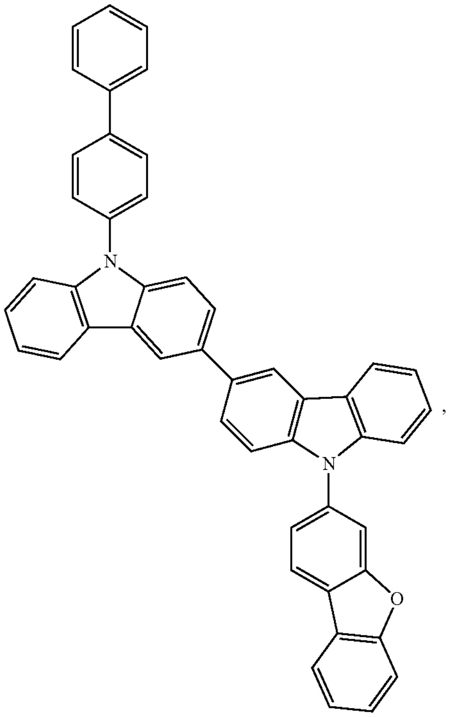
, -continued
B-16
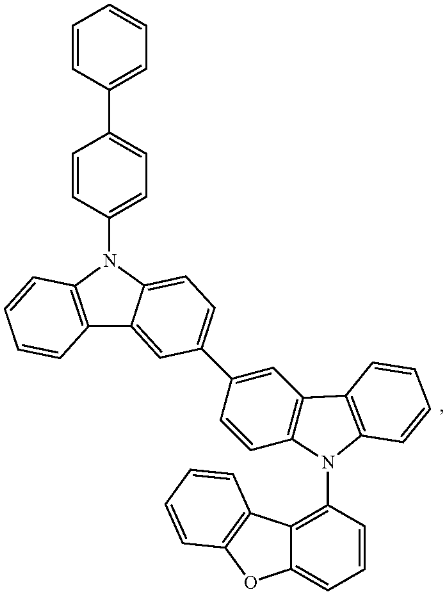
,
B-17
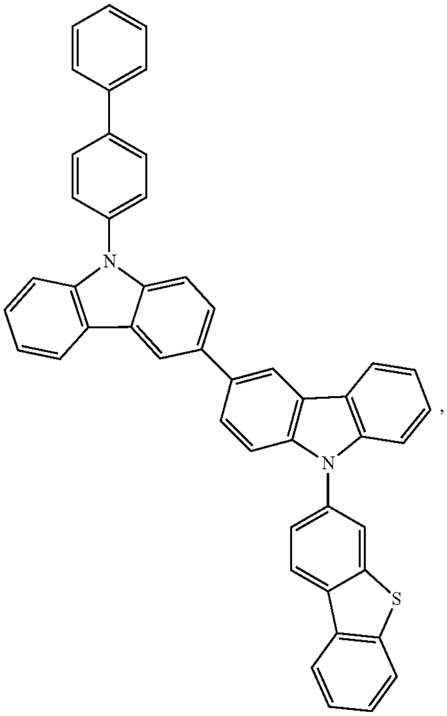
,
-continued
B-18
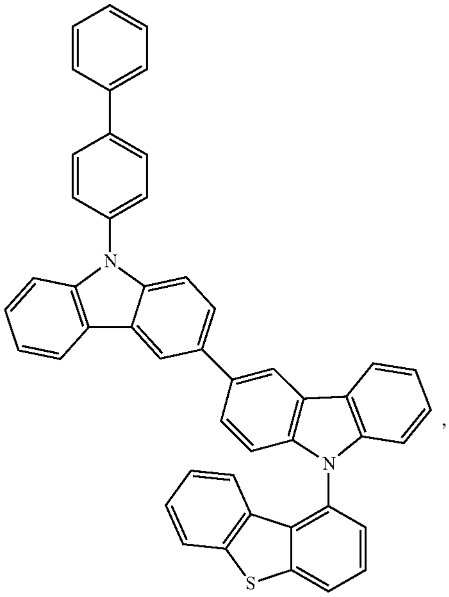
,
B-19
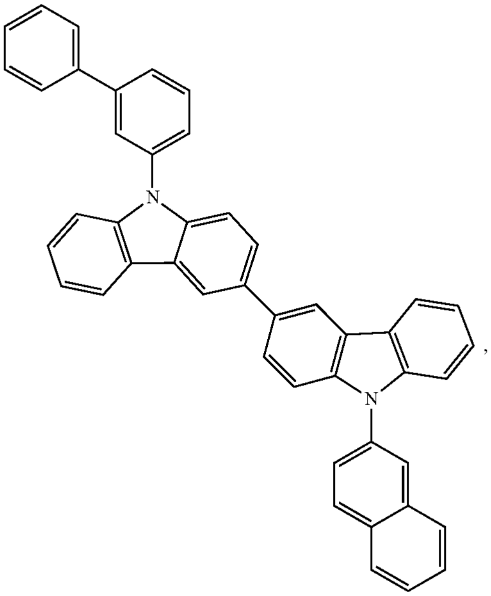
, -continued
B-20
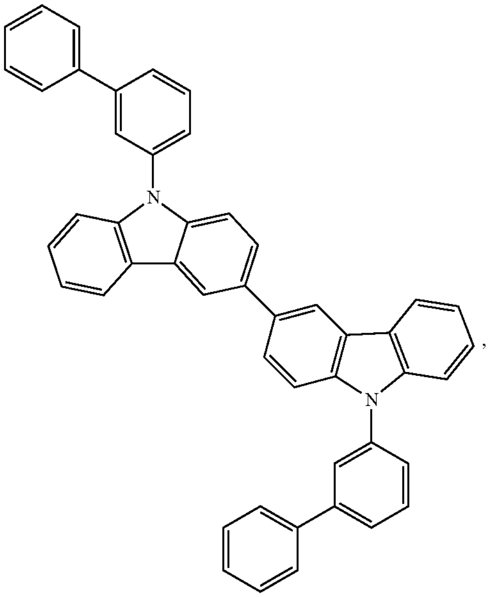
,
B-21
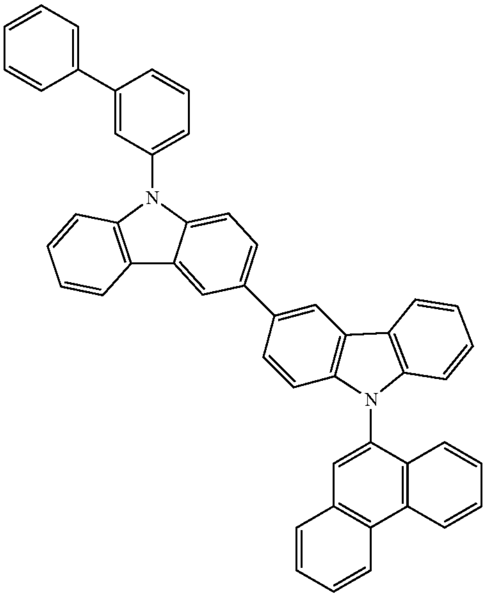
,
-continued
B-22
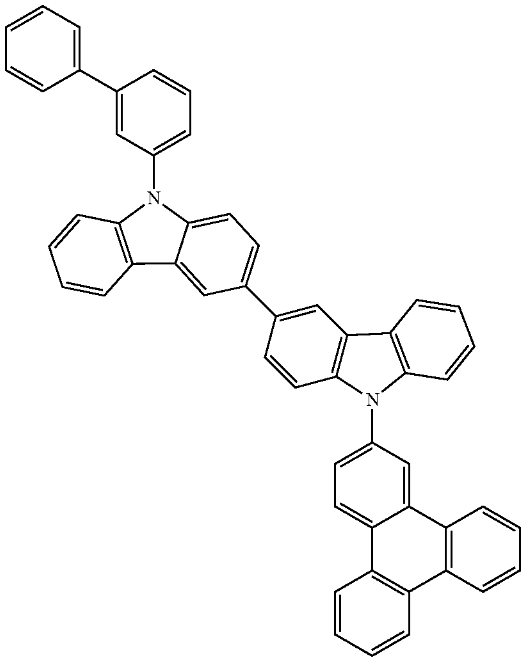
,
B-23
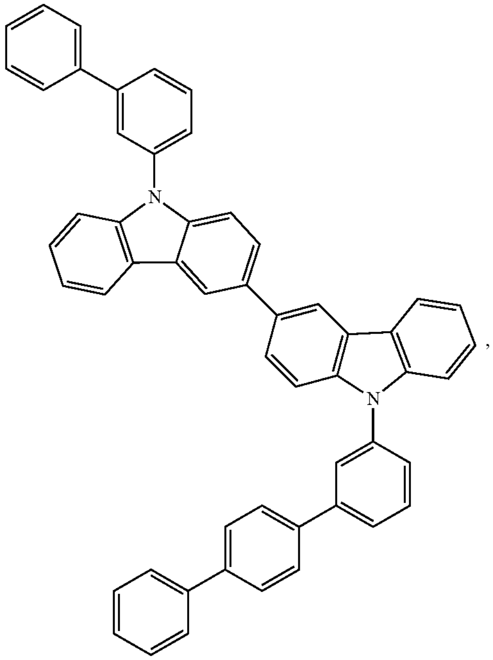
, -continued
B-24
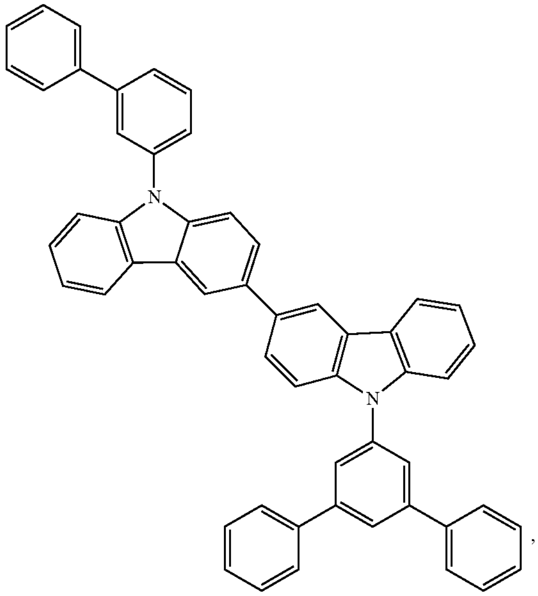
,
B-25
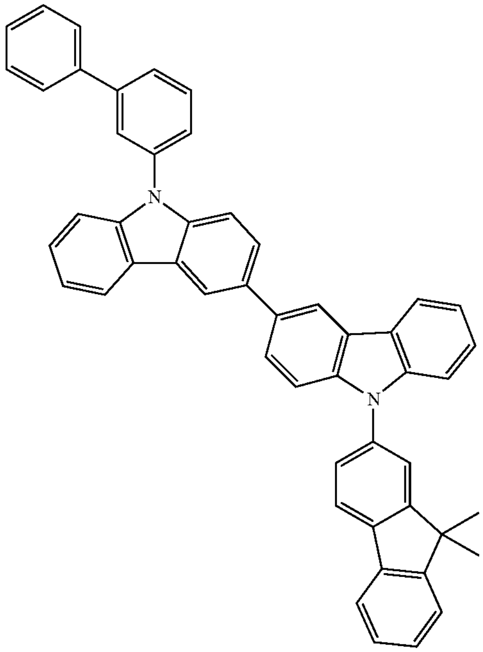
,
-continued
B-26
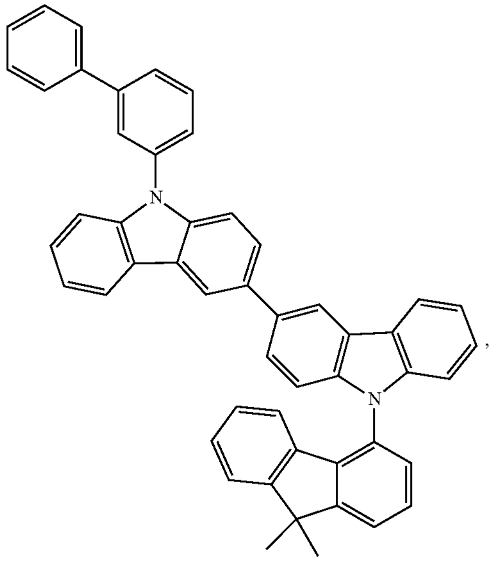
,
B-27
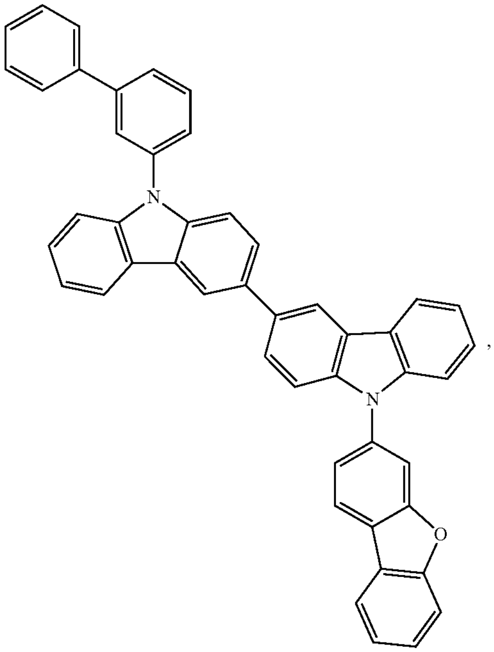
, -continued
B-28
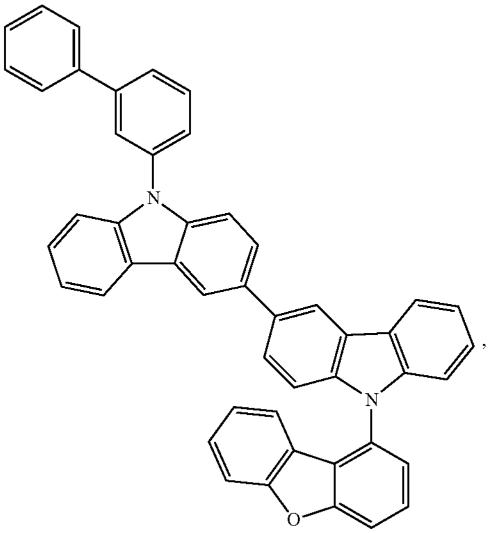
,
B-29
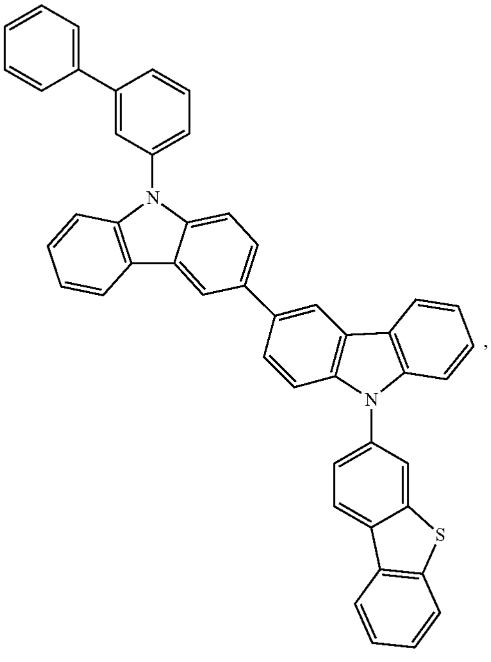
,
-continued
B-30
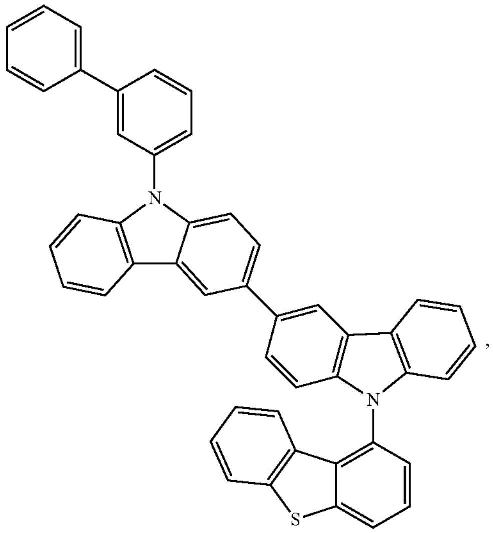
,
B-31
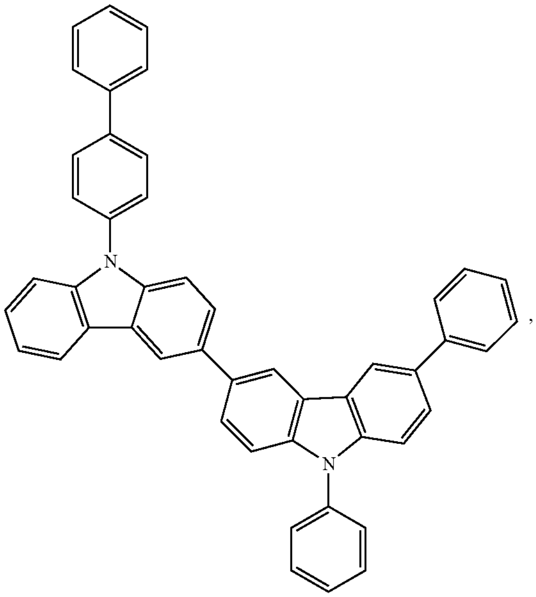
, -continued
B-32
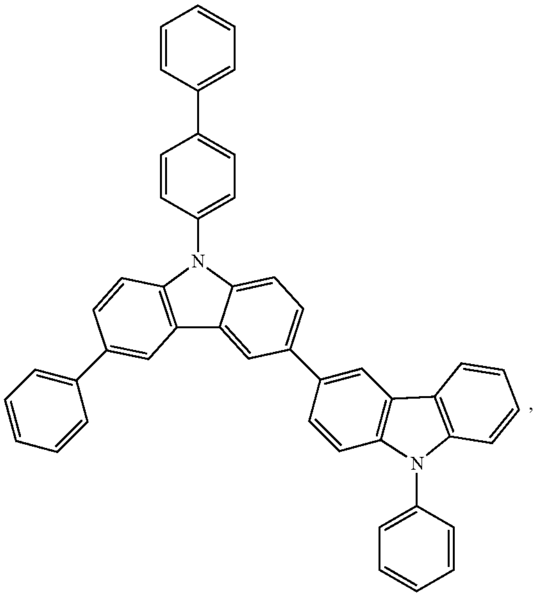
,
B-33
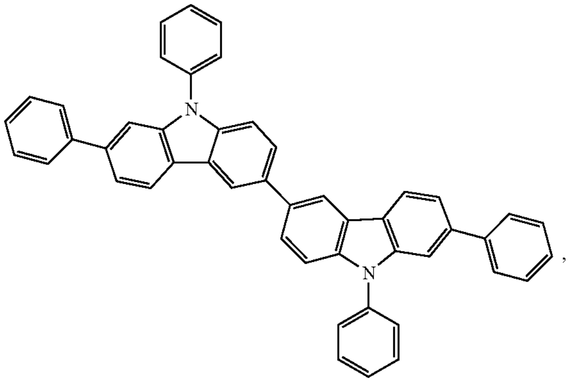
,
B-34
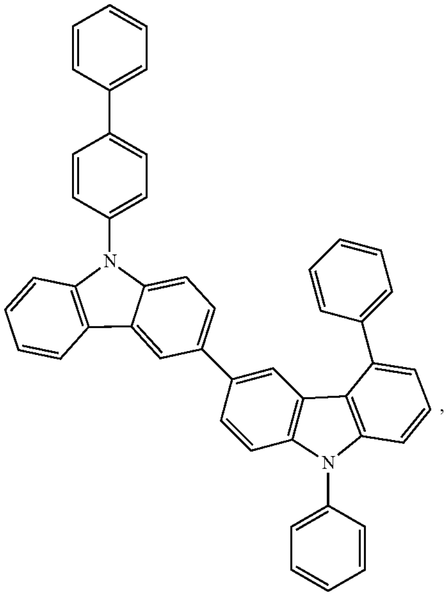
,
-continued
B-35
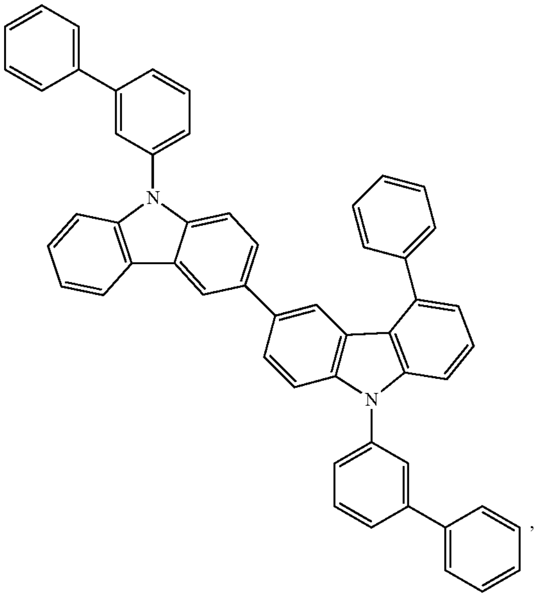
,
B-36
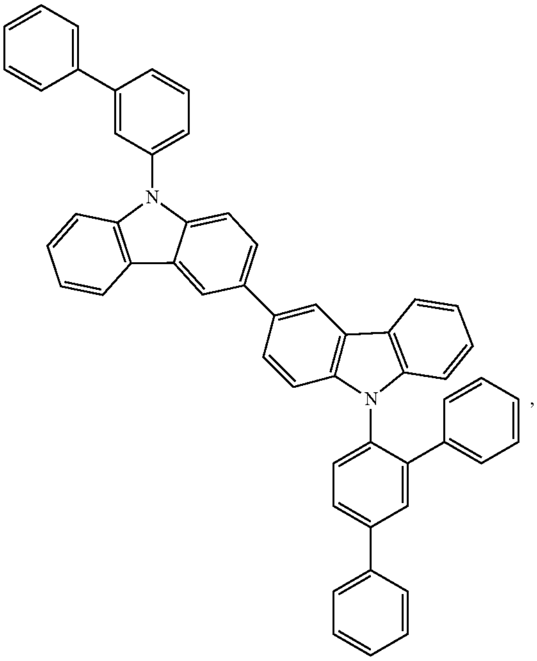
, -continued

B-37

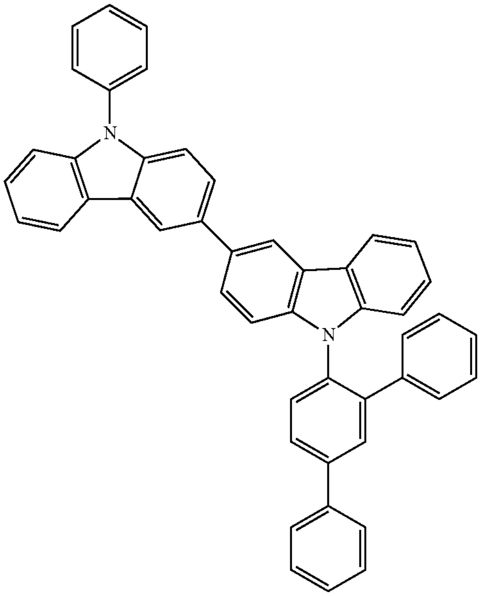

,

B-38

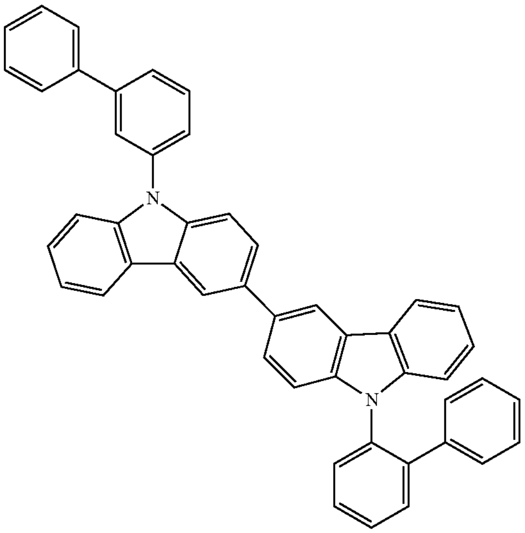

,

-continued

B-39

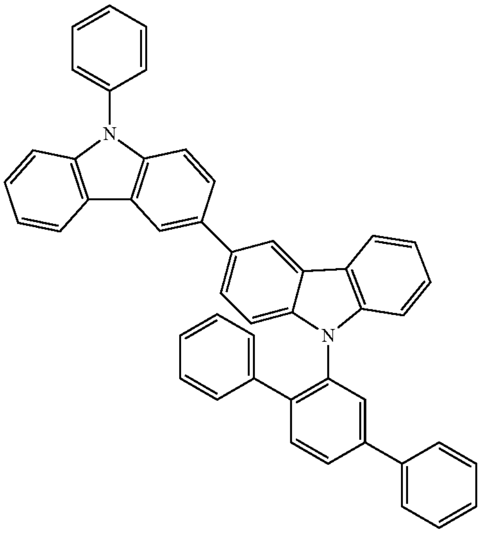

, and

B-40

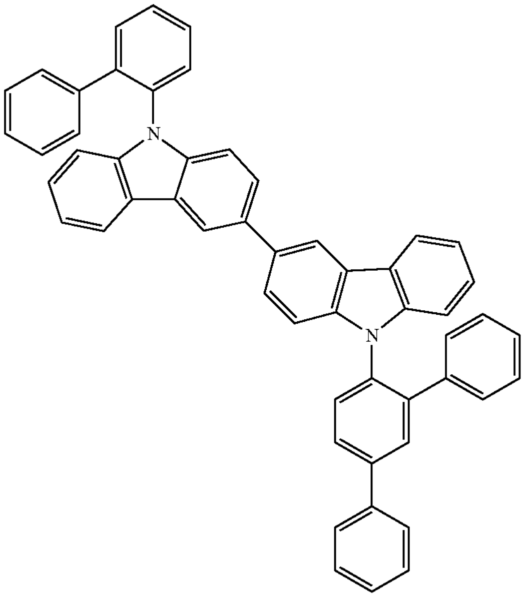

.

According to an embodiment of the present disclosure, the emissive layer in the organic electroluminescent device further comprises a third compound, wherein the second compound and the third compound may be simultaneously deposited from two evaporation sources respectively to form the emissive layer, or the second compound and the third compound may be pre-mixed and stably co-deposited from a single evaporation source to form the emissive layer, the latter of which can further save the evaporation source.

According to an embodiment of the present disclosure, the organic electroluminescent device emits green light.

According to an embodiment of the present disclosure, the organic electroluminescent device emits white light.

According to an embodiment of the present disclosure, the first compound is doped in the second compound and the third compound, and the weight of the first compound accounts for 1% to 30% of the total weight of the first organic layer.

According to an embodiment of the present disclosure, the first compound is doped in the second compound and the third compound, and the weight of the first compound accounts for 3% to 13% of the total weight of the first organic layer.

According to an embodiment of the present disclosure, an electronic device is disclosed, which comprises the organic electroluminescent device described in any one of the preceding embodiments.

Combination with Other Materials

The materials described in the present disclosure for a particular layer in an organic light-emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light-emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

The method for preparing an organic electroluminescent device is not limited. The preparation methods in the following examples are just illustrative and should not be construed as limitations. Those skilled in the art can make reasonable improvements on the preparation methods in the following examples based on the related art. For example, the proportions of various materials in the emissive layer are not particularly limited. Those skilled in the art can reasonably select the proportions within a certain range based on the related art. For example, taking the total weight of the materials in the emissive layer as a reference, a host material may account for 80% to 99% and a light-emitting material may account for 10% to 20%; or the host material may account for 90% to 98% and the light-emitting material may account for 2% to 10%. Further, the host material may include one material or two materials, where a ratio of the two host materials in the host material can be 100:0 to 1:99; or the ratio can be 80:20 to 20:80; or the ratio can be 60:40 to 40:60. Characteristics of light-emitting devices prepared in examples are tested using conventional equipment in the art by a method well-known to those skilled in the art. As those skilled in the art are aware of the use of the above-mentioned equipment, test methods and other related contents, the inherent data of the sample can be obtained with certainty and without influence, so the above related contents are not further repeated in this patent. Compounds used in the present disclosure, such as the third compound, the first compound and the second compound, are easily obtained by those skilled in the art. For example, these compounds are commercially available or can be obtained with reference to the preparation method in the related art, which is not repeated herein.

In the preparation of a device, when two or more than two host materials together with a luminescent material are to be co-deposited to form an emissive layer, this may be implemented through either of the following manners: (1) co-depositing the two or more than two host materials and the luminescent material from respective evaporation sources, to 46 form the emissive layer; or (2) pre-mixing the two or more than two host materials to obtain a pre-mixture, and co-depositing the pre-mixture from an evaporation source with the luminescent material from another evaporation source, to form the emissive layer. The latter pre-mixing method further save evaporation sources. In the present disclosure, it may be 5 implemented through either of the following manners: (1) co-depositing the first host material, the second host material and the luminescent material from respective evaporation sources, to form the emissive layer; or (2) pre-mixing the first host material and the second host material to obtain a pre-mixture, and co-depositing the pre-mixture from an evaporation source with the luminescent material from another evaporation source, to form the emissive layer.

The electrochemical properties of compounds, that is, the highest occupied molecular orbital energy level and the lowest unoccupied molecular orbital energy level, were determined by cyclic voltammetry (CV). The test was conducted using an electrochemical workstation produced by WUHAN CORRTEST INSTRUMENTS CORP., LTD., Model No. CorrTest CS120, and using a three-electrode working system where a platinum disk electrode served as a working electrode, an $Ag/AgNO_3$ electrode served as a reference electrode, and a platinum wire electrode served as an auxiliary electrode. Anhydrous DMF was used as a solvent, 0.1 mol/L tetrabutylammonium hexafluorophosphate was used as a supporting electrolyte, a compound to be tested was prepared into a solution of $10^{-3}$ mol/L, and nitrogen was introduced into the solution for 10 min for oxygen removal before the test. The parameters of the instrument were set as follows: the scan rate was 100 mV/s, the potential interval was 0.5 mV, the oxidation potential test window was 0 V to 1 V, and the reduction potential test window was −1 V to −2.9 V.

The HOMO energy levels and LUMO energy levels of some of the compounds disclosed in the present application are shown in the following table.

| Compound | HOMO energy level | LUMO energy level |
|---|---|---|
| G-1 | −5.13 | −2.16 |
| G-2 | −5.17 | −2.29 |
| GD-1 | −5.17 | −2.41 |
| GD-2 | −5.16 | −2.42 |
| GD-3 | −5.20 | −2.36 |
| GD-4 | −5.21 | −2.67 |
| GD-5 | −5.21 | −2.47 |

-continued

| Compound | HOMO energy level | LUMO energy level |
|---|---|---|
| GD-6 | −5.20 | −2.46 |
| GD-7 | −5.20 | −2.42 |
| GD-8 | −5.20 | −2.42 |
| GD-9 | −5.19 | −2.43 |
| GD-10 | −5.21 | −2.40 |
| GD-11 | −5.21 | −2.37 |
| GD-12 | −5.23 | −2.42 |
| GD-13 | −5.22 | −2.41 |
| GD-14 | −5.22 | −2.41 |
| GD-15 | −5.21 | −2.40 |
| GD-16 | −5.21 | −2.43 |
| GH | −5.61 | −2.81 |
| HB | −5.64 | −2.71 |
| A-2 | / | −2.89 |
| A-12 | / | −2.91 |
| A-13 | / | −2.91 |
| A-14 | / | −2.91 |
| A-18 | / | −3.04 |
| A-20 | / | −2.88 |
| A-21 | / | −2.85 |
| A-22 | / | −2.86 |
| A-23 | / | −2.85 |
| A-25 | / | −2.87 |
| A-26 | / | −2.87 |
| A-28 | / | −2.87 |
| A-29 | / | −2.86 |
| A-30 | / | −2.86 |
| A-31 | / | −2.87 |
| A-32 | / | −2.86 |
| A-33 | / | −2.88 |
| A-34 | / | −2.87 |
| A-36 | / | −2.87 |
| A-37 | / | −2.89 |
| A-47 | / | −2.90 |
| A-49 | / | −2.94 |
| A-50 | / | −2.86 |
| A-53 | / | −2.90 |
| A-54 | / | −2.90 |
| A-43 | / | −2.92 |
| A-44 | / | −2.88 |
| A-45 | / | −2.90 |
| A-55 | / | −2.88 |
| A-56 | / | −2.87 |
| A-57 | / | −2.88 |
| B-1 | −5.46 | / |
| B-3 | −5.42 | / |
| B-4 | −5.40 | / |
| B-5 | −5.41 | / |
| B-7 | −5.45 | / |
| B-8 | −5.39 | / |
| B-19 | −5.40 | / |
| B-20 | −5.40 | / |
| B-31 | −5.41 | / |
| B-34 | −5.45 | / |
| B-35 | −5.41 | / |
| B-36 | −5.42 | / |
| B-37 | −5.41 | / |
| B-38 | −5.43 | / |
| B-39 | −5.41 | / |

DEVICE EXAMPLE

Device Example 1-1

First, a glass substrate having an indium tin oxide (ITO) anode with a thickness of 80 nm was cleaned and then treated with oxygen plasma and UV ozone. After the treatment, the substrate was dried in a glovebox to remove moisture. Then, the substrate was mounted on a substrate holder and placed in a vacuum chamber. Organic layers specified below were sequentially deposited through vacuum thermal evaporation on the ITO anode at a rate of 0.2 to 2 Angstroms per second at a vacuum degree of about $10^{-8}$ torr. Compound HI was used as a hole injection layer (HIL).

Compound HT was used as a hole transport layer (HTL). Compound B-7 was used as an electron blocking layer (EBL). Metal Complex GD-14 of the present disclosure was doped in Compound A-47 and Compound B-7 and co-deposited as an emissive layer (EML). On the EML, Compound HB was used as a hole blocking layer (HBL). On the HBL, Compound ET and 8-hydroxyquinolinolato-lithium (Liq) were co-deposited as an electron transport layer (ETL). Finally, 8-hydroxyquinolinolato-lithium (Liq) was deposited as an electron injection layer with a thickness of 1 nm, and Al was deposited as a cathode with a thickness of 120 nm. The device was transferred back to the glovebox and encapsulated with a glass lid to complete the device.

Device Example 1-2

The implementation mode in Device Example 1-2 was the same as that in Device Example 1-1, except that Compound A-47 of the present disclosure in the emissive layer was replaced with Compound A-37 of the present disclosure.

Device Example 1-3

The implementation mode in Device Example 1-3 was the same as that in Device Example 1-1, except that Compound A-47 of the present disclosure in the emissive layer was replaced with Compound A-13 of the present disclosure.

Device Example 1-4

The implementation mode in Device Example 1-4 was the same as that in Device Example 1-1, except that Compound A-47 of the present disclosure in the emissive layer was replaced with Compound A-2 of the present disclosure.

Device Example 1-5

The implementation mode in Device Example 1-5 was the same as that in Device Example 1-1, except that Compound A-47 of the present disclosure in the emissive layer was replaced with Compound A-29 of the present disclosure.

Device Example 1-6

The implementation mode in Device Example 1-6 was the same as that in Device Example 1-1, except that Compound A-47 of the present disclosure in the emissive layer was replaced with Compound A-49 of the present disclosure.

Device Example 1-7

The implementation mode in Device Example 1-7 was the same as that in Device Example 1-1, except that Compound A-47 of the present disclosure in the emissive layer was replaced with Compound A-50 of the present disclosure.

Device Comparative Example 1-1

The implementation mode in Device Comparative Example 1-1 was the same as that in Device Example 1-1, except that Compound A-47 of the present disclosure in the emissive layer was replaced with Compound GH.

Device Comparative Example 1-2

The implementation mode in Device Comparative Example 1-2 was the same as that in Device Example 1-1, except that Compound A-47 of the present disclosure in the emissive layer was replaced with Compound HB.

Detailed structures and thicknesses of layers of the devices are shown in Table 1. A layer using more than one material is obtained by doping different compounds at a weight ratio as recorded.

The structures of the materials used in the devices are shown as follows:

Compound HI

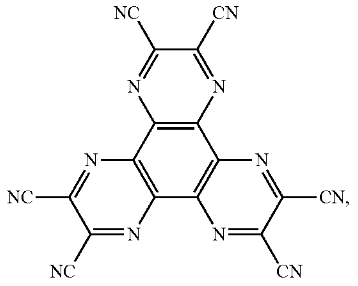

TABLE 1

| Device structures in Examples 1-1 to 1-7 and Comparative Examples 1-1 to 1-2 | | | | | | |
|---|---|---|---|---|---|---|
| Device ID | HIL | HTL | EBL | EML | HBL | ETL |
| Example 1-1 | Compound HI (100 Å) | Compound HT (350 Å) | Compound B-7 (50 Å) | Compound B-7:Compound A-47:Compound GD-14 (71:23:6) (400 Å) | Compound HB (50 Å) | Compound ET:Liq (40:60) (350 Å) |
| Example 1-2 | Compound HI (100 Å) | Compound HT (350 Å) | Compound B-7 (50 Å) | Compound B-7:Compound A-37:Compound GD-14 (71:23:6) (400 Å) | Compound HB (50 Å) | Compound ET:Liq (40:60) (350 Å) |
| Example 1-3 | Compound HI (100 Å) | Compound HT (350 Å) | Compound B-7 (50 Å) | Compound B-7:Compound A-13:Compound GD-14 (71:23:6) (400 Å) | Compound HB (50 Å) | Compound ET:Liq (40:60) (350 Å) |
| Example 1-4 | Compound HI (100 Å) | Compound HT (350 Å) | Compound B-7 (50 Å) | Compound B-7:Compound A-2:Compound GD-14 (71:23:6) (400 Å) | Compound HB (50 Å) | Compound ET:Liq (40:60) (350 Å) |
| Example 1-5 | Compound HI (100 Å) | Compound HT (350 Å) | Compound B-7 (50 Å) | Compound B-7:Compound A-29:Compound GD-14 (71:23:6) (400 Å) | Compound HB (50 Å) | Compound ET:Liq (40:60) (350 Å) |
| Example 1-6 | Compound HI (100 Å) | Compound HT (350 Å) | Compound B-7 (50 Å) | CompoundB-7:Compound A-49:Compound GD-14 (71:23:6) (400 Å) | Compound HB (50 Å) | Compound ET:Liq (40:60) (350 Å) |
| Example 1-7 | Compound HI (100 Å) | Compound HT (350 Å) | Compound B-7 (50 Å) | Compound B-7:Compound A-50:Compound GD-14 (71:23:6) (400 Å) | Compound HB (50 Å) | Compound ET:Liq (40:60) (350 Å) |
| Comparative Example 1-1 | Compound HI (100 Å) | Compound HT (350 Å) | Compound B-7 (50 Å) | Compound B-7:Compound GH:Compound GD-14 (71:23:6) (400 Å) | Compound HB (50 Å) | Compound ET:Liq (40:60) (350 Å) |
| Comparative Example 1-2 | Compound HI (100 Å) | Compound HT (350 Å) | Compound B-7 (50 Å) | CompoundB-7:Compound HB:Compound GD-14 (71:23:6) (400 Å) | Compound HB (50 Å) | Compound ET:Liq (40:60) (350 Å) |

-continued
Compound HT
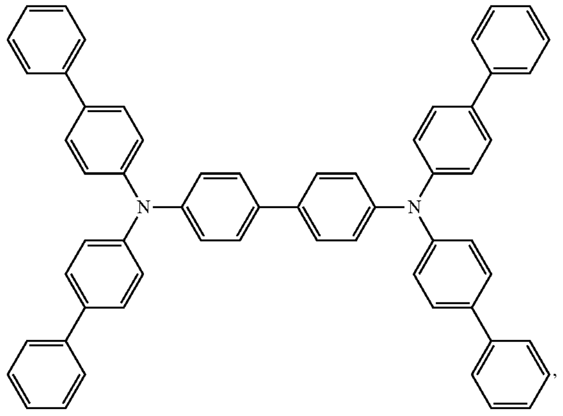
Compound HB
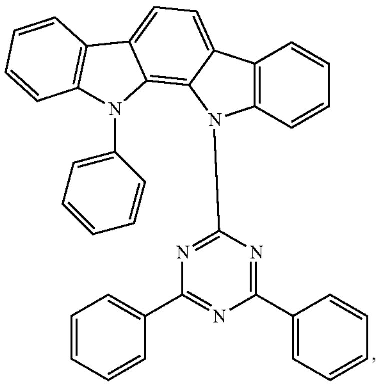
B-7
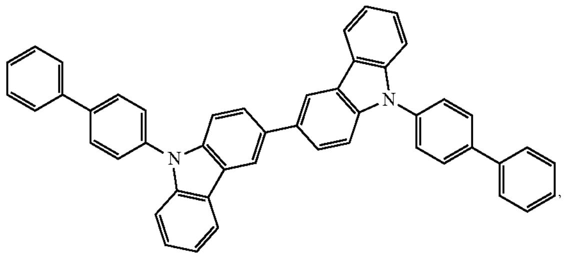
Compound ET
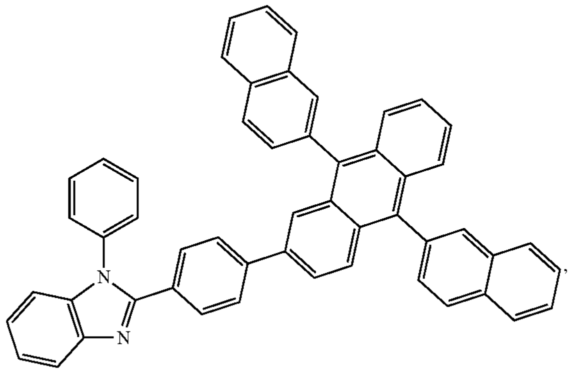
-continued
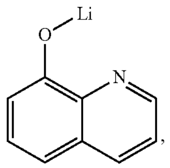
Liq
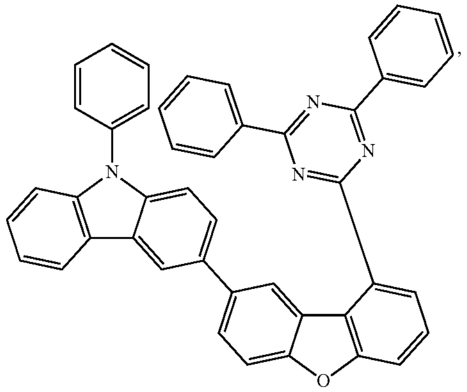
GH
A-2
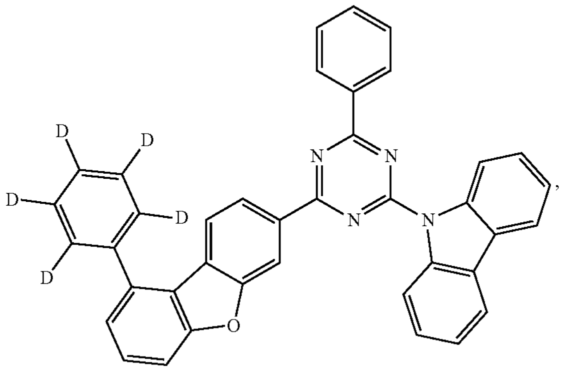
A-13
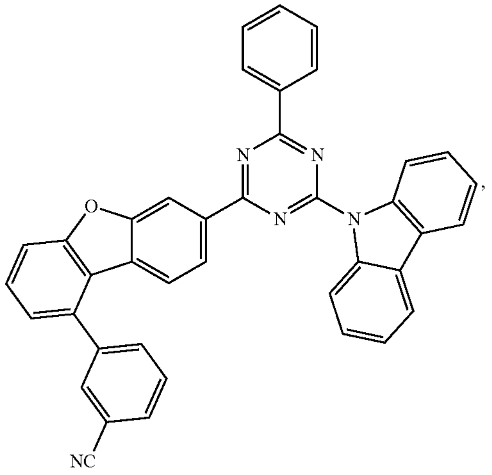

-continued
A-29
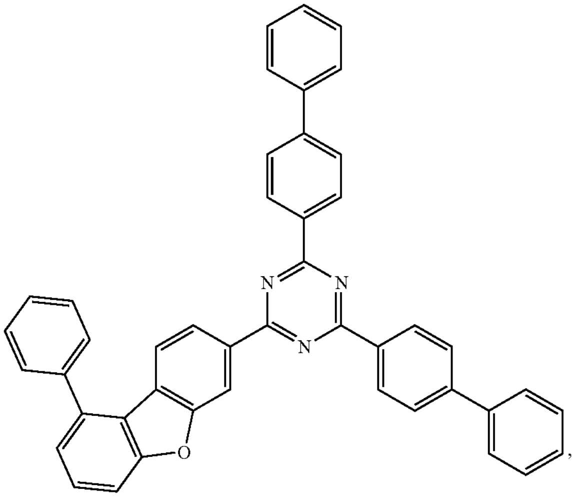
,
A-37
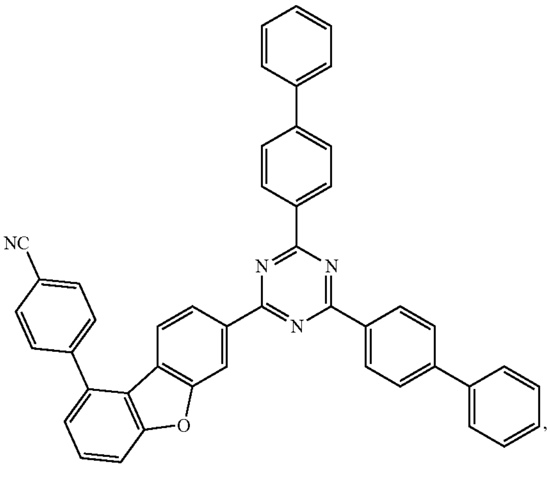
,
A-47
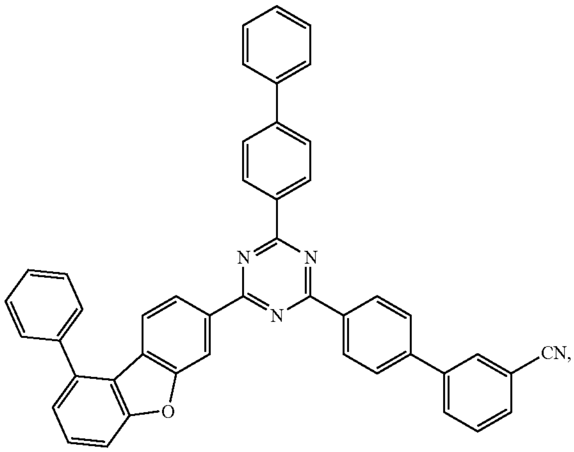
CN,
-continued
A-49
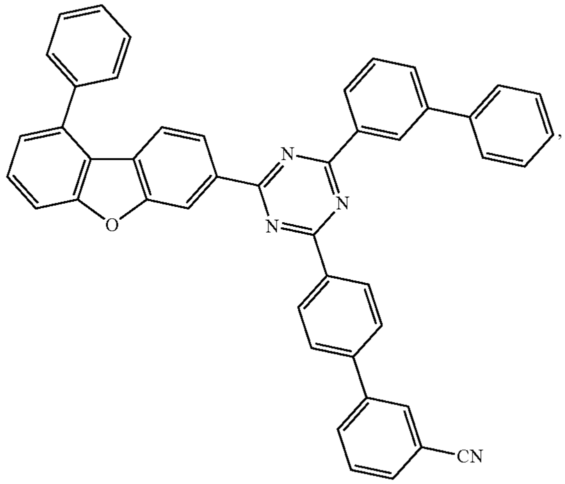
,
A-50
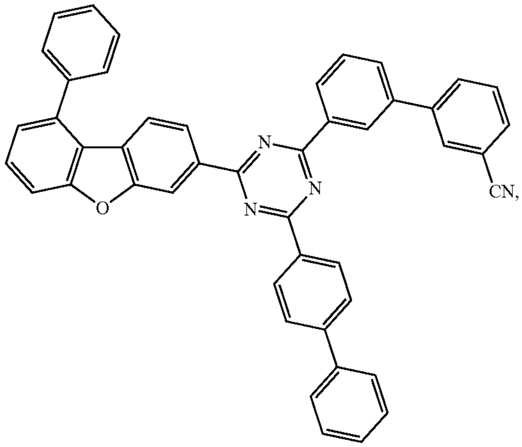
CN, and
GD-14
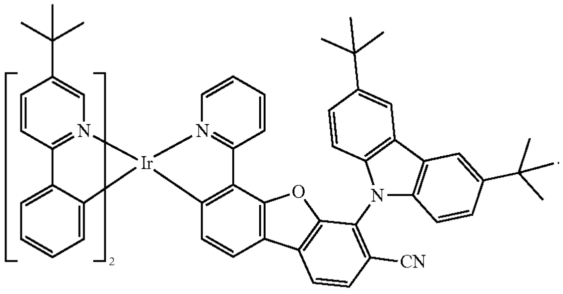
.
IVL characteristics of the devices were measured. CIE data, the maximum emission wavelength $\lambda_{max}$, the full width at half maximum (FWHM), and the external quantum efficiency (EQE) of the devices were measured at 15 mA/$cm^2$, and these data were recorded and presented in Table 2.

TABLE 2

Device data of Examples 1 to 1-7 and Comparative Examples 1-1 to 1-2

| Device ID | CIE (x, y) | $\lambda_{max}$ (nm) | FWHM (nm) | EQE (%) |
|---|---|---|---|---|
| Example 1-1 | (0.343, 0.633) | 531 | 38.1 | 24.92 |
| Example 1-2 | (0.340, 0.636) | 531 | 36.8 | 23.97 |
| Example 1-3 | (0.337, 0.638) | 531 | 35.9 | 23.73 |
| Example 1-4 | (0.337, 0.638) | 530 | 36.3 | 23.23 |
| Example 1-5 | (0.343, 0.634) | 531 | 37.7 | 24.60 |
| Example 1-6 | (0.345, 0.632) | 531 | 38.5 | 25.16 |
| Example 1-7 | (0.344, 0.633) | 531 | 38.2 | 25.37 |
| Comparative Example 1-1 | (0.335, 0.639) | 530 | 35.9 | 21.45 |
| Comparative Example 1-2 | (0.334, 0.639) | 530 | 35.5 | 18.95 |

Discussion

As can be seen from the device performance of the examples and the comparative examples shown in Table 2, in a case where Examples 1-1 to 1-7 and Comparative Example 1-1 all used the first compound GD-14 (whose HOMO energy level was −5.22 eV and LUMO energy level was −2.41 eV) of the present disclosure as the light-emitting material, Examples 1-1 to 1-7 used the second compounds A-47, A-37, A-13, A-2, A-29, A-49 and A-50 having the specific LUMO energy levels (the LUMO levels were −2.90 eV, −2.89, −2.91, −2.89, −2.86, −2.94 and −2.86, respectively) of the present disclosure while Comparative Example used Compound GH (whose LUMO level was −2.81 eV), the devices in Examples 1-1 to 1-7 and the device in Comparative Example 1-1 had approximately the same emission wavelength and full width at half maximum, but the external quantum efficiency of the devices in Examples 1-1 to 1-7 was increased by 16.2%, 11.8%, 10.6%, 8.3%, 14.7%, 17.3% and 18.3%, respectively, compared with the device in Comparative Example 1-1.

Similarly, in a case where Examples 1-1 to 1-7 and Comparative Example 1-2 all used the first compound GD-14 of the present disclosure as the light-emitting material, Examples 1-1 to 1-7 used the second compounds having specific LUMO energy levels of the present disclosure while Comparative Example 1-2 used Compound HB (whose LUMO level was −2.71 eV), the devices in Examples 1-1 to 1-7 and the device in Comparative Example 1-2 had approximately the same emission wavelength and full width at half maximum, but the external quantum efficiency of the devices in Examples 1-1 to 1-7 was increased by 31.5%, 26.5%, 25.2%, 22.6%, 29.8%, 32.8% and 33.9%, respectively, compared with the device in Comparative Example 1-2.

As can be seen from the above, the combination in the present disclosure of the first compound having the structure of Formula 1-1 and the specific HOMO/LUMO energy levels and the second compound having the structure of Formula 2-1 and the specific LUMO energy level can greatly optimize the comprehensive performance of the device and make the device show much superior performance. Therefore, the organic electroluminescent device comprising both the specific first compound and the specific second compound of the present disclosure has great advantages in device performance.

Device Example 2-1

The implementation mode in Device Example 2-1 was the same as that in Device Example 1-1, except that Compound GD-14 of the present disclosure in the emissive layer was replaced with Compound GD-13 of the present disclosure.

Device Example 2-2

The implementation mode in Device Example 2-2 was the same as that in Device Example 2-1, except that Compound A-47 of the present disclosure in the emissive layer was replaced with Compound A-37 of the present disclosure.

Device Example 2-3

The implementation mode in Device Example 2-3 was the same as that in Device Example 2-1, except that Compound A-47 of the present disclosure in the emissive layer was replaced with Compound A-13 of the present disclosure.

Device Example 2-4

The implementation mode in Device Example 2-4 was the same as that in Device Example 2-1, except that Compound A-47 of the present disclosure in the emissive layer was replaced with Compound A-29 of the present disclosure.

Device Comparative Example 2-1

The implementation mode in Device Comparative Example 2-1 was the same as that in Device Example 2-1, except that Compound A-47 of the present disclosure in the emissive layer was replaced with Compound GH.

Detailed structures and thicknesses of layers of the devices are shown in Table 3. A layer using more than one material is obtained by doping different compounds at a weight ratio as recorded.

TABLE 3

Device structures in Examples 2-1 to 2-4 and Comparative Example 2-1

| Device ID | HIL | HTL | EBL | EML | HBL | ETL |
|---|---|---|---|---|---|---|
| Example 2-1 | Compound HI (100 Å) | Compound HT (350 Å) | Compound B-7 (50 Å) | Compound B-7:Compound A-47:Compound GD-13 (71:23:6) (400 Å) | Compound HB (50 Å) | Compound ET:Liq (40:60) (350 Å) |
| Example 2-2 | Compound HI (100 Å) | Compound HT (350 Å) | Compound B-7 (50 Å) | Compound B-7:Compound A-37:Compound GD-13 (71:23:6) (400 Å) | Compound HB (50 Å) | Compound ET:Liq (40:60) (350 Å) |

TABLE 3-continued

Device structures in Examples 2-1 to 2-4 and Comparative Example 2-1

| Device ID | HIL | HTL | EBL | EML | HBL | ETL |
|---|---|---|---|---|---|---|
| Example 2-3 | Compound HI (100 Å) | Compound HT (350 Å) | Compound B-7 (50 Å) | Compound B-7:Compound A-13:Compound GD-13 (71:23:6) (400 Å) | Compound HB (50 Å) | Compound ET:Liq (40:60) (350 Å) |
| Example 2-4 | Compound HI (100 Å) | Compound HT (350 Å) | Compound B-7 (50 Å) | Compound B-7:Compound A-29:Compound GD-13 (71:23:6) (400 Å) | Compound HB (50 Å) | Compound ET:Liq (40:60) (350 Å) |
| Comparative Example 2-1 | Compound HI (100 Å) | Compound HT (350 Å) | Compound B-7 (50 Å) | Compound B-7:Compound GH:Compound GD-13 (71:23:6) (400 Å) | Compound HB (50 Å) | Compound ET:Liq (40:60) (350 Å) |

The structure of the new material used in the device is as follows:

GD-13

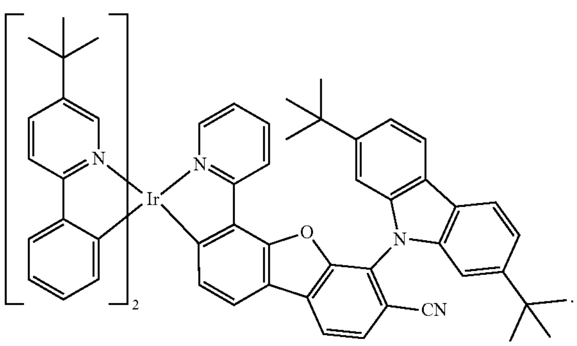

IVL characteristics of the devices were measured. CIE data, the maximum emission wavelength $\lambda_{max}$, the full width at half maximum (FWHM), and the external quantum efficiency (EQE) of the devices were measured at 15 mA/cm$^2$, and these data were recorded and presented in Table 4.

TABLE 4

Device data of Examples 2-1 to 2-4 and Comparative Example 2-1

| Device ID | CIE (x, y) | $\lambda_{max}$ (nm) | FWHM (nm) | EQE (%) |
|---|---|---|---|---|
| Example 2-1 | (0.339, 0.637) | 531 | 33.8 | 24.81 |
| Example 2-2 | (0.333, 0.641) | 531 | 32.7 | 24.35 |
| Example 2-3 | (0.330, 0.643) | 530 | 32.2 | 23.37 |
| Example 2-4 | (0.335, 0.639) | 530 | 32.8 | 25.15 |
| Comparative Example 2-1 | (0.329, 0.644) | 530 | 32.3 | 21.55 |

Discussion

As can be seen from the device performance of the examples and the comparative example shown in Table 4, in a case where Examples 2-1 to 2-4 and Comparative Example 2-1 all used the first compound GD-13 (whose HOMO energy level was −5.22 eV and LUMO energy level was −2.41 eV) of the present disclosure as the light-emitting material, Examples 2-1 to 2-4 used the second compounds having specific LUMO energy levels of the present disclosure while Comparative Example 2-1 used Compound GH, the devices in Examples 2-1 to 2-4 and the device in Comparative Example 2-1 had approximately the same emission wavelength and full width at half maximum, but the external quantum efficiency of the devices in Examples 2-1 to 2-4 was increased by 15.1%, 13.0%, 8.4% and 16.7%, respectively, compared with the device in Comparative Example 2-1.

As can be seen from the above, the combination in the present disclosure of the first compound having the structure of Formula 1-1 and the specific HOMO/LUMO energy levels and the second compound having the structure of Formula 2-1 and the specific LUMO energy level can greatly optimize the comprehensive performance of the device and make the device show much superior performance. Therefore, the organic electroluminescent device comprising both the specific first compound and the specific second compound of the present disclosure has great advantages in device performance.

Device Example 3-1

The implementation mode in Device Example 3-1 was the same as that in Device Example 1-1, except that Compound GD-14 of the present disclosure in the emissive layer was replaced with Compound GD-15 of the present disclosure and that Compound B-7:Compound A-47:Compound GD-15 was equal to 72:24:4.

Device Example 3-2

The implementation mode in Device Example 3-2 was the same as that in Device Example 3-1, except that Compound A-47 of the present disclosure in the emissive layer was replaced with Compound A-37 of the present disclosure.

Device Example 3-3

The implementation mode in Device Example 3-3 was the same as that in Device Example 3-1, except that Compound A-47 of the present disclosure in the emissive layer was replaced with Compound A-13 of the present disclosure.

Device Example 3-4

The implementation mode in Device Example 3-4 was the same as that in Device Example 3-1, except that Compound A-47 of the present disclosure in the emissive layer was replaced with Compound A-29 of the present disclosure.

Device Example 3-5

The implementation mode in Device Example 3-5 was the same as that in Device Example 3-1, except that Compound A-47 of the present disclosure in the emissive layer was replaced with Compound A-45 of the present disclosure.

Device Example 3-6

The implementation mode in Device Example 3-6 was the same as that in Device Example 3-1, except that Compound A-47 of the present disclosure in the emissive layer was replaced with Compound A-57 of the present disclosure.

Device Comparative Example 3-1

The implementation mode in Device Comparative Example 3-1 was the same as that in Device Example 3-1, except that Compound A-47 of the present disclosure in the emissive layer was replaced with Compound GH.

Detailed structures and thicknesses of layers of the devices are shown in Table 5. A layer using more than one material is obtained by doping different compounds at a weight ratio as recorded.

TABLE 5

Device structures in Examples 3-1 to 3-6 and Comparative Example 3-1

| Device ID | HIL | HTL | EBL | EML | HBL | ETL |
|---|---|---|---|---|---|---|
| Example 3-1 | Compound HI (100 Å) | Compound HT (350 Å) | Compound B-7 (50 Å) | Compound B-7:Compound A-47:Compound GD-15 (72:24:4) (400 Å) | Compound HB (50 Å) | Compound ET:Liq (40:60) (350 Å) |
| Example 3-2 | Compound HI (100 Å) | Compound HT (350 Å) | Compound B-7 (50 Å) | Compound B-7:Compound A-37:Compound GD-15 (72:24:4) (400 Å) | Compound HB (50 Å) | Compound ET:Liq (40:60) (350 Å) |
| Example 3-3 | Compound HI (100 Å) | Compound HT (350 Å) | Compound B-7 (50 Å) | Compound B-7:Compound A-13:Compound GD-15 (72:24:4) (400 Å) | Compound HB (50 Å) | Compound ET:Liq (40:60) (350 Å) |
| Example 3-4 | Compound HI (100 Å) | Compound HT (350 Å) | Compound B-7 (50 Å) | Compound B-7:Compound A-29:Compound GD-15 (72:24:4) (400 Å) | Compound HB (50 Å) | Compound ET:Liq (40:60) (350 Å) |
| Example 3-5 | Compound HI (100 Å) | Compound HT (350 Å) | Compound B-7 (50 Å) | Compound B-7:Compound A-45:Compound GD-15 (72:24:4) (400 Å) | Compound HB (50 Å) | Compound ET:Liq (40:60) (350 Å) |
| Example 3-6 | Compound HI (100 Å) | Compound HT (350 Å) | Compound B-7 (50 Å) | Compound B-7:Compound A-57:Compound GD-15 (72:24:4) (400 Å) | Compound HB (50 Å) | Compound ET:Liq (40:60) (350 Å) |
| Comparative Example 3-1 | Compound HI (100 Å) | Compound HT (350 Å) | Compound B-7 (50 Å) | Compound B-7:Compound GH:Compound GD-15 (72:24:4) (400 Å) | Compound HB (50 Å) | Compound ET:Liq (40:60) (350 Å) |

The structures of the new materials used in the device are as follows:

GD-15

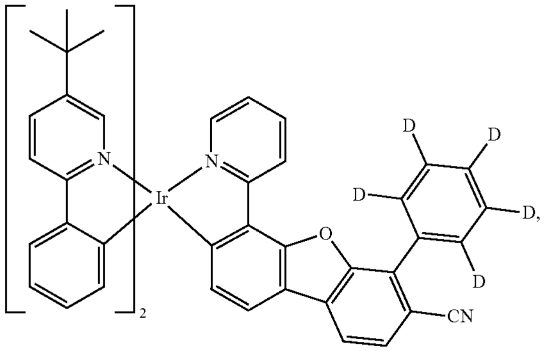

A-45

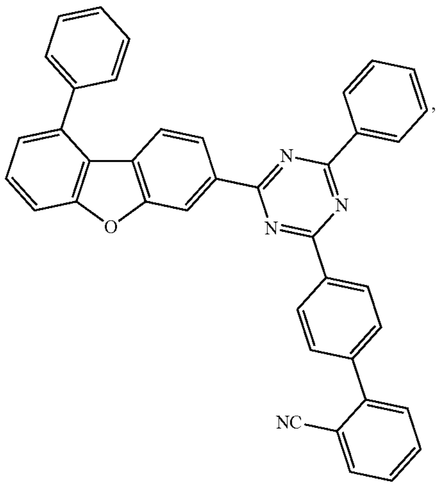

and

A-57

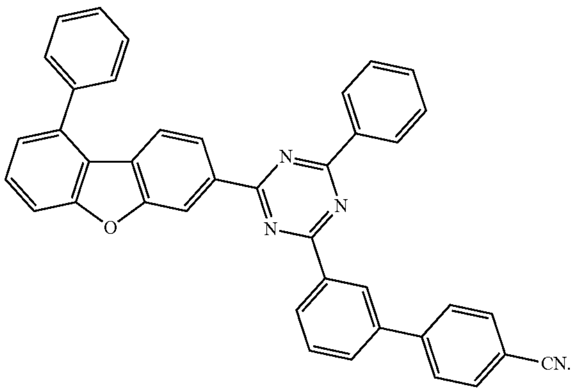

IVL characteristics of the devices were measured. CIE data, the maximum emission wavelength $\lambda_{max}$, the full width at half maximum (FWHM), and the external quantum efficiency (EQE) of the devices were measured at 15 mA/cm$^2$, and these data were recorded and presented in Table 6.

TABLE 6

Device data of Examples 3-1 to 3-6 and Comparative Example 3-1

| Device ID | CIE (x, y) | $\lambda_{max}$ (nm) | FWHM (nm) | EQE (%) |
|---|---|---|---|---|
| Example 3-1 | (0.343, 0.633) | 531 | 36.8 | 23.68 |
| Example 3-2 | (0.336, 0.639) | 530 | 34.5 | 23.40 |
| Example 3-3 | (0.339, 0.636) | 530 | 36.2 | 23.92 |
| Example 3-4 | (0.341, 0.634) | 530 | 36.2 | 24.02 |
| Example 3-5 | (0.345, 0.632) | 530 | 35.2 | 23.72 |
| Example 3-6 | (0.345, 0.632) | 530 | 35.4 | 23.90 |
| Comparative Example 3-1 | (0.333, 0.640) | 530 | 34.5 | 21.40 |

Discussion

As can be seen from the device performance of the examples and the comparative example shown in Table 6, in a case where Examples 3-1 to 3-6 and Comparative Example 3-1 all used the first compound GD-15 (whose HOMO energy level was −5.21 eV and LUMO energy level was −2.40 eV) of the present disclosure as the light-emitting material, Examples 3-1 to 3-6 used the second compounds having specific LUMO energy levels of the present disclosure while Comparative Example 3-1 used Compound GH, the devices in Examples 3-1 to 3-6 and the device in Comparative Example 3-1 had approximately the same emission wavelength and full width at half maximum, but the external quantum efficiency of the devices in Examples 3-1 to 3-6 was increased by 10.7%, 9.4%, 11.8%, 12.2%, 10.8% and 11.75%, respectively, compared with the device in Comparative Example 3-1.

As can be seen from the above, the combination in the present disclosure of the first compound having the structure of Formula 1-1 and the specific HOMO/LUMO energy levels and the second compound having the structure of Formula 2-1 and the specific LUMO energy level can greatly optimize the comprehensive performance of the device and make the device show much superior performance. Therefore, the organic electroluminescent device comprising both the specific first compound and the specific second compound of the present disclosure has great advantages in device performance.

Device Example 4-1

The implementation mode in Device Example 4-1 was the same as that in Device Example 1-1, except that Compound GD-14 of the present disclosure in the emissive layer was replaced with Compound GD-5 of the present disclosure.

Device Example 4-2

The implementation mode in Device Example 4-2 was the same as that in Device Example 4-1, except that Compound A-47 of the present disclosure in the emissive layer was replaced with Compound A-37 of the present disclosure.

Device Example 4-3

The implementation mode in Device Example 4-3 was the same as that in Device Example 4-1, except that Compound A-47 of the present disclosure in the emissive layer was replaced with Compound A-13 of the present disclosure.

Device Example 4-4

The implementation mode in Device Example 4-4 was the same as that in Device Example 4-1, except that Compound A-47 of the present disclosure in the emissive layer was replaced with Compound A-2 of the present disclosure.

Device Example 4-5

The implementation mode in Device Example 4-5 was the same as that in Device Example 4-1, except that Compound A-47 of the present disclosure in the emissive layer was replaced with Compound A-29 of the present disclosure.

Device Example 4-6

The implementation mode in Device Example 4-6 was the same as that in Device Example 4-1, except that Compound A-47 of the present disclosure in the emissive layer was replaced with Compound A-49 of the present disclosure.

Device Example 4-7

The implementation mode in Device Example 4-7 was the same as that in Device Example 4-1, except that Compound A-47 of the present disclosure in the emissive layer was replaced with Compound A-50 of the present disclosure.

Device Comparative Example 4-1

The implementation mode in Device Comparative Example 4-1 was the same as that in Device Example 4-1, except that Compound A-47 of the present disclosure in the emissive layer was replaced with Compound GH.

Device Comparative Example 4-2

The implementation mode in Device Comparative Example 4-2 was the same as that in Device Example 4-1, except that Compound A-47 of the present disclosure in the emissive layer was replaced with Compound HB.

Detailed structures and thicknesses of layers of the devices are shown in Table 7. A layer using more than one material is obtained by doping different compounds at a weight ratio as recorded.

TABLE 7

Device structures in Examples 4-1 to 4-7 and Comparative Examples 4-1 to 4-2

| Device ID | HIL | HTL | EBL | EML | HBL | ETL |
|---|---|---|---|---|---|---|
| Example 4-1 | Compound HI (100 Å) | Compound HT (350 Å) | Compound B-7 (50 Å) | Compound B-7:Compound A-47:Compound GD-5 (71:23:6) (400 Å) | Compound HB (50 Å) | Compound ET:Liq (40:60) (350 Å) |
| Example 4-2 | Compound HI (100 Å) | Compound HT (350 Å) | Compound B-7 (50 Å) | Compound B-7:Compound A-37:Compound GD-5 (71:23:6) (400 Å) | Compound HB (50 Å) | Compound ET:Liq (40:60) (350 Å) |
| Example 4-3 | Compound HI (100 Å) | Compound HT (350 Å) | Compound B-7 (50 Å) | Compound B-7:Compound A-13:Compound GD-5 (71:23:6) (400 Å) | Compound HB (50 Å) | Compound ET:Liq (40:60) (350 Å) |
| Example 4-4 | Compound HI (100 Å) | Compound HT (350 Å) | Compound B-7 (50 Å) | Compound B-7:Compound A-2:Compound GD-5 (71:23:6) (400 Å) | Compound HB (50 Å) | Compound ET:Liq (40:60) (350 Å) |
| Example 4-5 | Compound HI (100 Å) | Compound HT (350 Å) | Compound B-7 (50 Å) | Compound B-7:Compound A-29:Compound GD-5 (71:23:6) (400 Å) | Compound HB (50 Å) | Compound ET:Liq (40:60) (350 Å) |
| Example 4-6 | Compound HI (100 Å) | Compound HT (350 Å) | Compound B-7 (50 Å) | Compound B-7:Compound A-49:Compound GD-5 (71:23:6) (400 Å) | Compound HB (50 Å) | Compound ET:Liq (40:60) (350 Å) |
| Example 4-7 | Compound HI (100 Å) | Compound HT (350 Å) | Compound B-7 (50 Å) | Compound B-7:Compound A-50:Compound GD-5 (71:23:6) (400 Å) | Compound HB (50 Å) | Compound ET:Liq (40:60) (350 Å) |
| Comparative Example 4-1 | Compound HI (100 Å) | Compound HT (350 Å) | Compound B-7 (50 Å) | Compound B-7:Compound GH:Compound GD-5 (71:23:6) (400 Å) | Compound HB (50 Å) | Compound ET:Liq (40:60) (350 Å) |

TABLE 7-continued

Device structures in Examples 4-1 to 4-7 and Comparative Examples 4-1 to 4-2

| Device ID | HIL | HTL | EBL | EML | HBL | ETL |
|---|---|---|---|---|---|---|
| Comparative Example 4-2 | Compound HI (100 Å) | Compound HT (350 Å) | Compound B-7 (50 Å) | Compound B-7:Compound HB:Compound GD-5 (71:23:6) (400 Å) | Compound HB (50 Å) | Compound ET:Liq (40:60) (350 Å) |

The structure of the new material used in the device is as follows:

GD-5

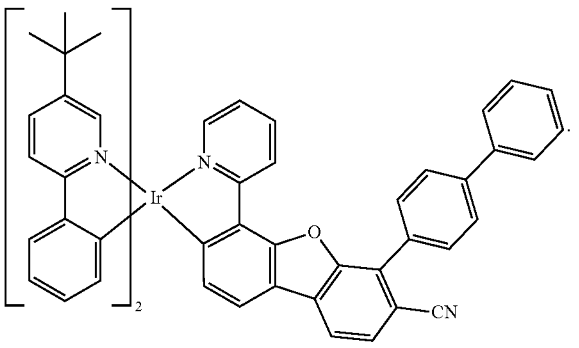

IVL characteristics of the devices were measured. CIE data, the maximum emission wavelength $\lambda_{max}$, the full width at half maximum (FWHM), and the external quantum efficiency (EQE) of the devices were measured at 15 mA/cm$^2$, and these data were recorded and presented in Table 8.

TABLE 8

Device data of Examples 4-1 to 4-7 and Comparative Examples 4-1 to 4-2

| Device ID | CIE (x, y) | $\lambda_{max}$ (nm) | FWHM (nm) | EQE (%) |
|---|---|---|---|---|
| Example 4-1 | (0.344, 0.633) | 531 | 35.4 | 24.57 |
| Example 4-2 | (0.342, 0.635) | 531 | 34.4 | 24.05 |
| Example 4-3 | (0.336, 0.639) | 531 | 33.6 | 23.67 |
| Example 4-4 | (0.339, 0.637) | 531 | 34.1 | 23.78 |
| Example 4-5 | (0.345, 0.632) | 531 | 35.4 | 24.37 |
| Example 4-6 | (0.344, 0.634) | 531 | 35.4 | 24.90 |
| Example 4-7 | (0.344, 0.633) | 531 | 35.3 | 25.07 |
| Comparative Example 4-1 | (0.339, 0.637) | 531 | 34.2 | 21.91 |
| Comparative Example 4-2 | (0.338, 0.638) | 531 | 34.0 | 20.74 |

Discussion

As can be seen from the device performance of the examples and the comparative examples shown in Table 8, in a case where Examples 4-1 to 4-7 and Comparative Example 4-1 all used the first compound GD-5 (whose HOMO energy level was −5.21 eV and LUMO energy level was −2.47 eV) of the present disclosure as the light-emitting material, Examples 4-1 to 4-7 used the second compounds having specific LUMO energy levels of the present disclosure while Comparative Example 4-1 used Compound GH, the devices in Examples 4-1 to 4-7 and the device in Comparative Example 4-1 had approximately the same emission wavelength and full width at half maximum, but the external quantum efficiency of the devices in Examples 4-1 to 4-7 was increased by 12.1%, 9.8%, 8.0%, 8.5%, 11.2%, 13.6% and 14.4%, respectively, compared with the device in Comparative Example 4-1.

Similarly, in a case where Examples 4-1 to 4-7 and Comparative Example 4-2 all used the first compound GD-5 of the present disclosure as the light-emitting material, Examples 4-1 to 4-7 used the second compounds having specific LUMO energy levels of the present disclosure while Comparative Example 4-2 used Compound HB, the devices in Examples 4-1 to 4-7 and the device in Comparative Example 4-2 had approximately the same emission wavelength and full width at half maximum, but the external quantum efficiency of the devices in Examples 4-1 to 4-7 was increased by 18.5%, 16.0%, 14.1%, 14.6%, 17.5%, 20.0% and 20.9%, respectively, compared with the device in Comparative Example 4-2.

As can be seen from the above, the combination in the present disclosure of the first compound having the structure of Formula 1-1 and the specific HOMO/LUMO energy levels and the second compound having the structure of Formula 2-1 and the specific LUMO energy level can greatly optimize the comprehensive performance of the device and make the device show much superior performance. Therefore, the organic electroluminescent device comprising both the specific first compound and the specific second compound of the present disclosure has great advantages in device performance.

Device Comparative Example 5-1

The implementation mode in Device Comparative Example 5-1 was the same as that in Device Example 1-1, except that Compound GD-14 of the present disclosure in the emissive layer was replaced with Compound G-1 and that Compound B-7:Compound A-47:Compound G-1 was equal to 69:23:8.

Device Comparative Example 5-2

The implementation mode in Device Comparative Example 5-2 was the same as that in Device Comparative Example 5-1, except that Compound A-47 of the present disclosure in the emissive layer was replaced with Compound A-37 of the present disclosure.

Device Comparative Example 5-3

The implementation mode in Device Comparative Example 5-3 was the same as that in Device Comparative Example 5-1, except that Compound A-47 of the present disclosure in the emissive layer was replaced with Compound A-13 of the present disclosure.

Device Comparative Example 5-4

The implementation mode in Device Comparative Example 5-4 was the same as that in Device Comparative Example 5-1, except that Compound A-47 of the present disclosure in the emissive layer was replaced with Compound A-2 of the present disclosure.

Device Comparative Example 5-5

The implementation mode in Device Comparative Example 5-5 was the same as that in Device Comparative Example 5-1, except that Compound A-47 of the present disclosure in the emissive layer was replaced with Compound A-29 of the present disclosure.

Device Comparative Example 5-6

The implementation mode in Device Comparative Example 5-6 was the same as that in Device Example 5-1, except that Compound A-47 of the present disclosure in the emissive layer was replaced with Compound GH.

Detailed structures and thicknesses of layers of the devices are shown in Table 9. A layer using more than one material is obtained by doping different compounds at a weight ratio as recorded.

TABLE 9

Device structures in Comparative Examples 5-1 to 5-6

| Device ID | HIL | HTL | EBL | EML | HBL | ETL |
|---|---|---|---|---|---|---|
| Comparative Example 5-1 | Compound HI (100 Å) | Compound HT (350 Å) | Compound B-7 (50 Å) | Compound B-7:Compound A-47:Metal Complex G-1 (69:23:8) (400 Å) | Compound HB (50 Å) | Compound ET:Liq (40:60) (350 Å) |
| Comparative Example 5-2 | Compound HI (100 Å) | Compound HT (350 Å) | Compound B-7 (50 Å) | Compound B-7:Compound A-37:Metal Complex G-1 (69:23:8) (400 Å) | Compound HB (50 Å) | Compound ET:Liq (40:60) (350 Å) |
| Comparative Example 5-3 | Compound HI (100 Å) | Compound HT (350 Å) | Compound B-7 (50 Å) | Compound B-7:Compound A-13:Metal Complex G-1 (69:23:8) (400 Å) | Compound HB (50 Å) | Compound ET:Liq (40:60) (350 Å) |
| Comparative Example 5-4 | Compound HI (100 Å) | Compound HT (350 Å) | Compound B-7 (50 Å) | Compound B-7:Compound A-2:Metal Complex G-1 (69:23:8) (400 Å) | Compound HB (50 Å) | Compound ET:Liq (40:60) (350 Å) |
| Comparative Example 5-5 | Compound HI (100 Å) | Compound HT (350 Å) | Compound B-7 (50 Å) | Compound B-7:Compound A-29:Metal Complex G-1 (69:23:8) (400 Å) | Compound HB (50 Å) | Compound ET:Liq (40:60) (350 Å) |
| Comparative Example 5-6 | Compound HI (100 Å) | Compound HT (350 Å) | Compound B-7 (50 Å) | Compound B-7:Compound GH:Metal Complex G-1 (69:23:8) (400 Å) | Compound HB (50 Å) | Compound ET:Liq (40:60) (350 Å) |

The structure of the new material used in the device is as follows:

G-1

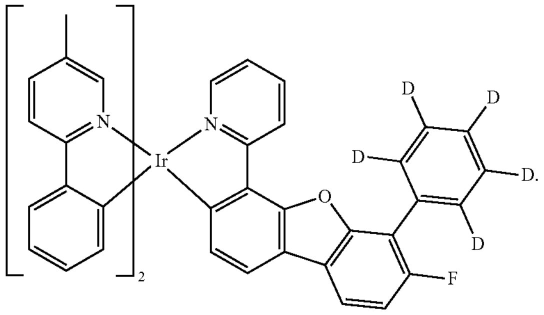

IVL characteristics of the devices were measured. CIE data, the maximum emission wavelength $\lambda_{max}$, the full width at half maximum (FWHM), and the external quantum efficiency (EQE) of the devices were measured at 15 mA/cm$^2$, and these data were recorded and presented in Table 10.

TABLE 10

Device data of Comparative Examples 5-1 to 5-6

| Device ID | CIE (x, y) | $\lambda_{max}$ (nm) | FWHM (nm) | EQE (%) |
|---|---|---|---|---|
| Comparative Example 5-1 | (0.361, 0.616) | 530 | 62.6 | 20.07 |
| Comparative Example 5-2 | (0.356, 0.619) | 530 | 61.1 | 19.97 |
| Comparative Example 5-3 | (0.350, 0.624) | 530 | 59.5 | 20.42 |
| Comparative Example 5-4 | (0.347, 0.626) | 529 | 58.5 | 20.76 |
| Comparative Example 5-5 | (0.359, 0.618) | 531 | 62.1 | 21.42 |
| Comparative Example 5-6 | (0.346, 0.627) | 528 | 59.0 | 21.11 |

Discussion

As can be seen from the device performance of the examples and comparative example shown in Table 10, in a case where Examples 5-1 to 5-5 and Comparative Example 5-6 all used the metal complex G-1 (whose HOMO energy level was −5.13 eV and LUMO energy level was −2.16 eV) which did not belong to the present disclosure but has the structure of Formula 1-1 as the light-emitting material, Examples 5-1 to 5-5 used the second compounds having specific LUMO energy levels of the present disclosure while Comparative Example 5-6 used Compound GH, the devices in Examples 5-1 to 5-5 and the device in Comparative Example 5-6 had approximately the same emission wavelength and full width at half maximum, but the external quantum efficiency of the devices in Examples 5-1 to 5-5 was decreased to varying degrees (by 1.6% to 5.4%) or only increased by 1.5%, which was quite different from the comparison of the above-mentioned examples and comparative examples which all used the first compound having the specific energy level of the present disclosure as the light-emitting material.

As can be seen from the above, the combination in the present disclosure of the first compound having the structure of Formula 1-1 and the specific HOMO/LUMO energy levels and the second compound having the structure of Formula 2-1 and the specific LUMO energy level can greatly optimize the comprehensive performance of the device and make the device show much superior performance. Therefore, the organic electroluminescent device comprising both the specific first compound and the specific second compound of the present disclosure has great advantages in device performance.

Device Comparative Example 6-1

The implementation mode in Device Comparative Example 6-1 was the same as that in Device Example 1-3, except that Compound GD-14 of the present disclosure in the emissive layer was replaced with Compound G-2.

Device Comparative Example 6-2

The implementation mode in Device Comparative Example 6-2 was the same as that in Device Comparative Example 6-1, except that Compound A-13 of the present disclosure in the emissive layer was replaced with Compound A-2 of the present disclosure.

Device Comparative Example 6-3

The implementation mode in Device Comparative Example 6-3 was the same as that in Device Comparative Example 6-1, except that Compound A-13 of the present disclosure in the emissive layer was replaced with Compound GH.

Detailed structures and thicknesses of layers of the devices are shown in Table 11. A layer using more than one material is obtained by doping different compounds at a weight ratio as recorded.

TABLE 11

Device structures in Comparative Examples 6-1 to 6-3

| Device ID | HIL | HTL | EBL | EML | HBL | ETL |
|---|---|---|---|---|---|---|
| Comparative Example 6-1 | Compound HI (100 Å) | Compound HT (350 Å) | Compound B-7 (50 Å) | Compound B-7:Compound A-13:G-2 (71:23:6) (400 Å) | Compound HB (50 Å) | Compound ET:Liq (40:60) (350 Å) |
| Comparative Example 6-2 | Compound HI (100 Å) | Compound HT (350 Å) | Compound B-7 (50 Å) | Compound B-7:Compound A-2:G-2 (71:23:6) (400 Å) | Compound HB (50 Å) | Compound ET:Liq (40:60) (350 Å) |

TABLE 11-continued

| Device structures in Comparative Examples 6-1 to 6-3 | | | | | | |
|---|---|---|---|---|---|---|
| Device ID | HIL | HTL | EBL | EML | HBL | ETL |
| Comparative Example 6-3 | Compound HI (100 Å) | Compound HT (350 Å) | Compound B-7 (50 Å) | Compound B-7:Compound GH:G-2 (71:23:6) (400 Å) | Compound HB (50 Å) | Compound ET:Liq (40:60) (350 Å) |

The structure of the new material used in the device is as follows:

G-2

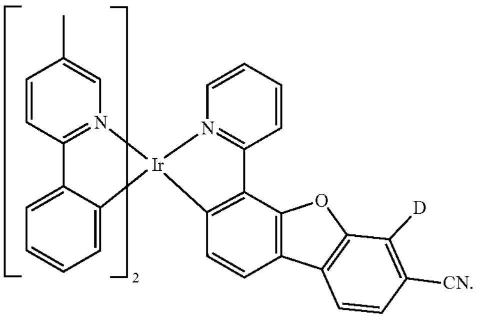

IVL characteristics of the devices were measured. CIE data, the maximum emission wavelength $\lambda_{max}$, the full width at half maximum (FWHM), and the external quantum efficiency (EQE) of the devices were measured at 15 mA/$cm^2$, and these data were recorded and presented in Table 12.

TABLE 12

| Device data of Comparative Examples 6-1 to 6-3, other Examples and other Comparative Examples | | | | | |
|---|---|---|---|---|---|
| Device ID | EML | CIE (x, y) | $\lambda_{max}$ (nm) | FWHM (nm) | EQE (%) |
| Comparative Example 6-1 | B-7:A-13:G-2 (71:23:6) | (0.335, 0.638) | 529 | 42.3 | 21.11 |
| Comparative Example 6-2 | B-7:A-2:G-2 (71:23:6) | (0.333, 0.639) | 528 | 39.9 | 20.43 |
| Comparative Example 6-3 | B-7:GH:G-2 (71:23:6) | (0.336, 0.637) | 528 | 44.9 | 20.11 |
| Example 1-3 | B-7:A-13:GD-14 (71:23:6) | (0.337, 0.638) | 531 | 35.9 | 23.73 |
| Example 1-4 | B-7:A-2:GD-14 (71:23:6) | (0.337, 0.638) | 530 | 36.3 | 23.23 |
| Comparative Example 1-1 | B-7:GH:GD-14 (71:23:6) | (0.335, 0.639) | 530 | 35.9 | 21.45 |
| Example 2-3 | B-7:A-13:GD-13 (71:23:6) | (0.330, 0.643) | 530 | 32.2 | 23.37 |
| Comparative Example 2-1 | B-7:GH:GD-13 (71:23:6) | (0.329, 0.644) | 530 | 32.3 | 21.55 |
| Example 3-3 | B-7:A-13:GD-15 (72:24:4) | (0.339, 0.636) | 530 | 36.2 | 23.92 |
| Comparative Example 3-1 | B-7:GH:GD-15 (72:24:4) | (0.333, 0.640) | 530 | 34.5 | 21.40 |
| Example 4-3 | B-7:A-13:GD-5 (71:23:6) | (0.336, 0.639) | 531 | 33.6 | 23.67 |
| Example 4-4 | B-7:A-2:GD-5 (71:23:6) | (0.339, 0.637) | 531 | 34.1 | 23.78 |
| Comparative Example 4-1 | B-7:GH:GD-5 (71:23:6) | (0.339, 0.637) | 531 | 34.2 | 21.91 |

Discussion

As can be seen from the data in Table 12, Comparative Examples 6-1 and 6-3 used the metal complex G-2 (whose HOMO energy level was −5.17 eV and LUMO energy level was −2. 29 eV) which did not belong to the present disclosure but had the general structure of Formula 1-1, Comparative Example 6-1 used the second compound A-13 having the specific LUMO energy level of the present disclosure while Comparative Example 6-3 used Compound GH, and the external quantum efficiency of the device in Comparative Example 6-1 was increased by 5.0%, compared with the device in Comparative Example 6-3. In the preceding examples, as can be seen from the comparison between Example 1-3 and Comparative Example 1-1, between Example 2-3 and Comparative Example 2-1, between Example 3-3 and Comparative Example 3-1, between Example 4-3 and Comparative Example 4-1, in a case where these Examples and Comparative Examples all used the first compounds GD-14, GD13, GD15 and GD-5 having the specific energy levels and the structure of Formula 1-1 of the present disclosure, respectively, and Examples used the second compound A-13 having the specific LUMO energy level of the present disclosure while Comparative Examples used the host material GH, the external quantum efficiency of the devices in Examples was increased by 10.6%, 8.4%, 11.8% and 8.0%, respectively, and such increases were greater than the increase between Comparative Example 6-1 and Comparative Example 6-3. Meanwhile, the EQE of Comparative Example 6-1 was only 21.11%, while the EQEs of Examples 1-3, 2-3, 3-3 and 4-3 all reached a higher level of 23.3% or more.

Comparative Examples 6-2 and 6-3 used the metal complex G-2 which did not belong to the present disclosure but had the general structure of Formula 1-1, Comparative Example 6-2 used Compound A-2 having the specific LUMO energy level of the present disclosure while Comparative Example 6-3 used Compound GH, and the external quantum efficiency of the device in Comparative Example 6-2 was increased by only 1.6%, compared with the device in Comparative Example 6-3. In the preceding examples, as can be seen from the comparison between Example 1-4 and Comparative Example 1-1 and between Example 4-4 and Comparative Example 4-1, in a case where these Examples and Comparative Examples used the metal complexes GD-14 and GD-5, respectively, and Examples used the second compound A-2 having the specific LUMO energy level of the present disclosure while Comparative Examples used the host material GH, the external quantum efficiency of the devices in Examples was increased by 8.3% and 8.5%, respectively, and such increases were greater than the increase between Comparative Example 6-2 and Comparative Example 6-3. Meanwhile, the EQE of Comparative Example 6-2 was only 20.43%, while the EQEs of Examples 1-4 and 4-4 reached a higher level of 23% or more.

As can be seen from the above data, the combination in the present disclosure of the first compound having the structure of Formula 1-1 and the specific HOMO/LUMO energy levels and the second compound having the structure of Formula 2-1 and the specific LUMO energy level had unique advantages.

In conclusion, the combination in the present disclosure of the first compound having the structure of Formula 1-1 and the specific HOMO/LUMO energy levels and the second compound having the structure of Formula 2-1 and the specific LUMO energy level can greatly optimize the comprehensive performance of the device and make the device show much superior performance. Therefore, the organic electroluminescent device comprising both the specific first compound and the specific second compound of the present disclosure has great advantages in device performance, shows show obvious advantages, can improve device efficiency, and finally achieve the beneficial effect of significantly improving the comprehensive performance of the device.

It is to be understood that various embodiments described herein are merely examples and not intended to limit the scope of the present disclosure. Therefore, it is apparent to the persons skilled in the art that the present disclosure as claimed may include variations of specific embodiments and preferred embodiments described herein. Many of materials and structures described herein may be substituted with other materials and structures without departing from the spirit of the present disclosure. It is to be understood that various theories as to why the present disclosure works are not intended to be limitative.

What is claimed is:

1. An organic electroluminescent device, comprising:

an anode, a cathode, and an organic layer disposed between the anode and the cathode, wherein the organic layer comprises a first organic layer, and the first organic layer comprises a first compound and a second compound;

wherein, the highest occupied molecular orbital energy level ($E_{HOMO-A}$) of the first compound is less than or equal to −5.19 eV and/or the lowest unoccupied molecular orbital energy level ($E_{LUMO-A}$) of the first compound is less than or equal to −2.31 eV; and the first compound has a general structure of $Ir(L_a)_m(L_b)_{3-m}$ represented by Formula 1-1;

Formula 1-1

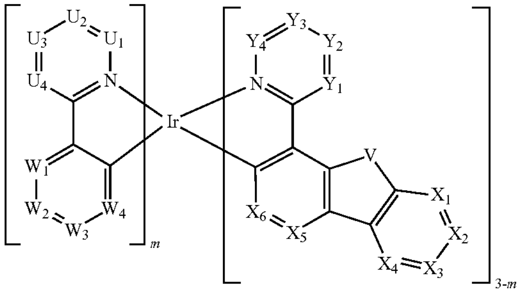

wherein m is selected from 0, 1 or 2; when m is selected from 0 or 1, a plurality of $L_b$ are the same or different; when m is selected from 2, two $L_b$ are the same or different;

V is selected from the group consisting of O, S, Se, NR, CRR, and SiRR; when two R are present, the two R are the same or different;

$X_1$ to $X_6$ are, at each occurrence identically or differently, selected from $CR_x$;

$Y_1$ to $Y_4$ are, at each occurrence identically or differently, selected from $CR_y$;

$U_1$ to $U_4$ are, at each occurrence identically or differently, selected from $CR_u$;

$W_1$ to $W_4$ are, at each occurrence identically or differently, selected from $CR_w$;

R, $R_x$, and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, sulfanyl group, a sulfinyl group, a sulfonyl group, a phosphino group, and combinations thereof;

$R_u$ and $R_w$ are, at each occurrence identically or differently, selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a hydroxyl group, a sulfanyl group, and combinations thereof;

adjacent substituents R, $R_u$, $R_w$, $R_x$, $R_y$ can be optionally joined to form a ring;

the lowest unoccupied molecular orbital energy level ($E_{LUMO-B}$) of the second compound is less than or equal to −2.83 eV; and the second compound has a structure represented by Formula 2-1:

Formula 2-1

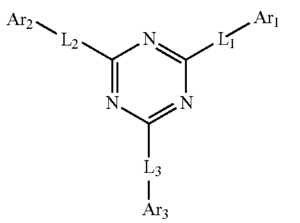

wherein, $L_1$ to $L_3$ are, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms, or combinations thereof;

$Ar_1$ to $Ar_3$ are, at each occurrence identically or differently, selected from substituted or unsubstituted aryl having 6 to 30 carbon atoms, substituted or unsubstituted heteroaryl having 3 to 30 carbon atoms, or combinations thereof.

2. The organic electroluminescent device of claim 1, wherein $E_{HOMO-A}$ is less than or equal to −5.21 eV, and $E_{LUMO-B}$ is less than or equal to −2.85 eV.

3. The organic electroluminescent device of claim 1, wherein $E_{LUMO-A}$ is less than or equal to −2.40 eV, and $E_{LUMO-B}$ is less than or equal to −2.85 eV.

4. The organic electroluminescent device of claim 1, wherein $E_{LUMO-B}$−$E_{LUMO-A}$ is greater than or equal to 2.25 eV.

5. The organic electroluminescent device of claim 1, wherein $E_{LUMO-A}$−$E_{LUMO-B}$ is less than or equal to 0.55 eV.

6. The organic electroluminescent device of claim 1, wherein $E_{LUMO-A}$ is less than or equal to −2.40 eV, $E_{HOMO-A}$ is less than or equal to −5.21 eV, and $E_{LUMO-B}$ is less than or equal to −2.85 eV.

7. The organic electroluminescent device of claim 1, wherein the first organic layer is an emissive layer, the emissive layer further comprises a third compound, and the third compound comprises at least one chemical group selected from the group consisting of: benzene, pyridine, arylamine, carbazole, azacarbazole, indolocarbazole, dibenzothiophene, azadibenzothiophene, dibenzofuran, azadibenzofuran, dibenzoselenophene, triphenylene, fluorene, silafluorene, naphthalene, phenanthrene, and combinations thereof.

8. The organic electroluminescent device of claim 7, wherein the highest occupied molecular orbital energy level ($E_{HOMO-C}$) of the third compound is greater than or equal to −5.48 eV.

9. The organic electroluminescent device of claim 7, wherein the third compound has a structure as show in Formula 3-1:

Formula 3-1

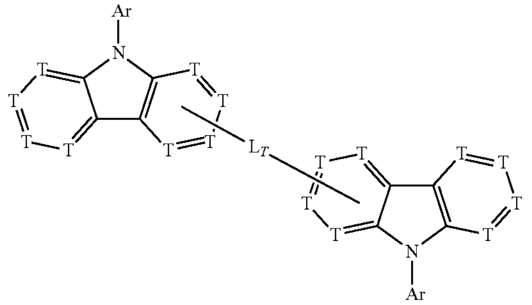

wherein, $L_T$ is, at each occurrence identically or differently, selected from substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms, or combinations thereof, Ar is, at each occurrence identically or differently, selected from substituted or unsubstituted aryl having 6 to 30 carbon atoms, substituted or unsubstituted heteroaryl having 3 to 30 carbon atoms, or combinations thereof;

T is, at each occurrence identically or differently, selected from C, $CR_t$ or N;

$R_t$ is, at each occurrence identically or differently, selected from the group consisting of:

hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, sulfanyl group, a sulfinyl group, a sulfonyl group, a phosphino group, and combinations thereof;

adjacent substituents $R_t$ can be optionally joined to form a ring.

10. The organic electroluminescent device of claim 7, wherein the third compound is selected from the group consisting of:
B-1
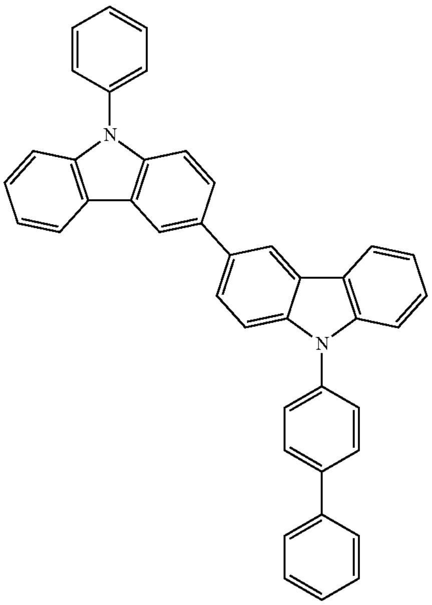
,
B-2
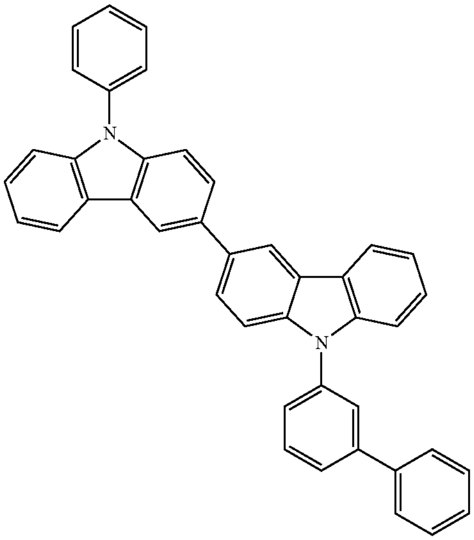
,
-continued
B-3
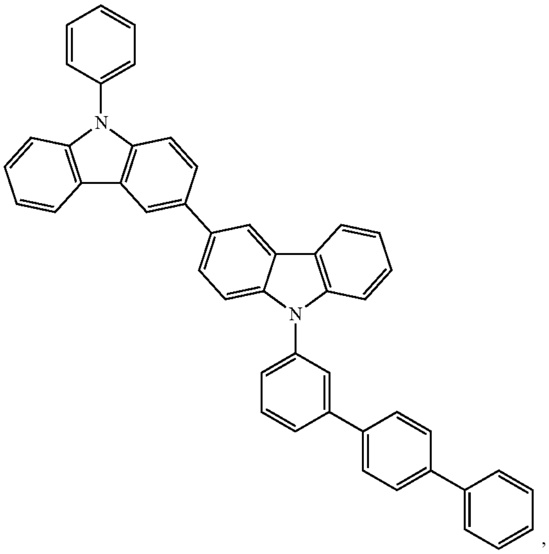
,
B-4
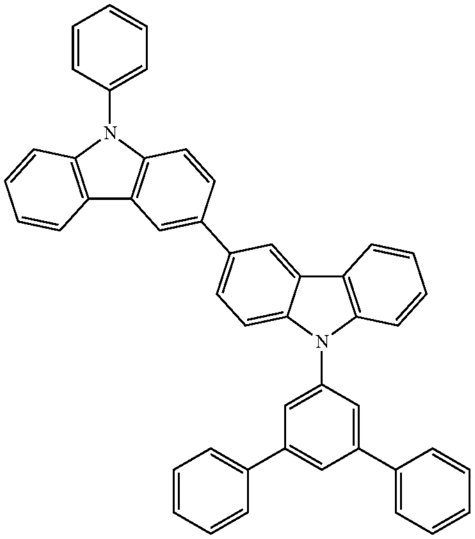
,
B-5
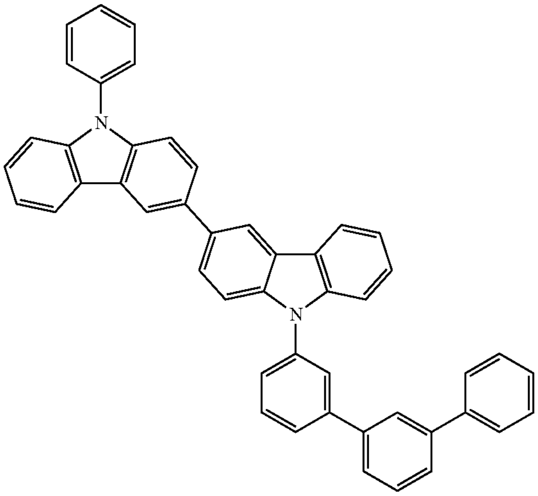
, -continued
B-6
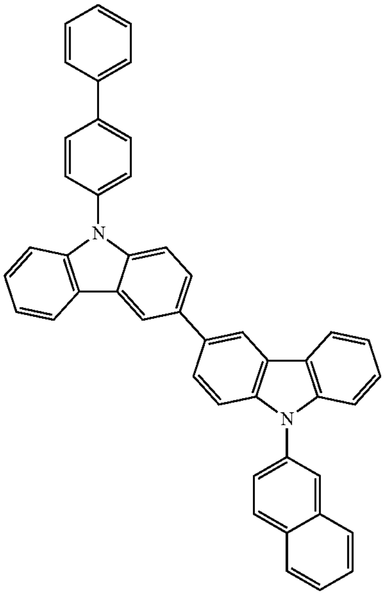
,
B-8
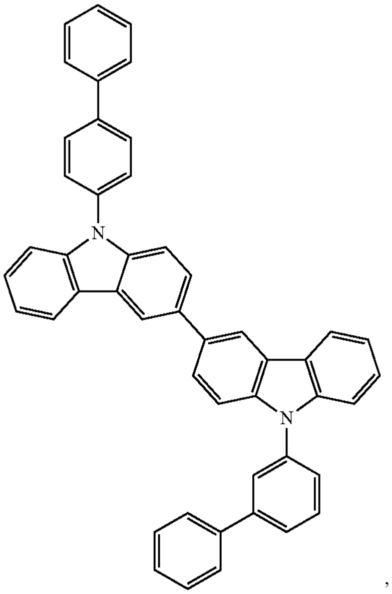
,
B-7
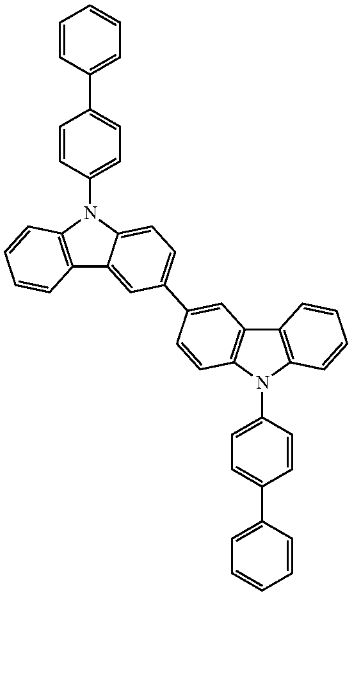
,
B-9
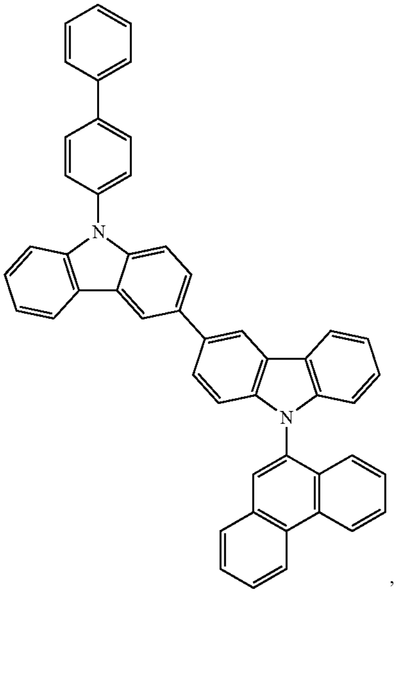
, -continued
B-10
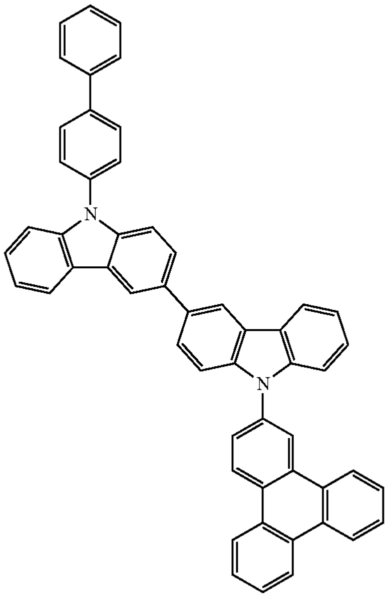
,
B-11
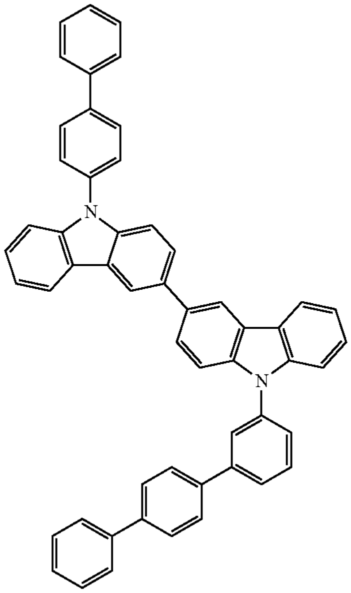
,
-continued
B-12
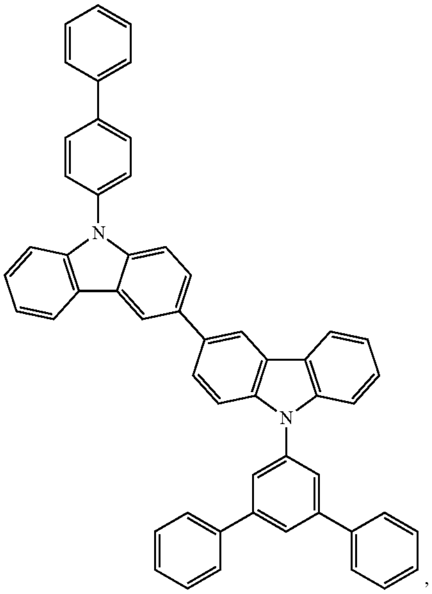
,
B-13
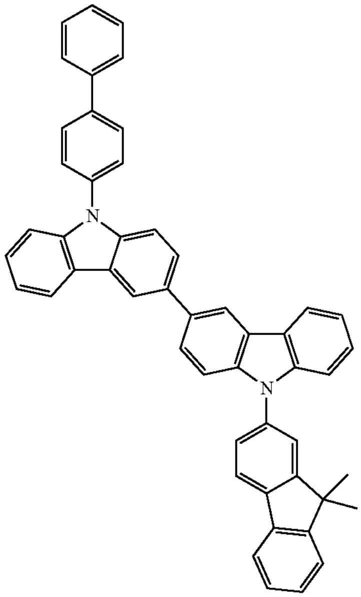
, -continued
B-14
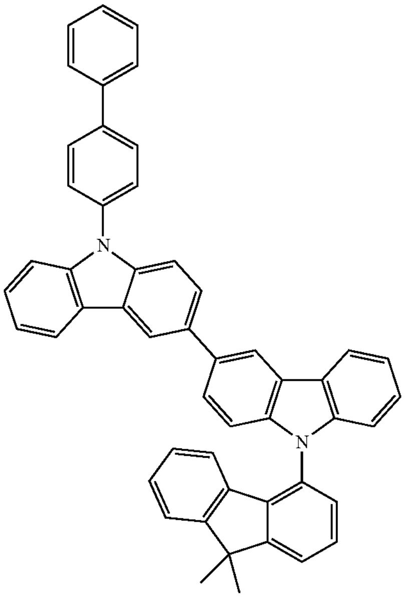
,
-continued
B-16
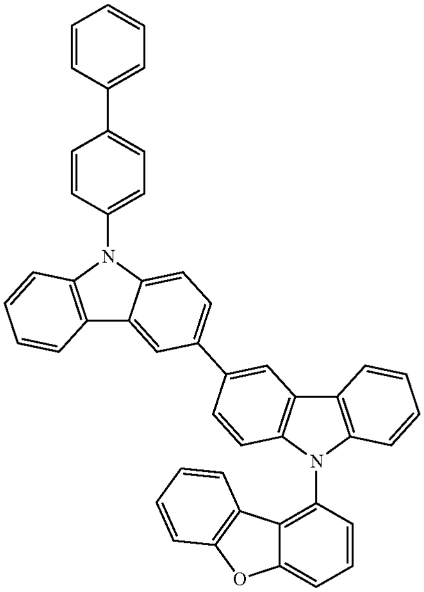
,
B-15
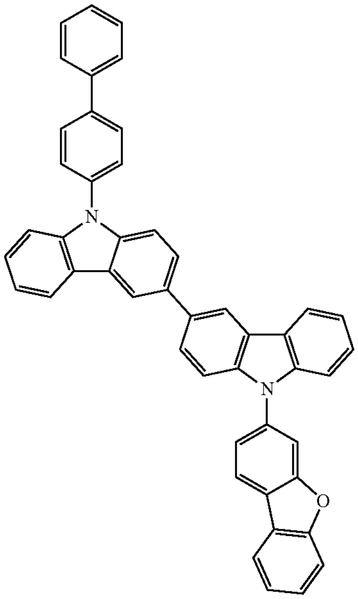
,
B-17
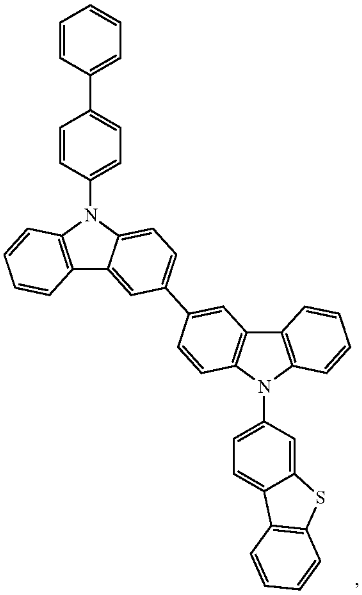
, -continued
B-18
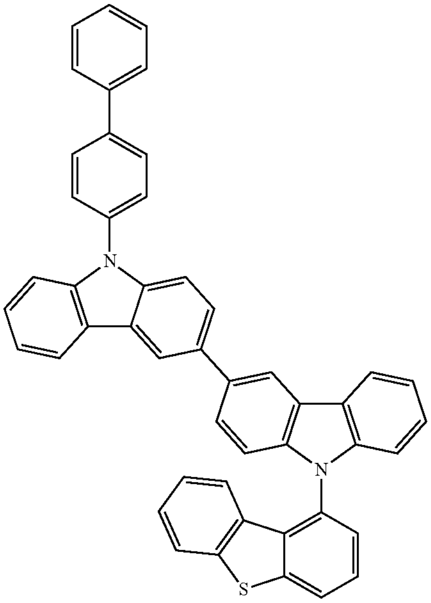
,
B-19
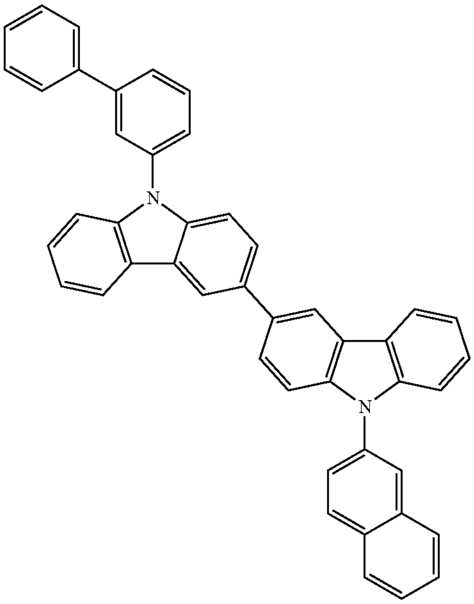
,
-continued
B-20
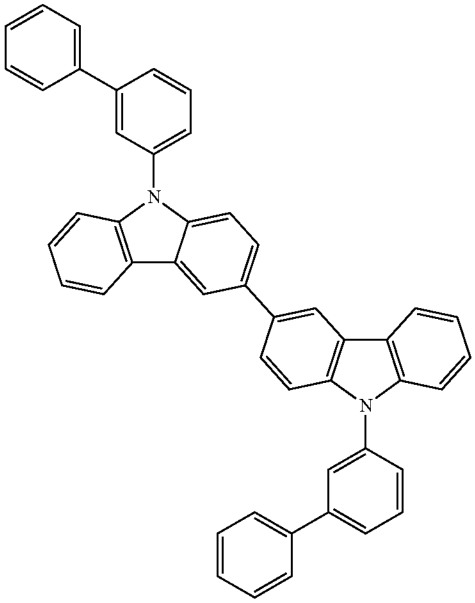
,
B-21
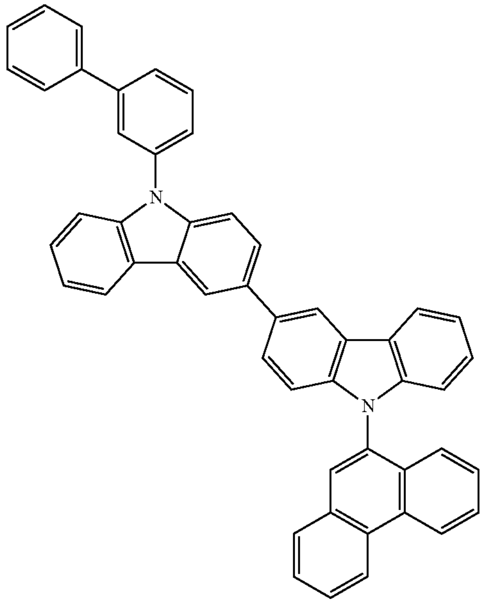
, -continued
B-22
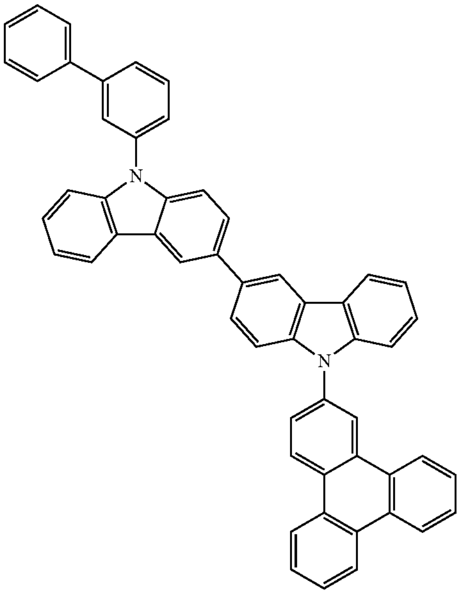
,
B-23
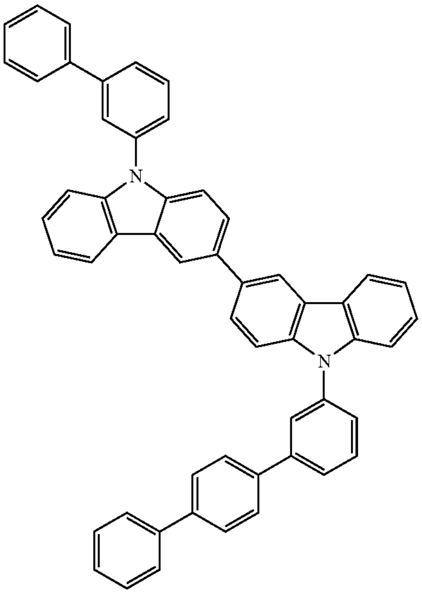
,
-continued
B-24
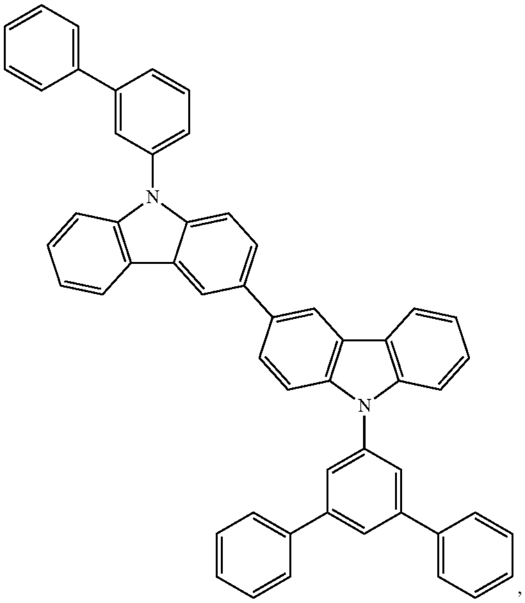
,
B-25
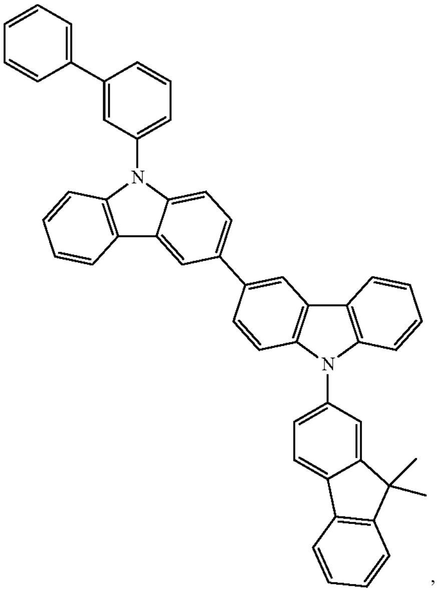
, -continued
B-26
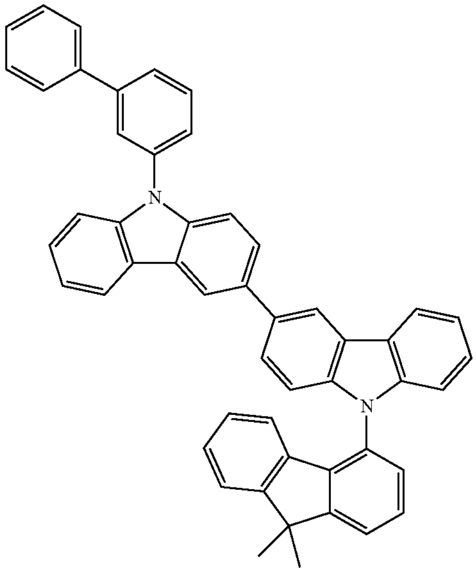
,
B-27
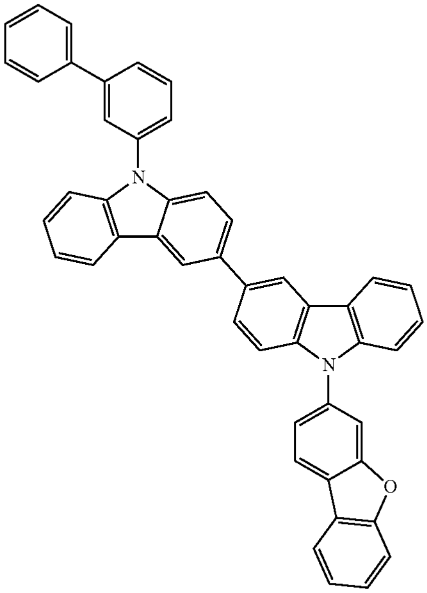
,
-continued
B-28
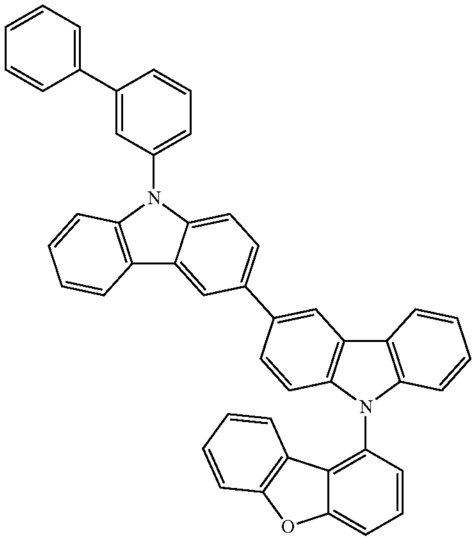
,
B-29
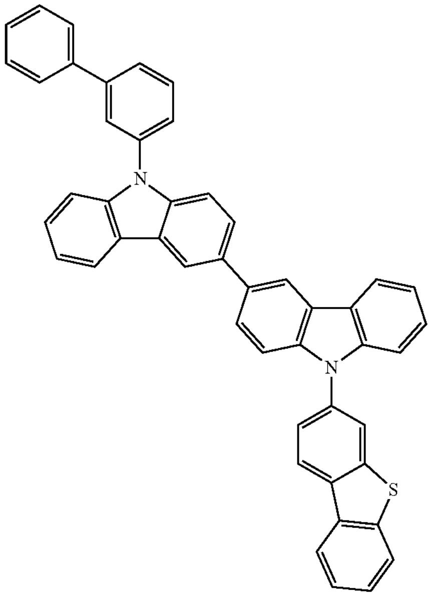
, -continued
B-30
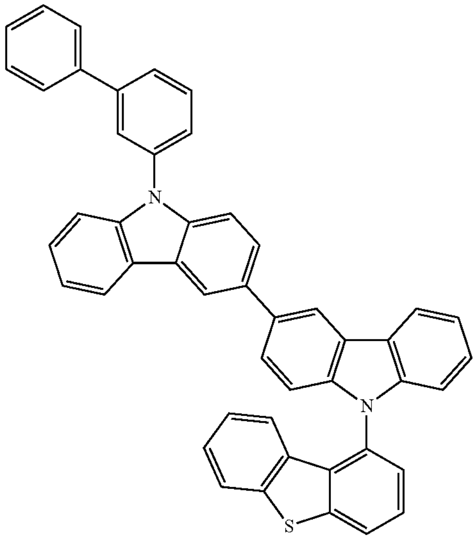
,
B-31
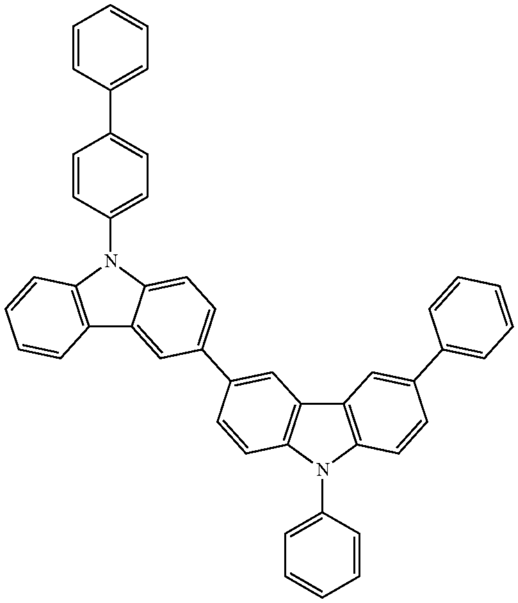
,
-continued
B-32
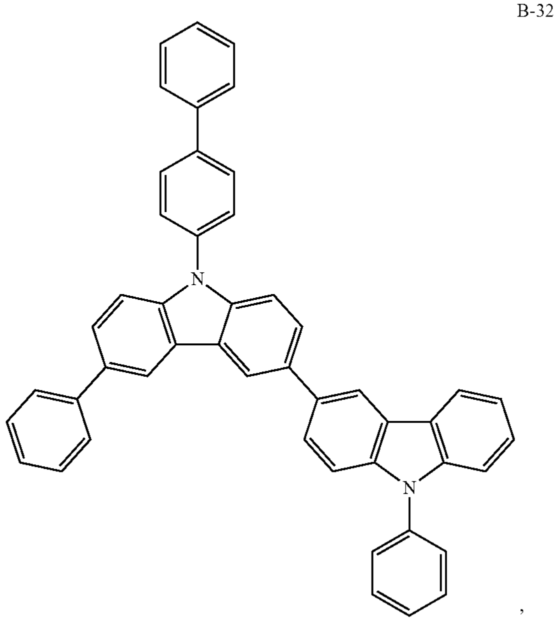
,
B-33
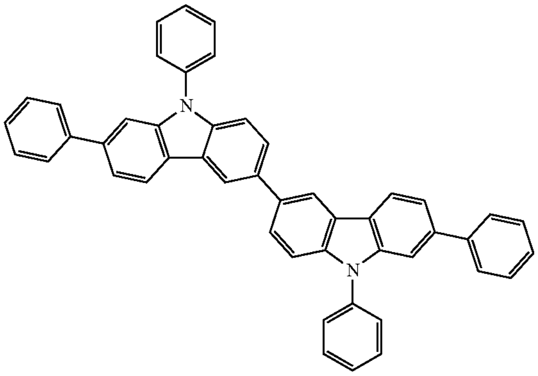
,
B-34
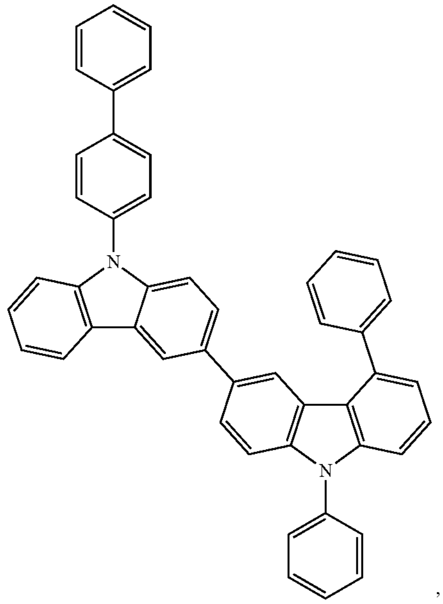
, -continued
B-35
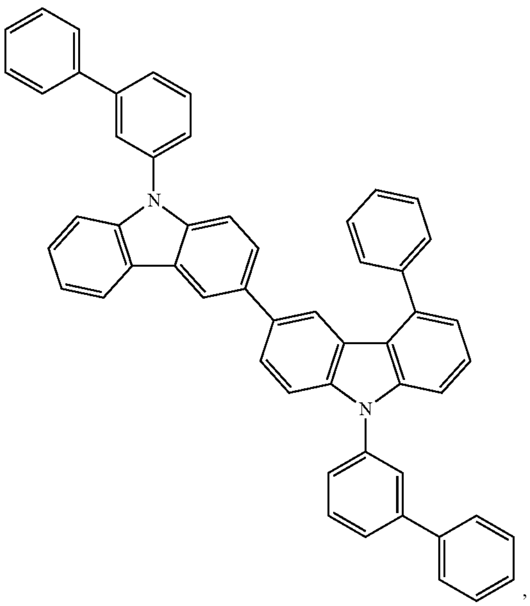
,
B-36
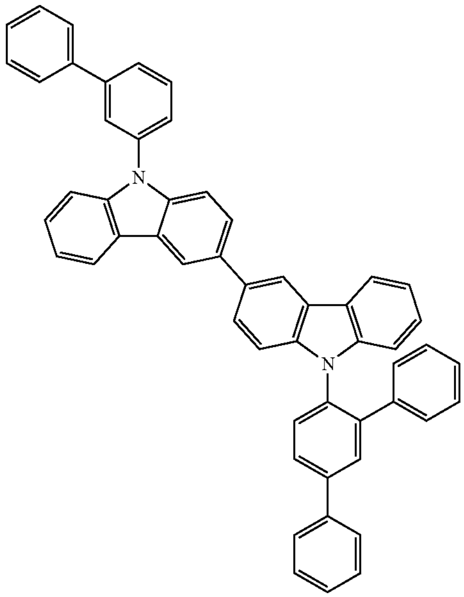
,
-continued
B-37
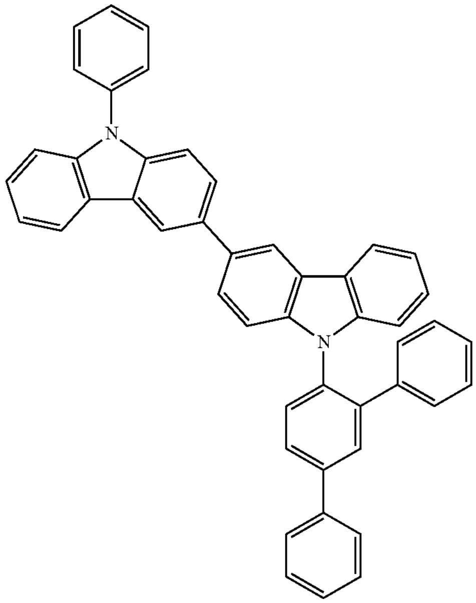
,
B-38
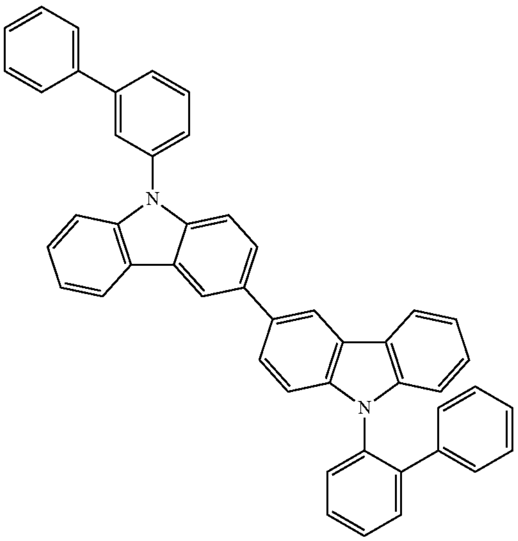
, -continued

B-39

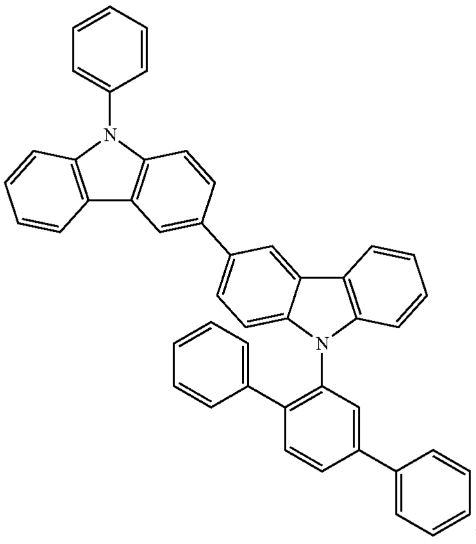

, and

B-40

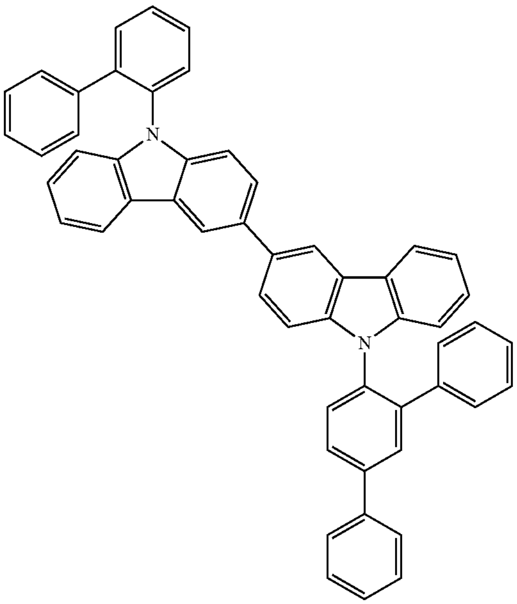

.

11. The organic electroluminescent device of claim 1, wherein R, $R_x$, and $R_y$ are, at occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, a cyano group, an isocyano group, a hydroxyl group, sulfanyl group, and combinations thereof.

12. The organic electroluminescent device of claim 1, wherein $R_u$ and $R_w$ are, at occurrence identically or differently, selected from the group consisting of hydrogen, deuterium, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, and combinations thereof.

13. The organic electroluminescent device of claim 1, wherein at least one of $R_w$ and/or at least one of $R_u$ are selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted alkylsilyl having 3 to 20 carbon atoms, and combinations thereof.

14. The organic electroluminescent device of claim 1, wherein V is selected from O and S.

15. The organic electroluminescent device of claim 1, wherein at least one of $X_1$ to $X_6$ is $CR_x$, and $R_x$ is selected from the group consisting of: fluorine, cyano, fluorine- or cyano-substituted aryl having 6 to 30 carbon atoms, and fluorine- or cyano-substituted heteroaryl having 3 to 30 carbon atoms.

16. The organic electroluminescent device of claim 1, wherein at least one of $X_1$ to $X_6$ is $CR_x$, and $R_x$ has a structure represented by Formula 1-2:

Formula 1-2

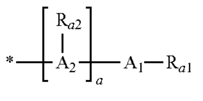

wherein a is selected from 0, 1 or 2;

$A_1$ and $A_2$ are, at each occurrence identically or differently, selected from alkylene having 1 to 20 carbon atoms, heteroalkylene having 1 to 20 carbon atoms, cycloalkylene having 3 to 20 carbon atoms, heterocyclylene having 3 to 20 ring atoms, arylene having 6 to 30 carbon atoms, heteroarylene having 3 to 30 carbon atoms, or combinations thereof;

$R_{a1}$ and $R_{a2}$ represent, at each occurrence identically or differently, mono-substitution, multiple substitutions, or non-substitution;

$R_{a1}$ and $R_{a2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, sulfanyl group, a sulfinyl group, a sulfonyl group, a phosphino group, and combinations thereof;

"*" represents a position of attachment of Formula 1-2;

adjacent substituents Rai, $R_{82}$ can be optionally joined to form a ring.

17. The organic electroluminescent device of claim 16, wherein $A_1$ and $A_2$ are, at each occurrence identically or differently, selected from arylene having 6 to 18 carbon atoms, heteroarylene having 3 to 18 carbon atoms, or combinations thereof.

18. The organic electroluminescent device of claim 16, wherein $R_{a1}$ and $R_{a2}$ are, at each occurrence identically or differently, selected from the group consisting of: hydrogen, deuterium, halogen, cyano, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, and combinations thereof.

19. The organic electroluminescent device of claim 16, wherein at least two of $X_1$ to $X_4$ are selected from $CR_x$, one of $R_x$ is selected from cyano or fluorine, and at least another $R_x$ has a structure represented by Formula 1-2.

20. The organic electroluminescent device of claim 16, $A_1$ and $A_2$ are, at each occurrence identically or differently, selected from the group consisting of: phenylene, pyridylene, pyrimidinylene, triazinylene, naphthylene, phenanthrylene, anthrylene, fluorenylene, silafluorenylene, quinolylene, isoquinolylene, thienothienylene, furofurylene benzofurylene, benzothienylene, dibenzofurylene, dibenzothienylene, triphenylenylene, carbazolylene, azacarbazolylene, azafluorenylidene, azasilafluorenylene, azadibenzofurylene, azadibenzothienylene, and combinations thereof.

21. The organic electroluminescent device of claim 16, $X_1$ is selected from CRx, wherein Rx is cyano or fluorine, and $X_2$ is selected from CRx, wherein Rx has a structure represented by Formula 1-2; or $X_2$ is selected from CRx, wherein Rx is cyano or fluorine, and $X_1$ is selected from CRx, wherein Rx has a structure represented by Formula 1-2.

22. The organic electroluminescent device of claim 1, wherein at least one of $X_1$ to $X_6$ is $CR_x$, and $R_x$ is, at each occurrence identically or differently, selected from the group consisting of:

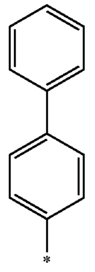,

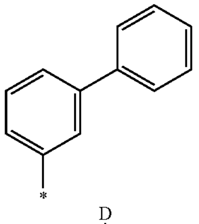,

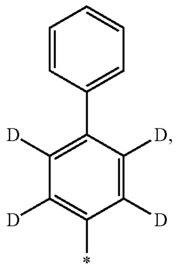

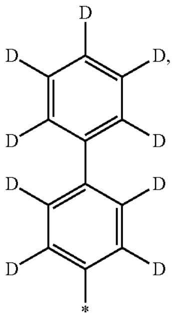

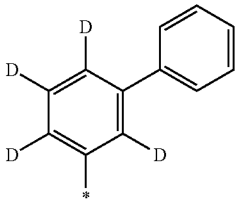,

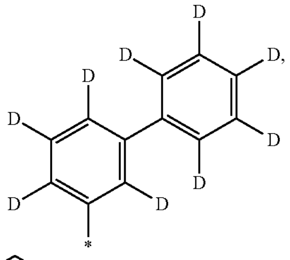

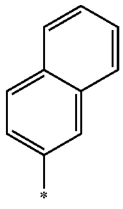,

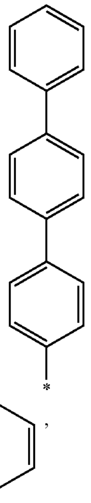,

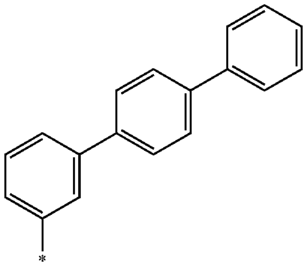,

-continued
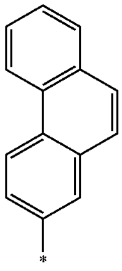
,
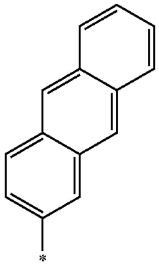
,
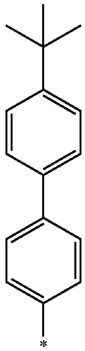
,
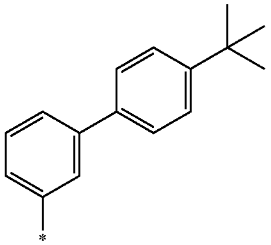
,
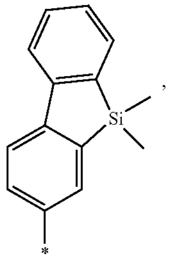
,
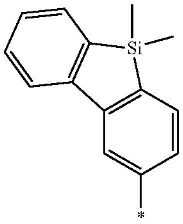
,
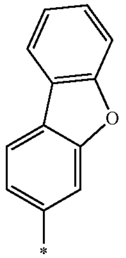
,
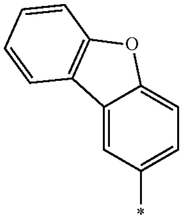
,
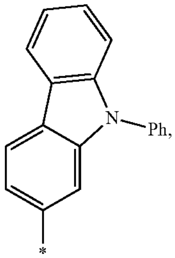
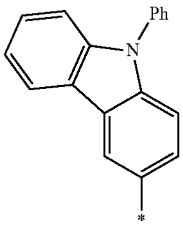
,
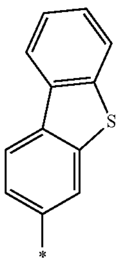
,
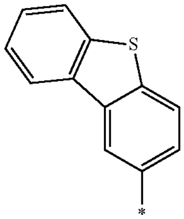
,
-continued
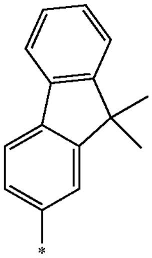
,
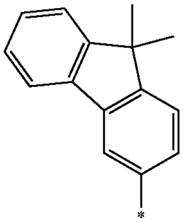
,
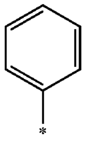
,
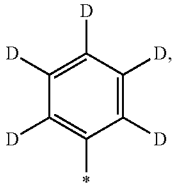
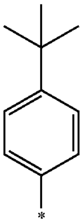
,
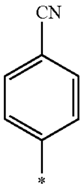
,
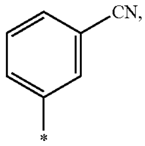
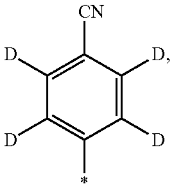
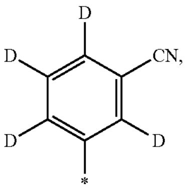
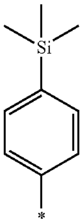
,
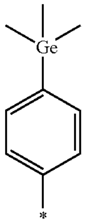
,
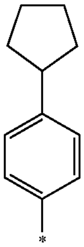
,
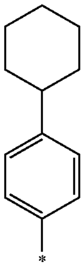
,
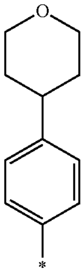
,
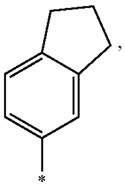
,
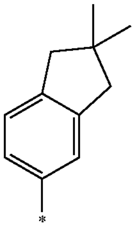
, -continued

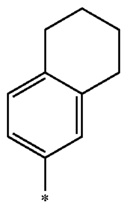

,

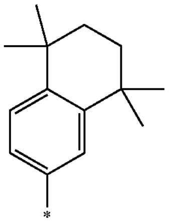

,

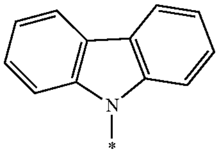

,

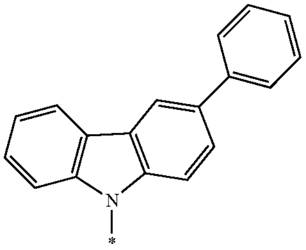

,

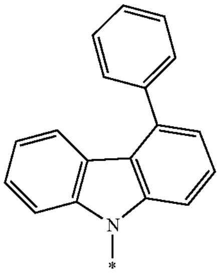

,

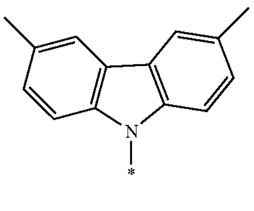

,

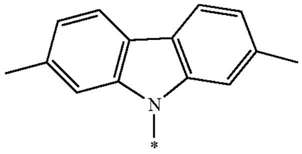

,

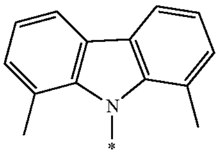

,

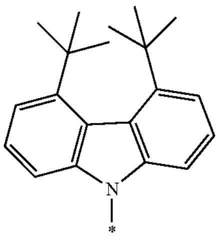

,

-continued

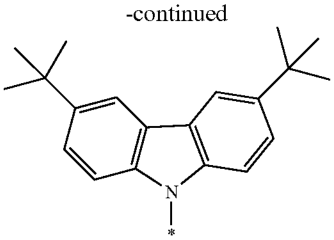

,

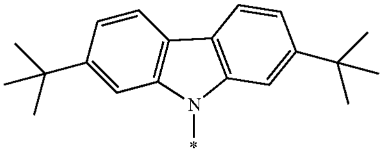

,

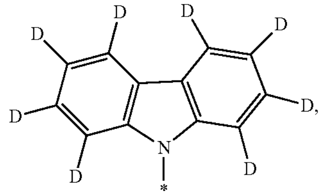

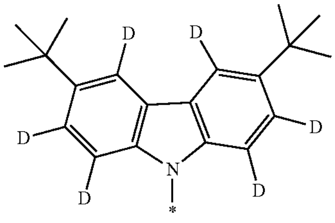

, and combinations thereof;

optionally, hydrogens in the above groups can be partially or fully replaced with deuterium; wherein "*" represents a position of attachment.

23. The organic electroluminescent device of claim 1, wherein the second compound has a structure represented by Formula 2-2:

Formula 2-2

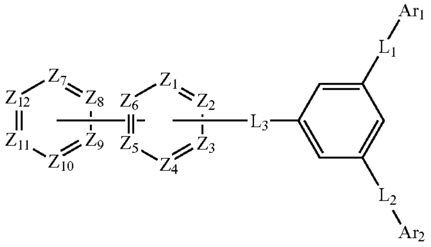

wherein, $Z_1$ to $Z_{12}$ are, at each occurrence identically or differently, selected from C, $CR_7$ or N;

$L_1$ to $L_3$ are, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms, or combinations thereof;

$Ar_1$ and $Ar_2$ are, at each occurrence identically or differently, selected from substituted or unsubstituted aryl having 6 to 30 carbon atoms, substituted or unsubstituted heteroaryl having 3 to 30 carbon atoms, or combinations thereof, $R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, sulfanyl group, a sulfinyl group, a sulfonyl group, a phosphino group, and combinations thereof;

adjacent substituents $R_z$ can be optionally joined to form a ring.

24. The organic electroluminescent device of claim 23, wherein $Ar_1$ and $Ar_2$ are, at each occurrence identically or differently, selected from substituted or unsubstituted aryl having 6 to 20 carbon atoms, substituted or unsubstituted heteroaryl having 3 to 20 carbon atoms, or combinations thereof.

25. The organic electroluminescent device of claim 1, wherein the second compound has a structure represented by Formula 2-3:

Formula 2-3

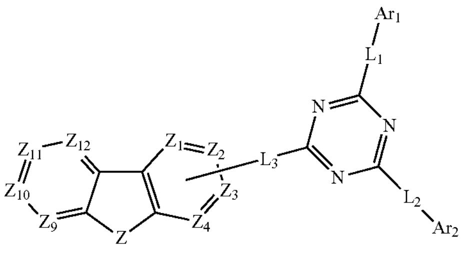

wherein,

Z is, at each occurrence identically or differently, selected from O, S, or Se;

$Z_1$ to $Z_4$ and $Z_9$ to $Z_{12}$ are, at each occurrence identically or differently, selected from C, $CR_z$ or N, and at least one of $Z_1$ to $Z_4$ is C and is joined to $L_3$;

$L_1$ to $L_3$ are, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms, or combinations thereof;

$Ar_1$ and $Ar_2$ are, at each occurrence identically or differently, selected from substituted or unsubstituted aryl having 6 to 30 carbon atoms, substituted or unsubstituted heteroaryl having 3 to 30 carbon atoms, or combinations thereof;

$R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, sulfanyl group, a sulfinyl group, a sulfonyl group, a phosphino group, and combinations thereof;

adjacent substituents $R_z$ can be optionally joined to form a ring.

26. The organic electroluminescent device of claim 25, wherein at least one of $Z_1$ to $Z_4$ and $Z_9$ to $Z_{12}$ is $CR_z$, and $R_z$ is substituted or unsubstituted aryl having 6 to 30 carbon atoms.

27. The organic electroluminescent device of claim 1, wherein the second compound comprises at least one of the group consisting of: fluorine, cyano, an aza-aromatic ring group, any of the following groups substituted by one or more of fluorine, cyano or an aza-aromatic ring group: aryl having 6 to 30 carbon atoms and heteroaryl having 3 to 30 carbon atoms, and combinations thereof.

28. The organic electroluminescent device of claim 1, wherein the first compound is, at each occurrence identically or differently, selected from the group consisting of:

GD-1

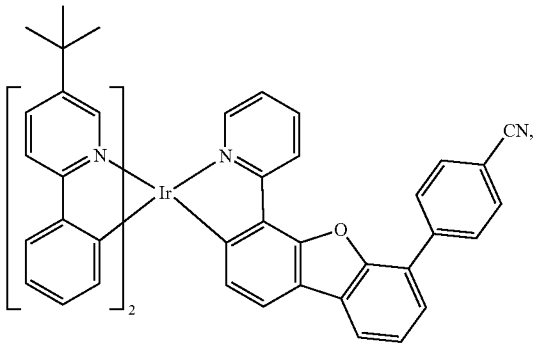

GD-2
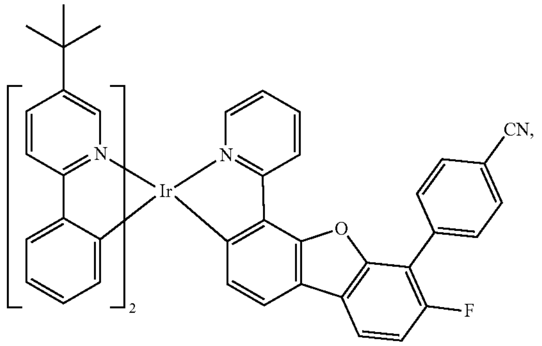
GD-3
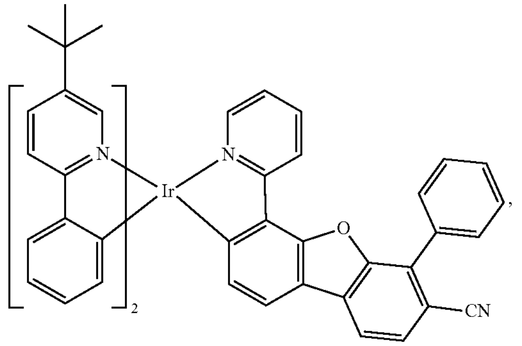
GD-4
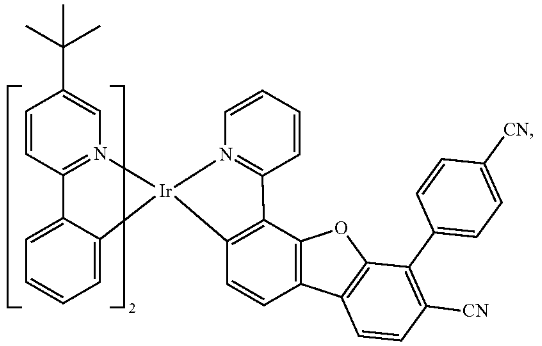
GD-5
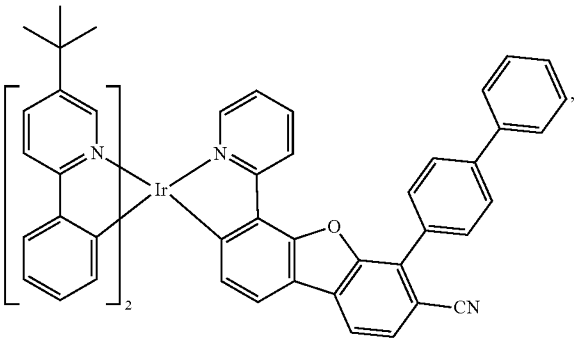
GD-6
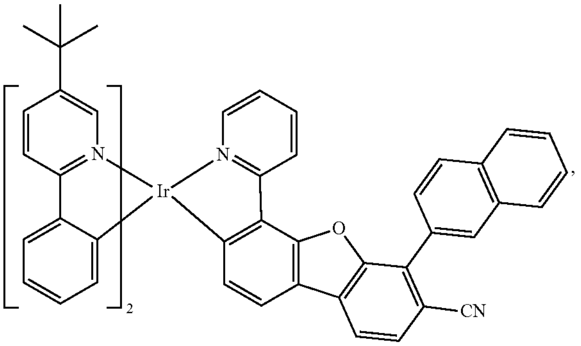
GD-7
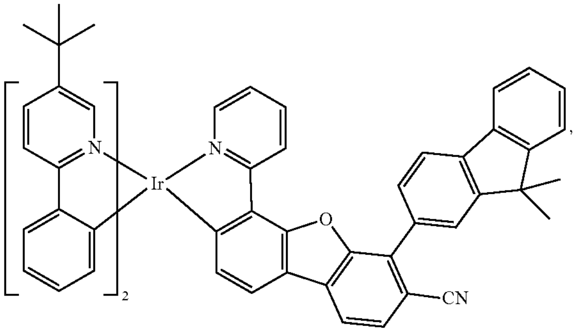
GD-8
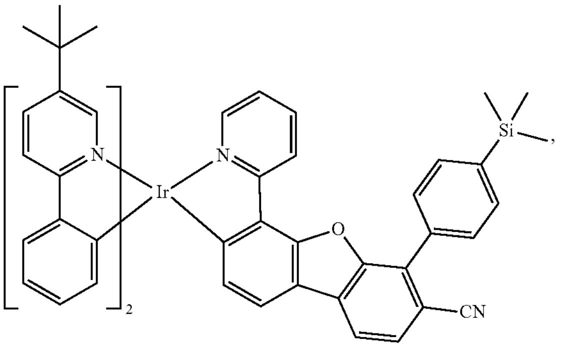
GD-9
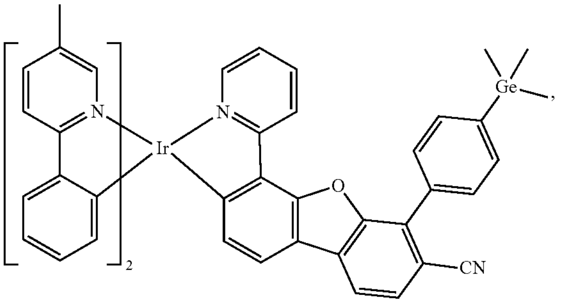

-continued
GD-10
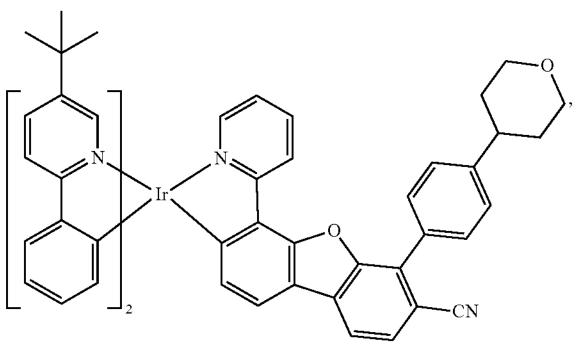
GD-11
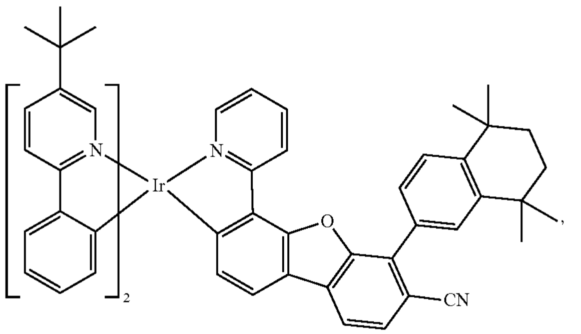
GD-12
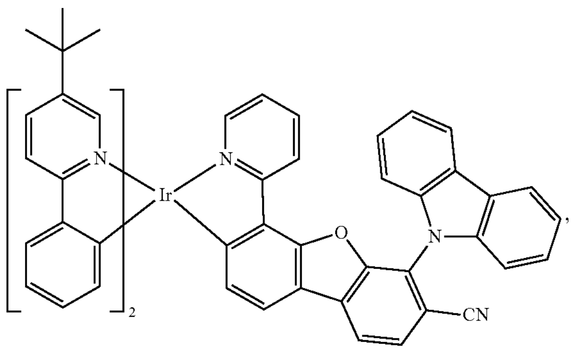
GD-13
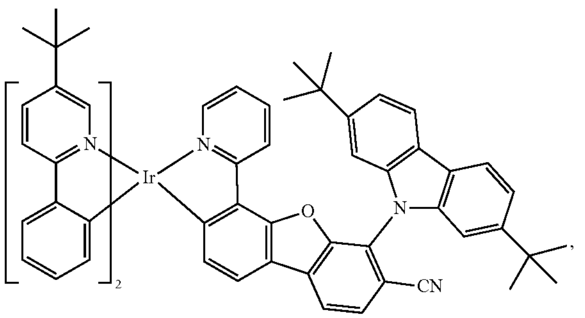
-continued
GD-14
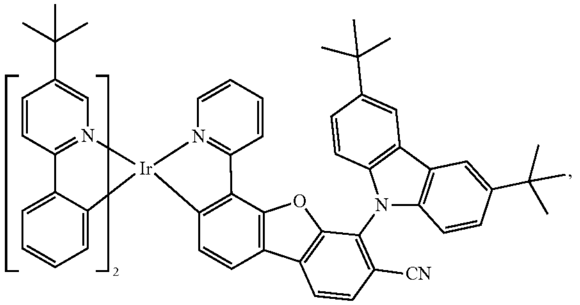
GD-15
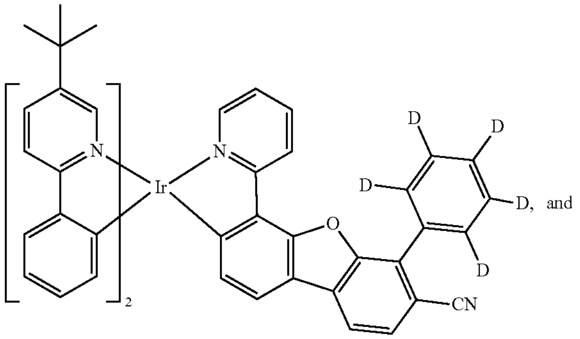
GD-16
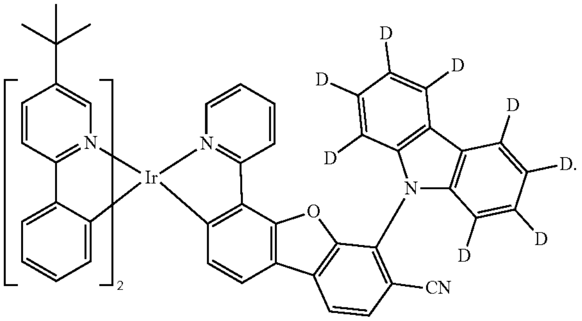
29. The organic electroluminescent device of claim 1, wherein the second compound is selected from the group consisting of:

A-1
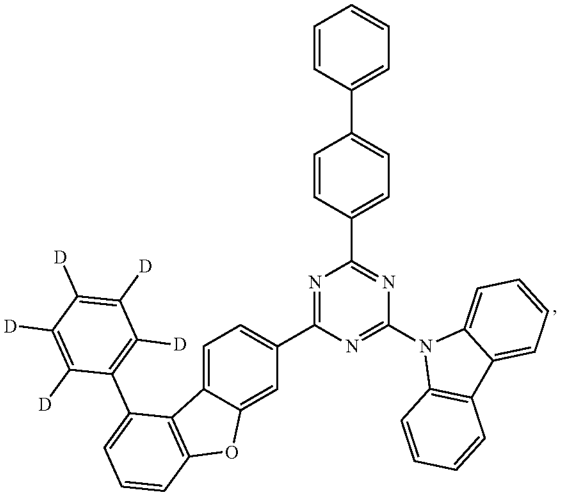
A-2
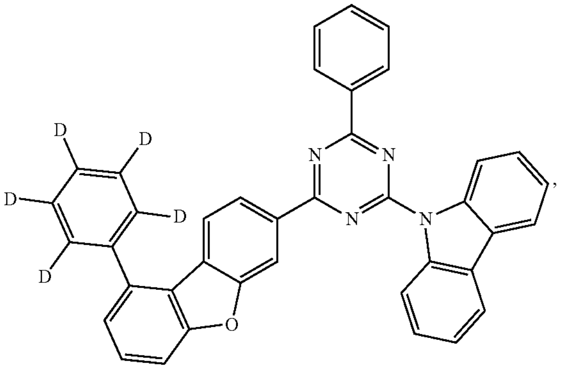
A-3
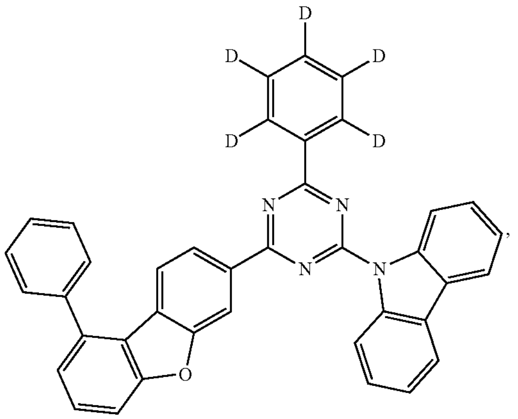
-continued
A-4
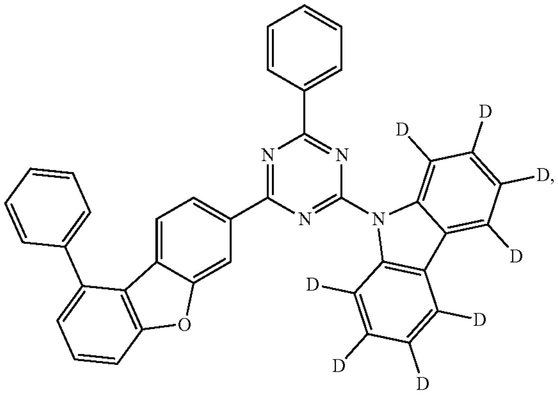
A-5
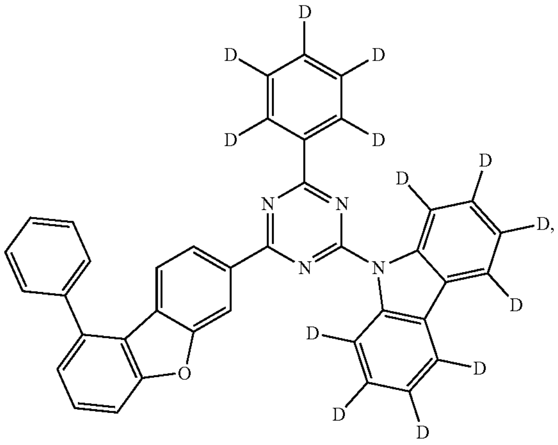
A-6
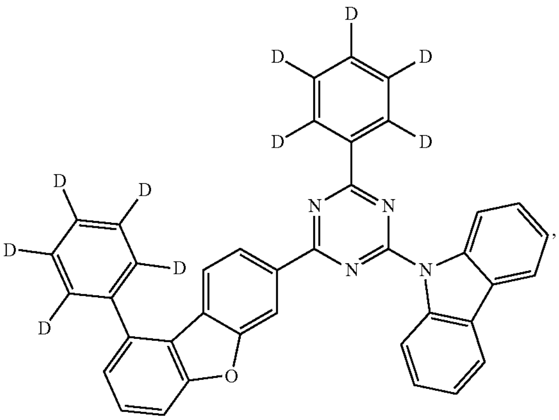

A-7
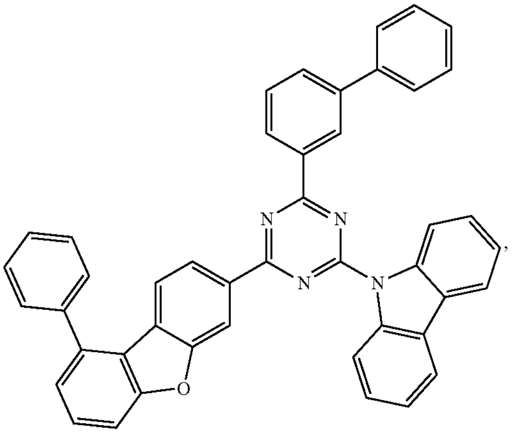
A-8
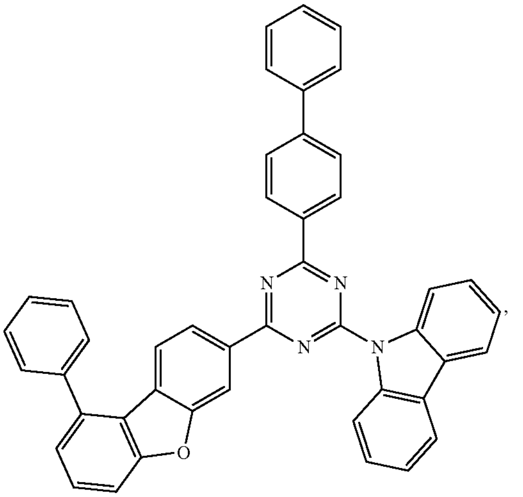
A-9
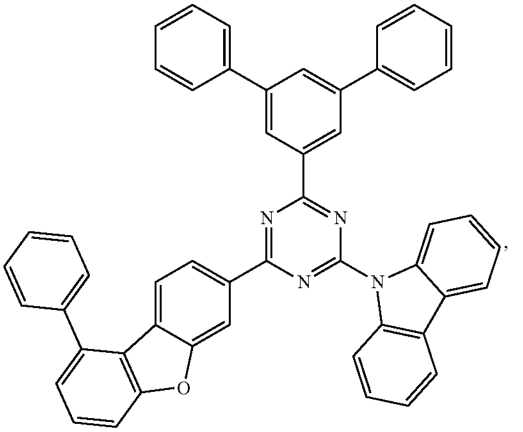
A-10
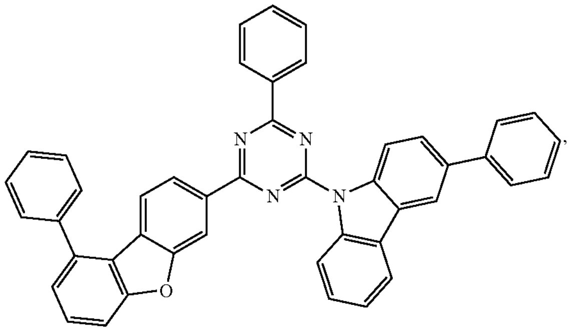
A-11
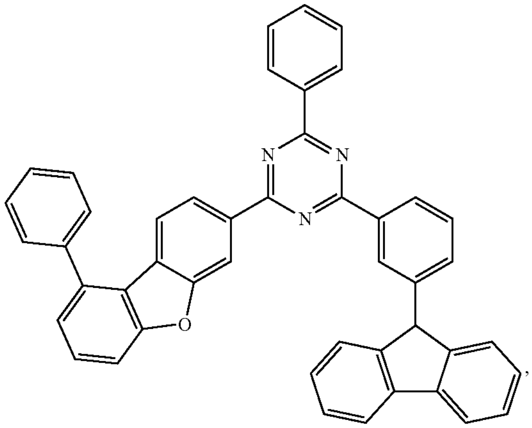
A-12
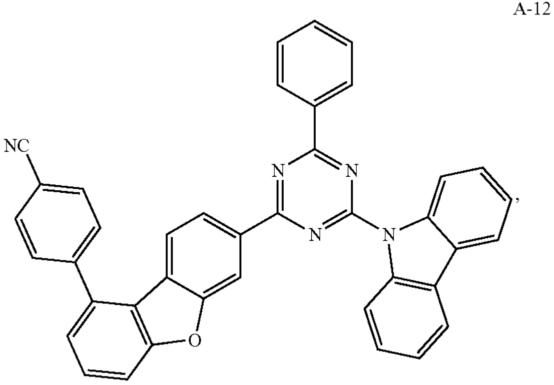
A-13
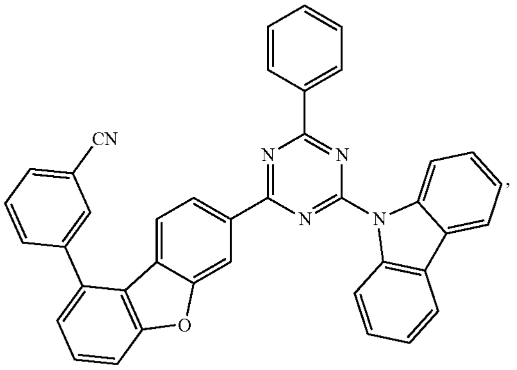

-continued
A-14
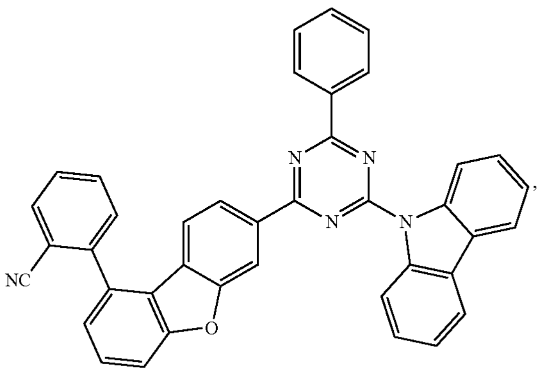
,
A-15
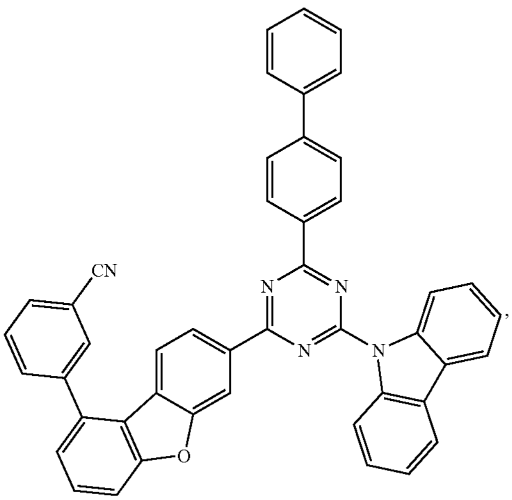
,
A-16
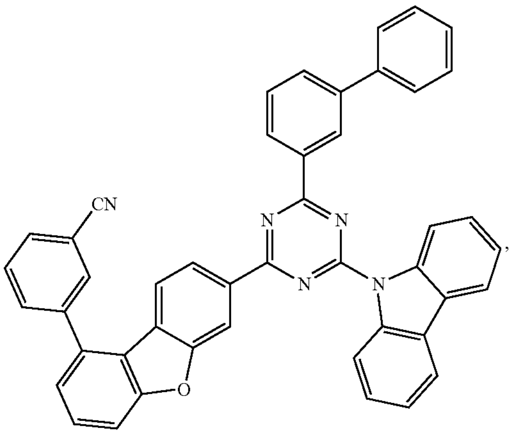
,
-continued
A-17
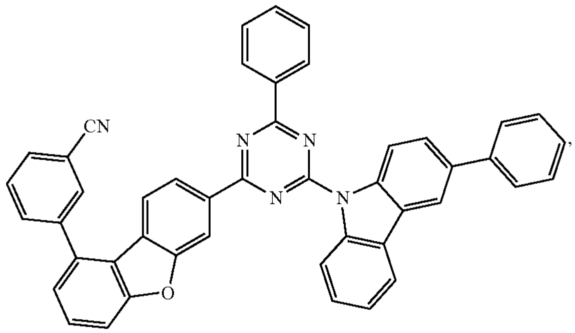
,
A-18
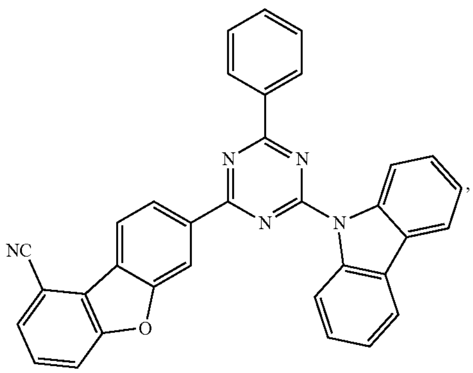
,
A-19
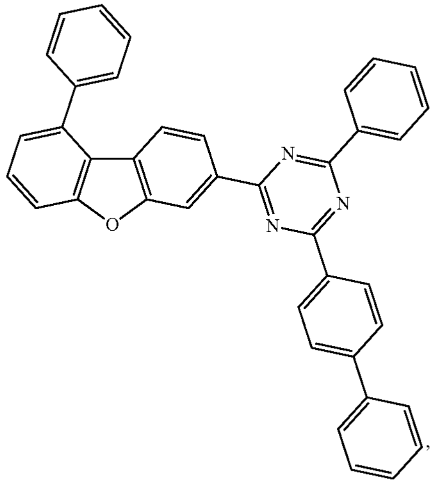
, -continued
A-20
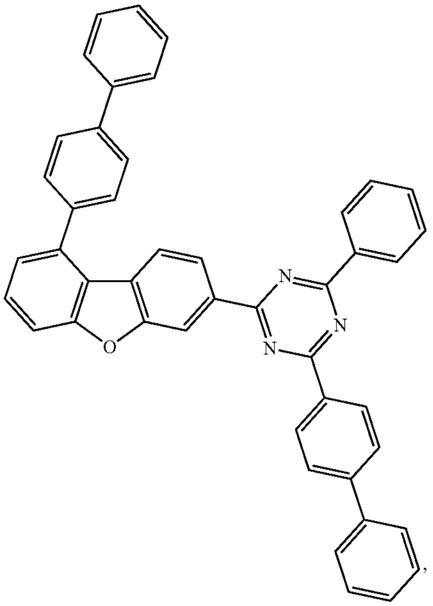,
A-21
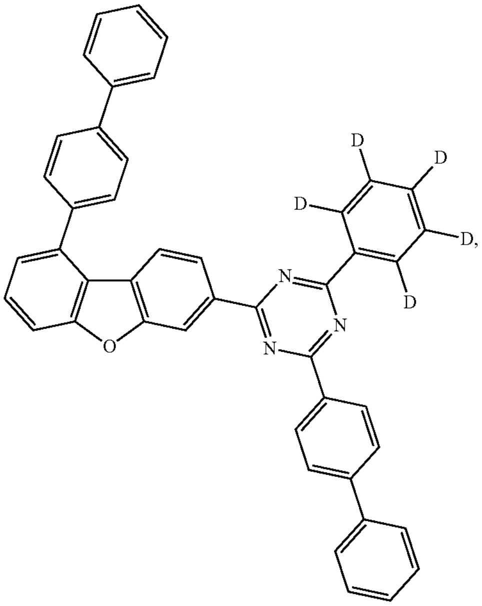
-continued
A-22
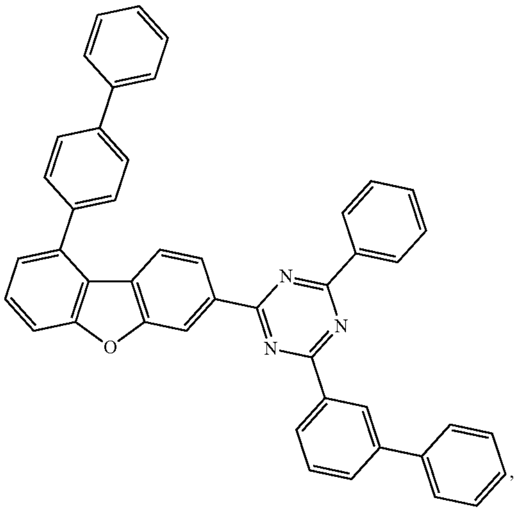,
A-23
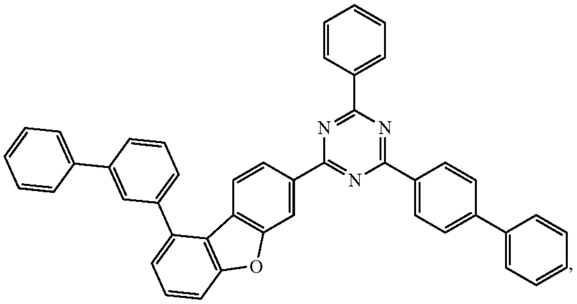,
A-24
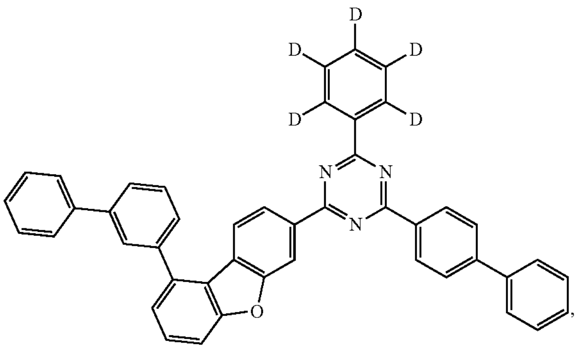,
A-25
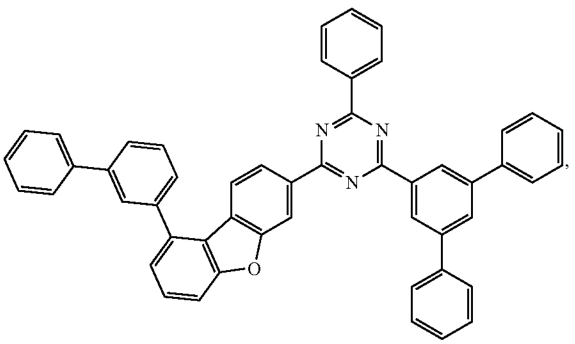, -continued
A-26
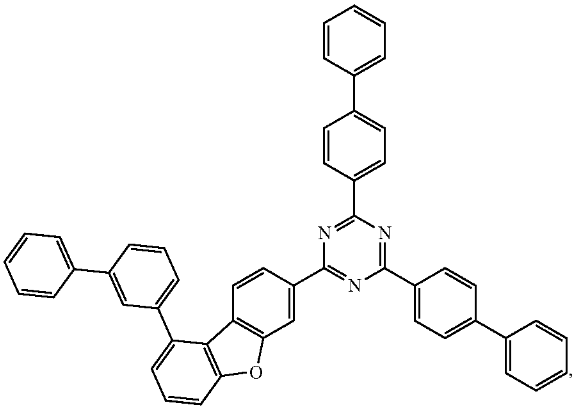
,
A-27
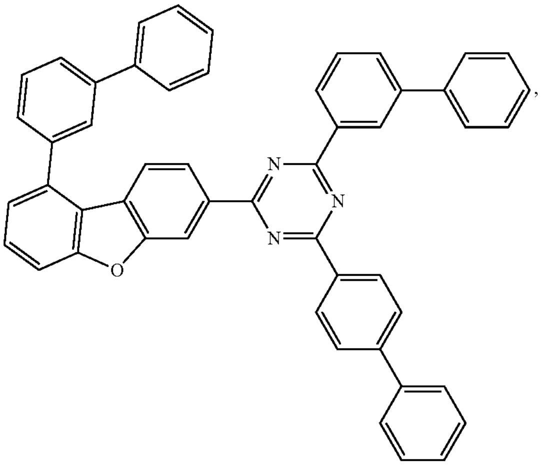
,
A-28
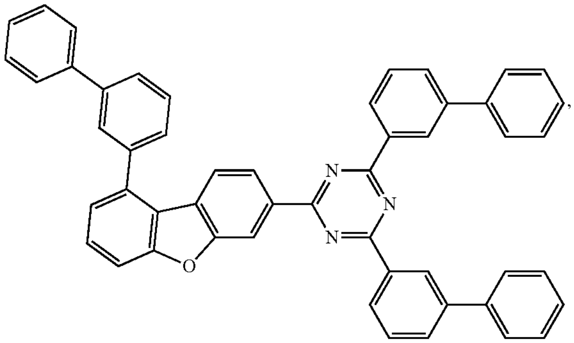
,
-continued
A-29
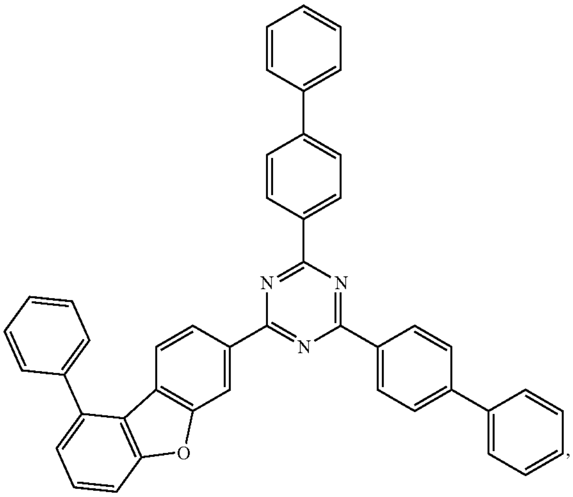
,
A-30
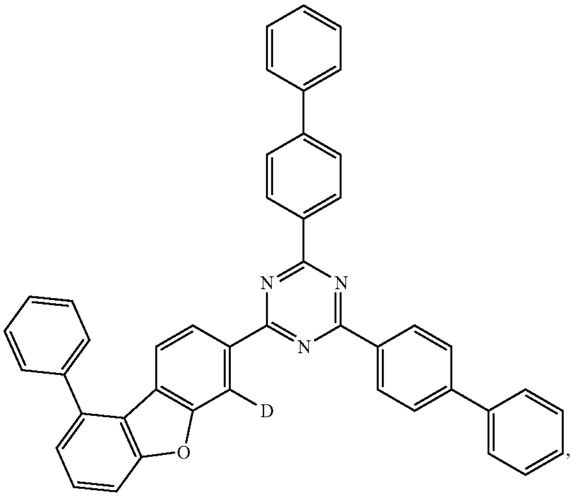
,
A-31
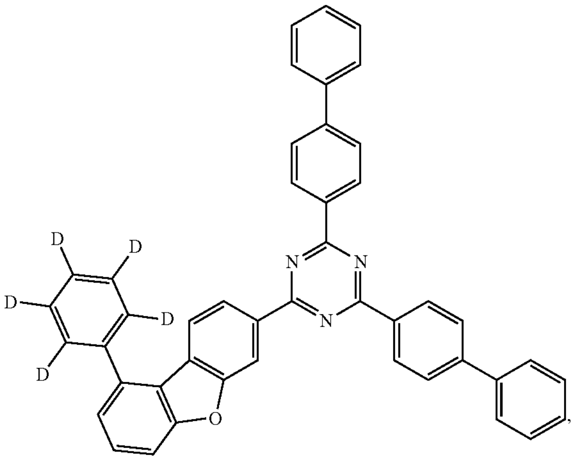
, -continued
A-32
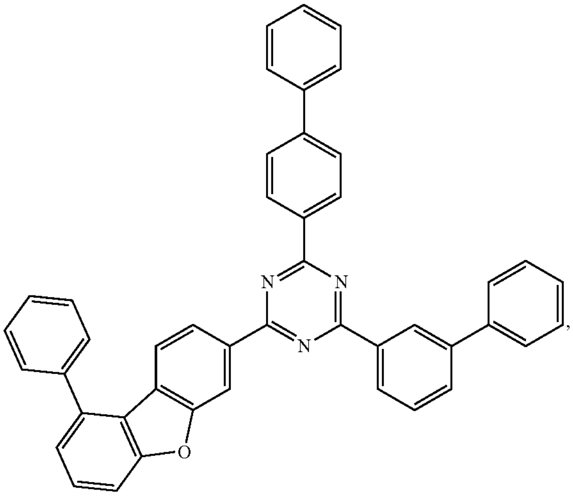
,
A-33
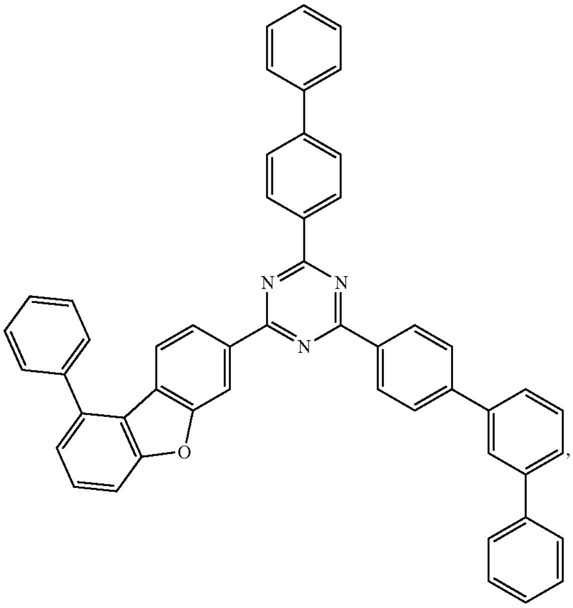
,
-continued
A-34
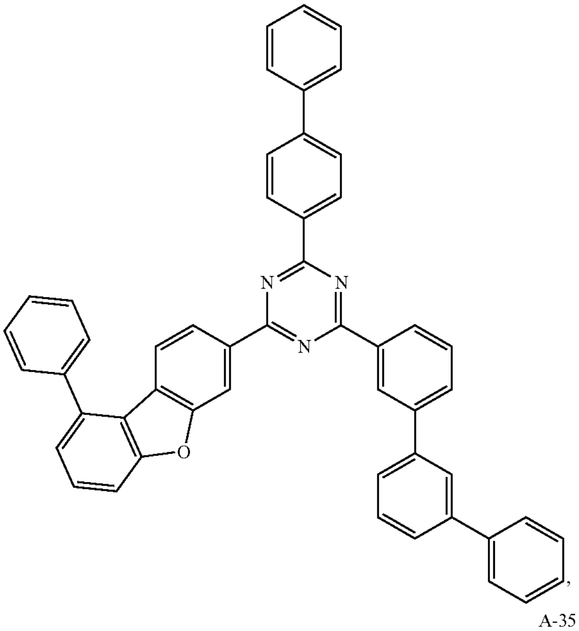
,
A-35
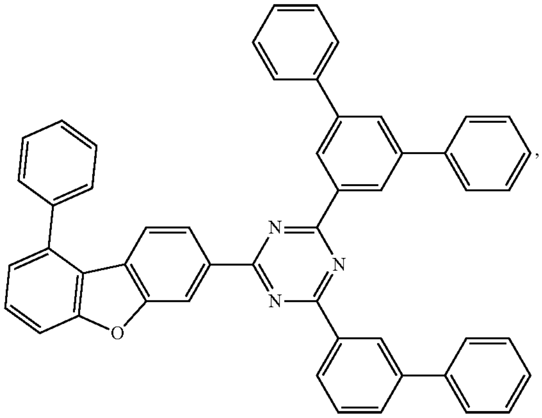
,
A-36
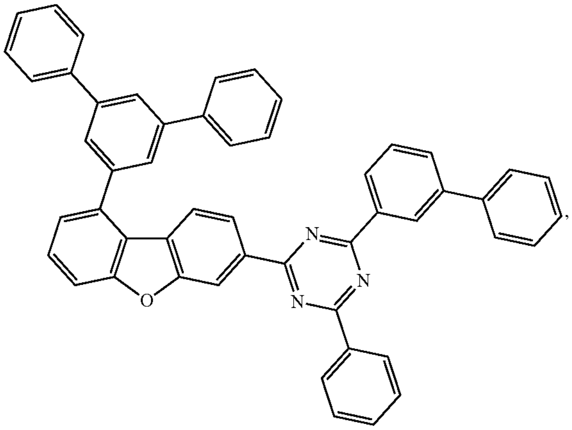
, -continued
A-37
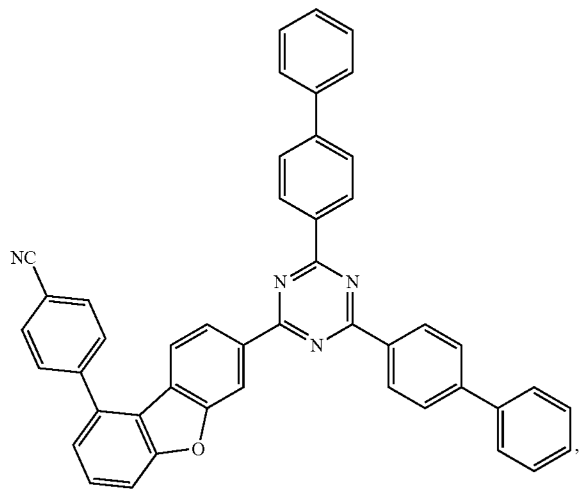
,
A-38
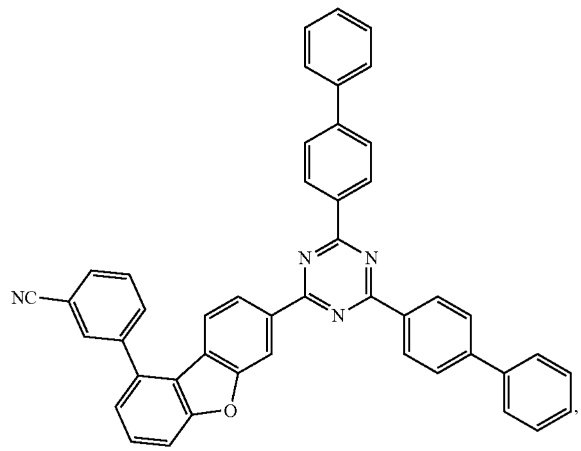
,
A-39
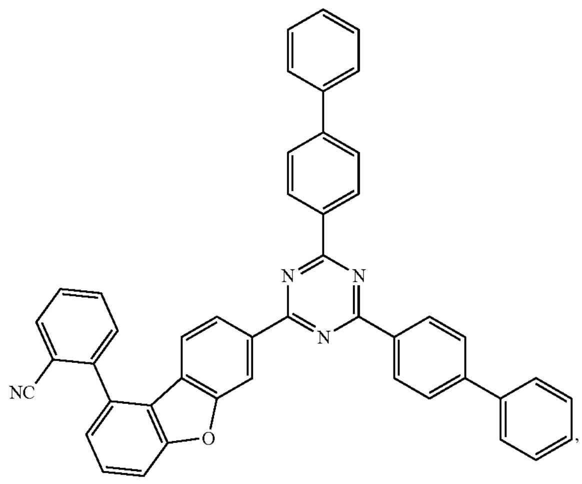
,
-continued
A-40
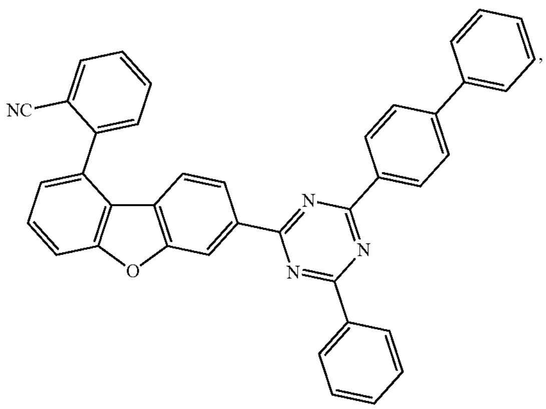
,
A-41
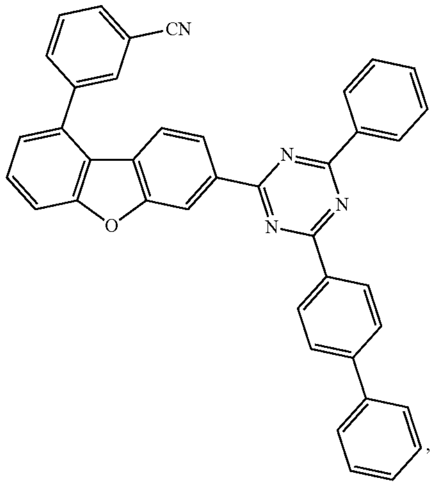
,
A-42
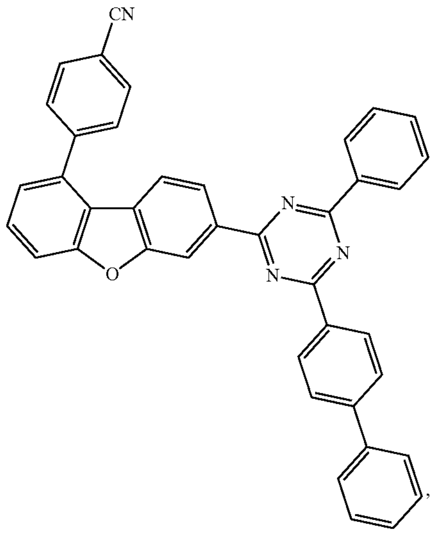
, -continued
A-43
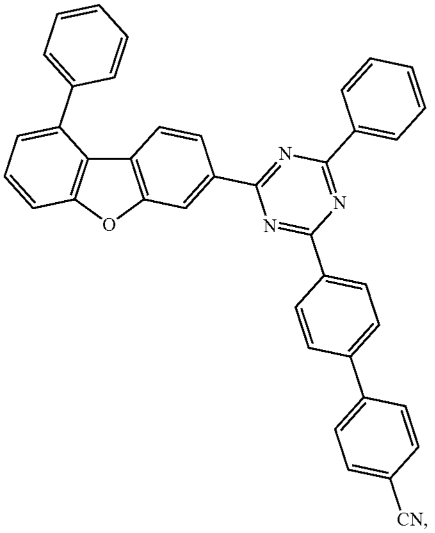
A-44
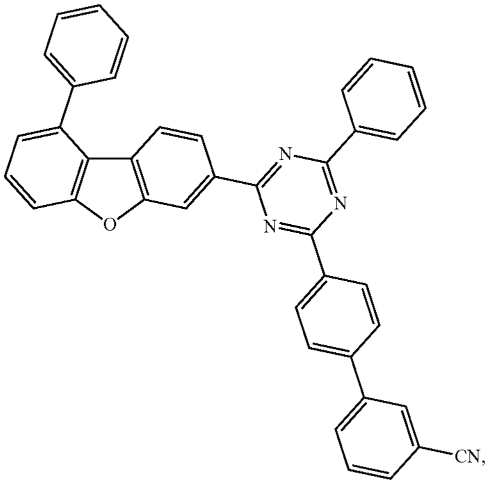
A-45
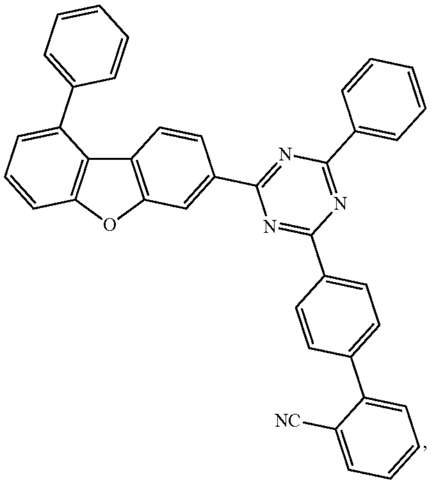
-continued
A-46
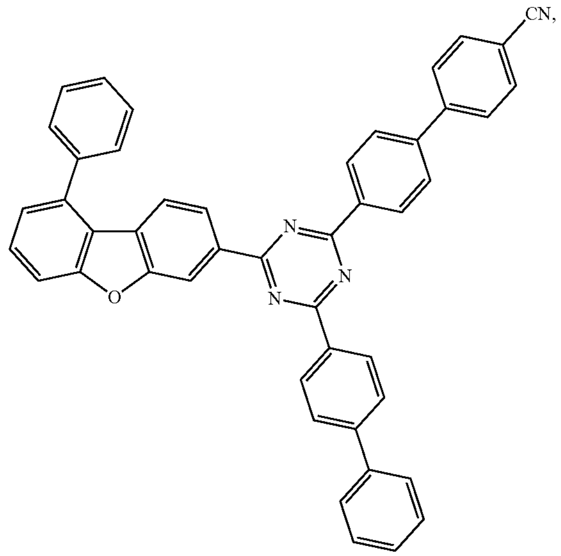
A-47
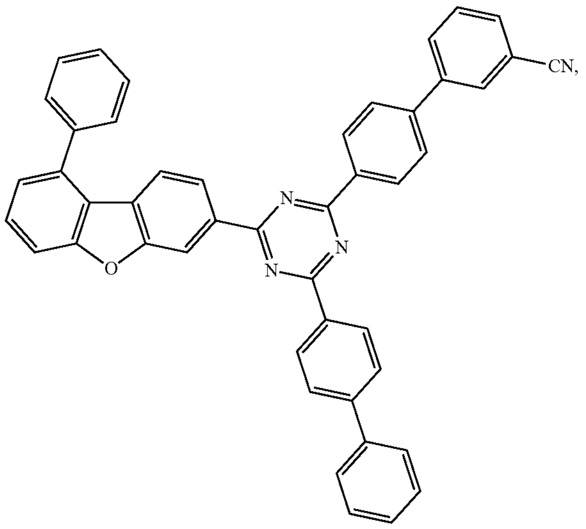
A-48
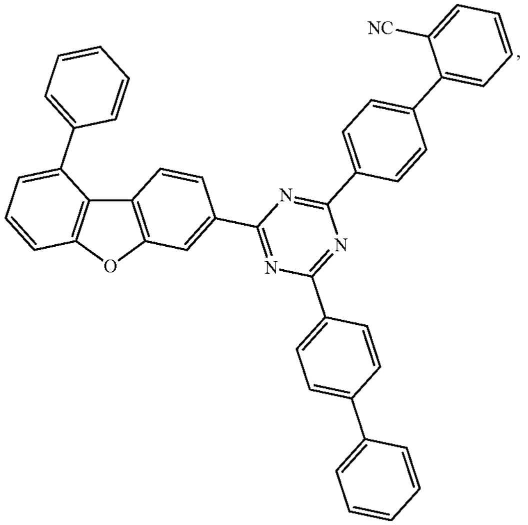

-continued
A-49
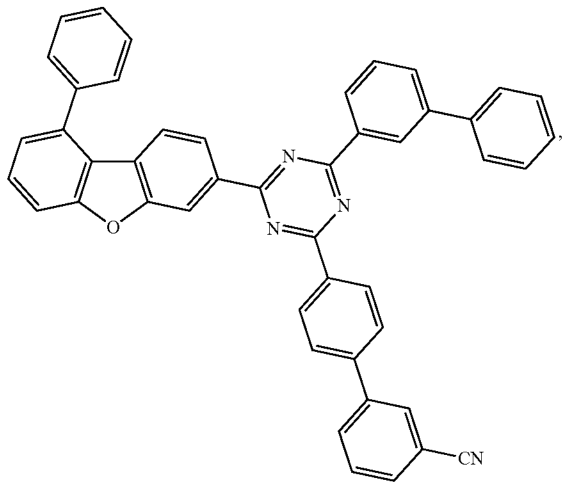
,
A-50
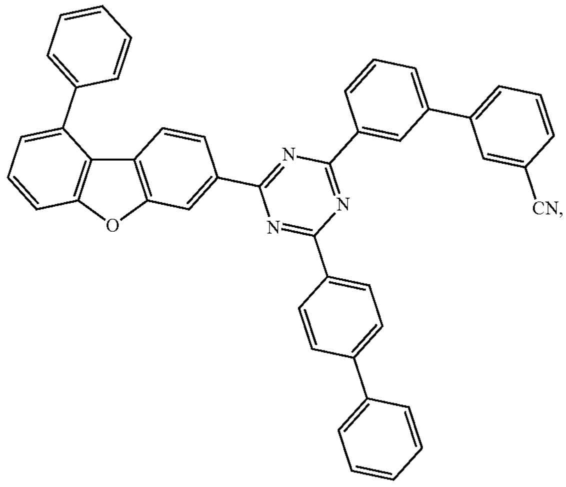
,
A-51
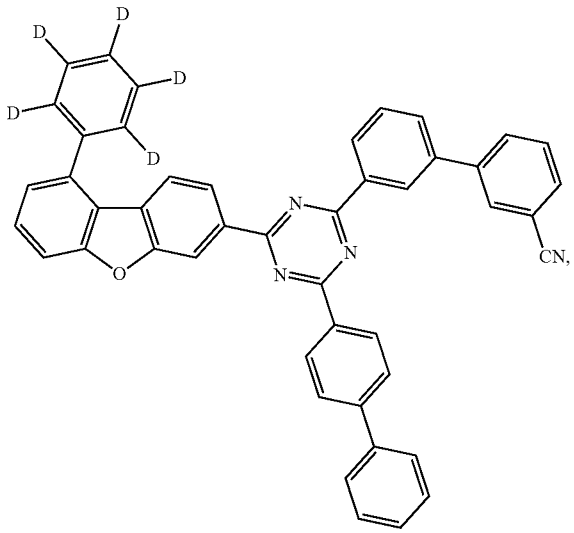
,
-continued
A-52
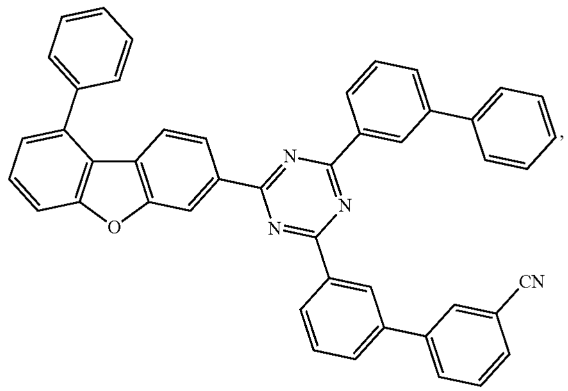
,
A-53
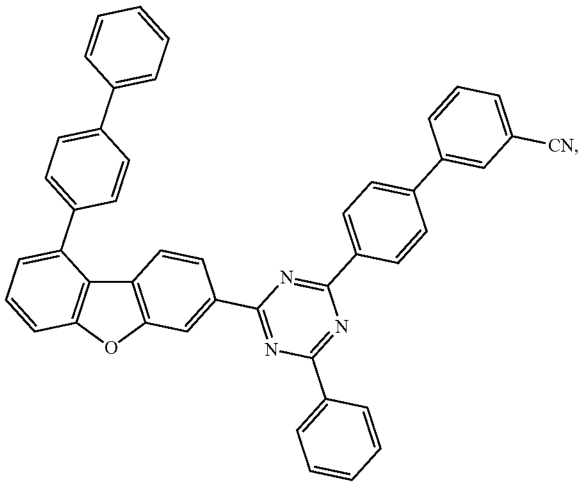
, -continued
A-54
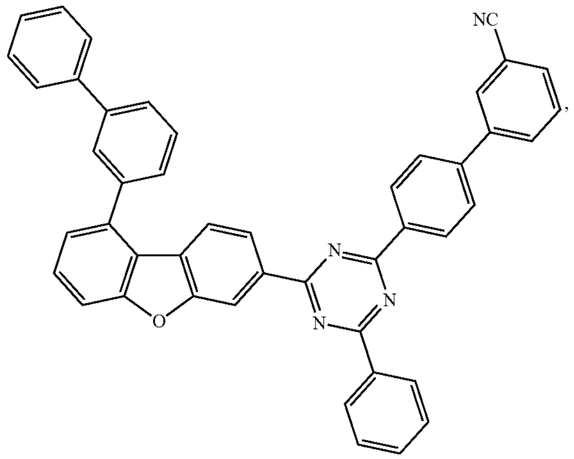
A-55
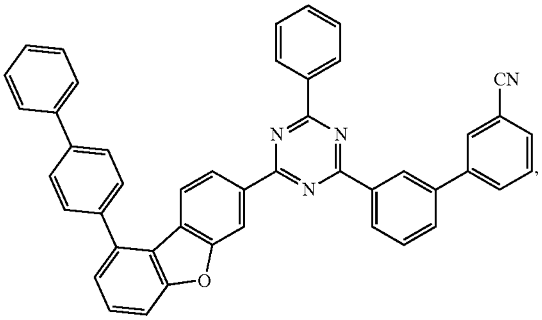
, and
-continued
A-56
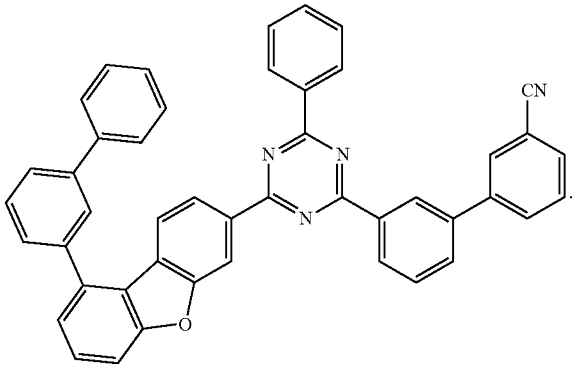
30. An electronic device, comprising the organic electroluminescent device of claim 1.
* * * * *